United States Patent
Gantz et al.

(10) Patent No.: US 11,987,073 B2
(45) Date of Patent: May 21, 2024

(54) STRUCTURALLY-COLORED ARTICLES HAVING LAYERS WHICH TAPER IN THICKNESS

(71) Applicant: NIKE, Inc., Beaverton, OR (US)

(72) Inventors: Jeremy Gantz, Lake Oswego, OR (US); Kim Kovel, Portland, OR (US); Yuanmin Wang, Beaverton, OR (US)

(73) Assignee: NIKE, INC., Beaverton, OR (US)

( * ) Notice: Subject to any disclaimer, the term of this patent is extended or adjusted under 35 U.S.C. 154(b) by 235 days.

(21) Appl. No.: 17/333,554

(22) Filed: May 28, 2021

(65) Prior Publication Data

US 2021/0373215 A1    Dec. 2, 2021

Related U.S. Application Data

(60) Provisional application No. 63/052,135, filed on Jul. 15, 2020, provisional application No. 63/052,143, (Continued)

(51) Int. Cl.
*B32B 3/26* (2006.01)
*B32B 3/30* (2006.01)
(Continued)

(52) U.S. Cl.
CPC ............... *B44F 1/14* (2013.01); *B32B 3/263* (2013.01); *B32B 3/30* (2013.01); *B32B 7/023* (2019.01); *G02B 5/08* (2013.01); *G02B 5/201* (2013.01); *G02B 5/28* (2013.01); *G02B 5/285* (2013.01); *G03F 7/0005* (2013.01); *B32B 2307/402* (2013.01); *B32B 2307/404* (2013.01); *B32B 2307/409* (2013.01); *B32B 2307/416* (2013.01); *B32B 2307/732* (2013.01);
(Continued)

(58) Field of Classification Search
CPC .... B42D 25/29; B42D 25/324; B42D 25/328; B42D 25/45–47; G02B 5/28–289
See application file for complete search history.

(56) References Cited

U.S. PATENT DOCUMENTS

| | | | |
|---|---|---|---|
| 2,345,533 A | 3/1944 | Graves | |
| 2,394,533 A | 2/1946 | Colbert | |

(Continued)

FOREIGN PATENT DOCUMENTS

| | | | |
|---|---|---|---|
| AU | 2007200128 A1 | 8/2007 | |
| BR | PI0503224 A | 1/2007 | |

(Continued)

OTHER PUBLICATIONS

Written Opinion of the International Preliminary Examining Authority for PCT/US2021/034880, dated Apr. 7, 2022.
(Continued)

*Primary Examiner* — Ryan S Dunning
(74) *Attorney, Agent, or Firm* — THOMAS | HORSTEMEYER, LLP

(57) ABSTRACT

As described above, one or more aspects of the present disclosure provide articles having structural color, and methods of making articles having structural color. The present disclosure provides for articles (e.g., structurally colored articles) that exhibit different structural colors in different regions of the article using an optical element, where the optical element has different structures (e.g., cross-sectional structures) in at least two of those regions.

14 Claims, 13 Drawing Sheets

Related U.S. Application Data filed on Jul. 15, 2020, provisional application No. 63/032,061, filed on May 29, 2020, provisional application No. 63/032,076, filed on May 29, 2020, provisional application No. 63/032,067, filed on May 29, 2020, provisional application No. 63/032,081, filed on May 29, 2020, provisional application No. 63/032,084, filed on May 29, 2020, provisional application No. 63/032,090, filed on May 29, 2020, provisional application No. 63/032,064, filed on May 29, 2020, provisional application No. 63/032,052, filed on May 29, 2020.

(51) Int. Cl.
  *B32B 7/023* (2019.01)
  *B44F 1/14* (2006.01)
  *G02B 5/08* (2006.01)
  *G02B 5/20* (2006.01)
  *G02B 5/28* (2006.01)
  *G03F 7/00* (2006.01)

(52) U.S. Cl.
  CPC ....... *B32B 2437/00* (2013.01); *B32B 2437/02* (2013.01); *B32B 2451/00* (2013.01); *B32B 2551/00* (2013.01); *Y10T 428/24736* (2015.01)

(56) References Cited

U.S. PATENT DOCUMENTS

| | | |
|---|---|---|
| 2,607,130 A | 8/1952 | Pearson |
| 2,712,190 A | 7/1955 | Sobel |
| 2,929,803 A | 3/1960 | Henry et al. |
| 3,011,383 A | 12/1961 | Sylvester et al. |
| 3,060,513 A | 10/1962 | Klink et al. |
| 3,338,730 A | 8/1967 | Slade et al. |
| 3,376,403 A | 4/1968 | Driga |
| 3,574,958 A | 4/1971 | Martuch |
| 3,698,930 A | 10/1972 | Fleurquin et al. |
| 3,822,488 A | 7/1974 | Johnson |
| 4,171,411 A | 10/1979 | Ehrenfreund |
| 4,231,369 A | 11/1980 | Sorensen et al. |
| 4,300,294 A | 11/1981 | Riecken |
| 4,418,483 A | 12/1983 | Fujita et al. |
| 4,480,054 A | 10/1984 | Enderle |
| 4,523,005 A | 6/1985 | Szycher |
| 4,533,592 A | 8/1985 | Bingham |
| 4,705,356 A | 11/1987 | Berning et al. |
| 5,009,486 A | 4/1991 | Dobrowolski et al. |
| 5,269,995 A | 12/1993 | Ramanathan et al. |
| 5,334,690 A | 8/1994 | Schafheutle et al. |
| 5,346,934 A | 9/1994 | Chriss |
| 5,500,067 A | 3/1996 | Jenkner |
| 5,572,817 A | 11/1996 | Chien |
| 5,628,128 A | 5/1997 | Miller et al. |
| 5,670,102 A | 9/1997 | Perman et al. |
| 5,671,495 A | 9/1997 | Chen |
| 5,713,141 A | 2/1998 | Mitchell et al. |
| 5,722,322 A | 3/1998 | Watanabe |
| 5,778,793 A | 7/1998 | Mello et al. |
| 5,789,505 A | 8/1998 | Wilkinson et al. |
| 5,813,148 A | 9/1998 | Guerra |
| 5,815,950 A | 10/1998 | Wang |
| 5,825,548 A | 10/1998 | Bornhorst et al. |
| 5,928,456 A | 7/1999 | Souparis |
| 5,930,921 A | 8/1999 | Sorofman et al. |
| 5,952,065 A | 9/1999 | Mitchell et al. |
| 5,969,076 A | 10/1999 | Lai et al. |
| 5,979,078 A | 11/1999 | McLaughlin |
| 6,013,340 A | 1/2000 | Bonk et al. |
| 6,082,025 A | 7/2000 | Bonk et al. |
| 6,127,026 A | 10/2000 | Bonk et al. |
| 6,129,784 A | 10/2000 | Ikuta et al. |
| 6,147,726 A | 11/2000 | Kubota et al. |
| 6,157,489 A | 12/2000 | Bradley, Jr. et al. |
| 6,164,777 A | 12/2000 | Li et al. |
| 6,203,868 B1 | 3/2001 | Bonk et al. |
| 6,321,465 B1 | 11/2001 | Bonk et al. |
| 6,376,075 B1 | 4/2002 | Tacke-Willemsen et al. |
| 6,402,879 B1 | 6/2002 | Tawney et al. |
| 6,551,531 B1 | 4/2003 | Ford et al. |
| 6,598,252 B2 | 7/2003 | Woerlee |
| 6,620,211 B2 | 9/2003 | Veugelers et al. |
| 6,666,983 B2 | 12/2003 | Marietti et al. |
| 6,749,936 B2 | 6/2004 | Argoitia et al. |
| 6,761,959 B1 | 7/2004 | Bonkowski et al. |
| 6,797,737 B1 | 9/2004 | Hsu et al. |
| 6,878,753 B1 | 4/2005 | Takemura et al. |
| 6,897,281 B2 | 5/2005 | Lubnin et al. |
| 6,922,906 B2 | 8/2005 | Choi et al. |
| 6,922,916 B1 | 8/2005 | Potter |
| 6,949,667 B2 | 9/2005 | Han et al. |
| 7,006,294 B2 | 2/2006 | Steenblik et al. |
| 7,405,879 B2 | 7/2008 | Wild et al. |
| 7,476,705 B2 | 1/2009 | Pajerski |
| 7,731,763 B2 | 6/2010 | Fernandez Cid et al. |
| 7,800,814 B2 | 9/2010 | Nishimura et al. |
| 7,848,008 B2 | 12/2010 | Nishimura et al. |
| 7,861,733 B2 | 1/2011 | Pellikaan et al. |
| 7,903,339 B2 | 3/2011 | Banerjee et al. |
| 7,938,865 B2 | 5/2011 | Fernandez Cid et al. |
| 7,955,695 B2 | 6/2011 | Argoitia |
| 8,264,637 B2 | 9/2012 | Cho et al. |
| 8,322,636 B2 | 12/2012 | Wu et al. |
| 8,339,597 B2 | 12/2012 | Dal Negro et al. |
| 8,408,470 B2 | 4/2013 | Komatsu et al. |
| 8,486,494 B2 | 7/2013 | Fukazawa et al. |
| 8,558,137 B2 | 10/2013 | Yuasa et al. |
| 8,685,185 B2 | 4/2014 | Guo et al. |
| 8,889,234 B2 | 11/2014 | Kwon et al. |
| 9,102,195 B2 | 8/2015 | Raksha et al. |
| 9,134,468 B2 | 9/2015 | Noizet et al. |
| 9,185,947 B2 | 11/2015 | Spencer et al. |
| 9,220,951 B1 | 12/2015 | Comeau |
| 9,243,104 B2 | 1/2016 | Watkins et al. |
| 9,279,771 B2 | 3/2016 | Aizenberg et al. |
| 9,420,848 B2 | 8/2016 | Campos, II et al. |
| 9,453,943 B2 | 9/2016 | Miyake et al. |
| 9,527,340 B2 | 12/2016 | Szumski et al. |
| 9,557,457 B2 | 1/2017 | Gocho et al. |
| 9,931,804 B2 | 4/2018 | Le et al. |
| 10,048,411 B2 | 8/2018 | Parker |
| 10,555,580 B2 | 2/2020 | Peyton |
| 10,649,113 B2 | 5/2020 | Bee et al. |
| 10,779,617 B2 | 9/2020 | Iovu |
| 10,928,553 B2 | 2/2021 | Bee et al. |
| 11,129,444 B1 | 9/2021 | Kovel |
| 11,241,062 B1 | 2/2022 | Bee et al. |
| 11,254,095 B2 | 2/2022 | Hart et al. |
| 11,412,817 B2 | 8/2022 | Kovel |
| 2001/0028921 A1 | 10/2001 | Shaw et al. |
| 2001/0042321 A1 | 11/2001 | Tawney et al. |
| 2001/0053454 A1 | 12/2001 | Higashi et al. |
| 2002/0015836 A1 | 2/2002 | Jonza et al. |
| 2002/0028311 A1 | 3/2002 | Coppens et al. |
| 2002/0045040 A1 | 4/2002 | Kanada et al. |
| 2002/0150629 A1 | 10/2002 | Nishimura et al. |
| 2002/0183133 A1 | 12/2002 | Sano |
| 2002/0191234 A1 | 12/2002 | Ishimoto et al. |
| 2003/0074808 A1 | 4/2003 | Weaver et al. |
| 2003/0086030 A1 | 5/2003 | Taniguchi et al. |
| 2004/0006889 A1 | 1/2004 | Chen |
| 2004/0041292 A1 | 3/2004 | Chen et al. |
| 2004/0080070 A1 | 4/2004 | Liu et al. |
| 2004/0112252 A1 | 6/2004 | Zimmermann et al. |
| 2004/0135921 A1 | 7/2004 | Murata et al. |
| 2004/0142185 A1 | 7/2004 | Takushima |
| 2004/0169928 A1 | 9/2004 | Nilsen et al. |
| 2004/0172855 A1 | 9/2004 | Aslanides |
| 2004/0173855 A1 | 9/2004 | Masuoka et al. |
| 2004/0265587 A1 | 12/2004 | Koyanagi et al. |
| 2005/0016026 A1 | 1/2005 | Long |
| 2005/0031816 A1 | 2/2005 | Chang et al. |

(56) References Cited

U.S. PATENT DOCUMENTS

| | | |
|---|---|---|
| 2005/0056954 A1 | 3/2005 | Devlin et al. |
| 2005/0063067 A1 | 3/2005 | Phillips et al. |
| 2005/0207007 A1 | 9/2005 | Shimoda et al. |
| 2005/0207138 A1 | 9/2005 | Cheung |
| 2005/0211114 A1 | 9/2005 | Fahrenbach et al. |
| 2005/0260369 A1 | 11/2005 | Graf et al. |
| 2005/0268497 A1 | 12/2005 | Alfaro et al. |
| 2005/0274041 A1 | 12/2005 | Collett et al. |
| 2006/0023327 A1 | 2/2006 | Coombs et al. |
| 2006/0048413 A1 | 3/2006 | Sokolowski et al. |
| 2006/0090373 A1 | 5/2006 | Savoie et al. |
| 2006/0101671 A1 | 5/2006 | Berend et al. |
| 2006/0101673 A1 | 5/2006 | Robinson et al. |
| 2006/0112599 A1 | 6/2006 | Braynock et al. |
| 2006/0128823 A1 | 6/2006 | Tsuchimura et al. |
| 2006/0143951 A1 | 7/2006 | Yang et al. |
| 2006/0198121 A1 | 9/2006 | Thorpe et al. |
| 2006/0263553 A1 | 11/2006 | Yamada et al. |
| 2006/0270553 A1 | 11/2006 | Mori |
| 2007/0008439 A1 | 1/2007 | Nakayama et al. |
| 2007/0058260 A1 | 3/2007 | Steenblik et al. |
| 2007/0076069 A1 | 4/2007 | Edwards et al. |
| 2008/0005856 A1 | 1/2008 | Hung |
| 2008/0040951 A1 | 2/2008 | Kates |
| 2008/0066347 A1 | 3/2008 | Suzuki |
| 2008/0248281 A1 | 10/2008 | Nakaguma et al. |
| 2008/0274359 A1 | 11/2008 | Lawrence et al. |
| 2008/0316628 A1 | 12/2008 | Nakajima et al. |
| 2009/0080076 A1 | 3/2009 | Fujikura et al. |
| 2009/0174944 A1 | 7/2009 | Yuasa et al. |
| 2009/0301649 A1 | 12/2009 | Augsberg et al. |
| 2010/0052201 A1 | 3/2010 | Nadella |
| 2010/0104810 A1 | 4/2010 | Fukazawa et al. |
| 2010/0152065 A1 | 6/2010 | Nishimura et al. |
| 2010/0177380 A1 | 7/2010 | Nagahama et al. |
| 2010/0199406 A1 | 8/2010 | Dua et al. |
| 2010/0199520 A1 | 8/2010 | Dua et al. |
| 2010/0215976 A1 | 8/2010 | Suwa et al. |
| 2010/0024597 A1 | 9/2010 | Baumberg et al. |
| 2010/0222442 A1 | 9/2010 | Prissok et al. |
| 2010/0254007 A1 | 10/2010 | Toda |
| 2010/0266946 A1 | 10/2010 | Shirai et al. |
| 2010/0290109 A1 | 11/2010 | Kurt et al. |
| 2010/0291358 A1 | 11/2010 | Takahashi et al. |
| 2011/0026208 A1 | 2/2011 | Utsuro et al. |
| 2011/0033670 A1 | 2/2011 | Nishikawa et al. |
| 2011/0043911 A1 | 2/2011 | Kaneiwa et al. |
| 2011/0047720 A1 | 3/2011 | Maranan et al. |
| 2011/0090564 A1 | 4/2011 | Utsuro et al. |
| 2011/0123754 A1 | 5/2011 | Shirai et al. |
| 2011/0138547 A1 | 6/2011 | Fernandez Cid et al. |
| 2011/0170193 A1 | 7/2011 | Budd et al. |
| 2011/0171440 A1 | 7/2011 | Cheng et al. |
| 2011/0183111 A1 | 7/2011 | Yuasa et al. |
| 2011/0232135 A1 | 9/2011 | Dean et al. |
| 2011/0234953 A1 | 9/2011 | Amimori et al. |
| 2011/0234969 A1 | 9/2011 | Amimori et al. |
| 2011/0253288 A1 | 10/2011 | Xie et al. |
| 2011/0262675 A1 | 10/2011 | Inamiya et al. |
| 2011/0275732 A1 | 11/2011 | Bruchmann et al. |
| 2011/0283560 A1 | 11/2011 | Portzline et al. |
| 2011/0298207 A1 | 12/2011 | Despland et al. |
| 2011/0299150 A1 | 12/2011 | Steenblik et al. |
| 2012/0003457 A1 | 1/2012 | Hatanaka et al. |
| 2012/0015118 A1 | 1/2012 | Zheludev et al. |
| 2012/0015145 A1 | 1/2012 | Depres |
| 2012/0019913 A1 | 1/2012 | Nishimoto et al. |
| 2012/0034291 A1 | 2/2012 | Amsden et al. |
| 2012/0121820 A1 | 5/2012 | Cronin-Golomb et al. |
| 2012/0133672 A1 | 5/2012 | Joo |
| 2012/0139230 A1 | 6/2012 | Whiteman et al. |
| 2012/0186102 A1 | 7/2012 | Lee et al. |
| 2012/0204443 A1 | 8/2012 | Vertuccio |
| 2012/0231489 A1 | 9/2012 | Lenhert |
| 2012/0236415 A1 | 9/2012 | Nagano et al. |
| 2012/0249718 A1 | 10/2012 | Sohn et al. |
| 2012/0255201 A1 | 10/2012 | Little |
| 2012/0255452 A1 | 10/2012 | Bower et al. |
| 2012/0276332 A1 | 11/2012 | Conolly et al. |
| 2012/0297642 A1 | 11/2012 | Schaefer et al. |
| 2012/0297643 A1 | 11/2012 | Shaffer et al. |
| 2013/0004721 A1 | 1/2013 | Hara et al. |
| 2013/0004722 A1 | 1/2013 | Hara et al. |
| 2013/0004731 A1 | 1/2013 | Hara et al. |
| 2013/0004754 A1 | 1/2013 | Hara et al. |
| 2013/0107368 A1 | 5/2013 | Delst et al. |
| 2013/0148221 A1 | 6/2013 | Banerjee et al. |
| 2013/0182300 A1 | 7/2013 | Muller et al. |
| 2013/0183487 A1 | 7/2013 | Henze et al. |
| 2013/0243693 A1 | 9/2013 | Omenetto et al. |
| 2013/0250229 A1 | 9/2013 | Kaneiwa et al. |
| 2013/0330710 A1 | 12/2013 | Amsden et al. |
| 2014/0016177 A1 | 1/2014 | Aizenberg et al. |
| 2014/0020192 A1 | 1/2014 | Jones et al. |
| 2014/0050899 A1 | 2/2014 | Kukoff |
| 2014/0104686 A1 | 4/2014 | Yuasa et al. |
| 2014/0106139 A1 | 4/2014 | Abrams |
| 2014/0109442 A1 | 4/2014 | Thompson |
| 2014/0118360 A1 | 5/2014 | Ma et al. |
| 2014/0151918 A1 | 6/2014 | Hartmann |
| 2014/0161974 A1 | 6/2014 | Erho et al. |
| 2014/0182169 A1 | 7/2014 | Mack |
| 2014/0250734 A1 | 9/2014 | Zheng |
| 2014/0254017 A1 | 9/2014 | Manoharan et al. |
| 2014/0310983 A1 | 10/2014 | Tamm et al. |
| 2015/0001840 A1 | 1/2015 | Parker |
| 2015/0035269 A1 | 2/2015 | Hooper et al. |
| 2015/0076808 A1 | 3/2015 | Kim et al. |
| 2015/0109657 A1 | 4/2015 | Baumberg et al. |
| 2015/0118124 A1 | 4/2015 | Khorasaninejad et al. |
| 2015/0146280 A1 | 5/2015 | Degott et al. |
| 2015/0192897 A1 | 7/2015 | Schilling et al. |
| 2015/0198749 A1 | 7/2015 | Ye et al. |
| 2015/0202834 A1 | 7/2015 | Free et al. |
| 2015/0212244 A1 | 7/2015 | Kim et al. |
| 2015/0250263 A1 | 9/2015 | Robinson, Jr. |
| 2015/0265003 A1 | 9/2015 | Lauria |
| 2015/0283743 A1 | 10/2015 | Park et al. |
| 2015/0309232 A1 | 10/2015 | Banerjee |
| 2015/0352883 A1 | 12/2015 | Schmid et al. |
| 2015/0352888 A1 | 12/2015 | Schmid et al. |
| 2016/0064696 A1 | 3/2016 | Collier et al. |
| 2016/0101601 A1 | 4/2016 | Abrams |
| 2016/0116645 A1 | 4/2016 | Parker |
| 2016/0128433 A1 | 5/2016 | Downing et al. |
| 2016/0131808 A1 | 5/2016 | Kristensen et al. |
| 2016/0146984 A1 | 5/2016 | Jiang et al. |
| 2016/0168386 A1 | 6/2016 | Aizenberg et al. |
| 2016/0176223 A1 | 6/2016 | Degott et al. |
| 2016/0178493 A1 | 6/2016 | Kawanaka et al. |
| 2016/0202394 A1 | 7/2016 | Clausen et al. |
| 2016/0202401 A1 | 7/2016 | Christiansen et al. |
| 2016/0209642 A1 | 7/2016 | Aizenberg et al. |
| 2016/0209678 A1 | 7/2016 | Nishimoto |
| 2016/0282527 A1 | 9/2016 | Saito et al. |
| 2016/0325310 A1 | 11/2016 | Schmid et al. |
| 2016/0327708 A1 | 11/2016 | Liles et al. |
| 2016/0331082 A1 | 11/2016 | Weidl |
| 2017/0020232 A1 | 1/2017 | Bello Decurnex |
| 2017/0023711 A1 | 1/2017 | Jiang et al. |
| 2017/0027273 A1 | 2/2017 | Colon |
| 2017/0081535 A1 | 3/2017 | Kohri et al. |
| 2017/0087691 A1 | 3/2017 | Yokoyama et al. |
| 2017/0090084 A1 | 3/2017 | Wilson et al. |
| 2017/0129200 A1 | 5/2017 | Adami et al. |
| 2017/0157653 A1 | 6/2017 | Parker |
| 2017/0226347 A1 | 8/2017 | Jin et al. |
| 2017/0248746 A1 | 8/2017 | Banerjee et al. |
| 2017/0347745 A1 | 12/2017 | Figur et al. |
| 2018/0252158 A1 | 9/2018 | Malkamäki et al. |
| 2018/0257360 A1 | 9/2018 | Liponkoski |
| 2018/0284330 A1 | 10/2018 | Parker |
| 2018/0355316 A1 | 12/2018 | Neuvonen et al. |
| 2018/0372929 A1 | 12/2018 | Parker |

(56) References Cited

U.S. PATENT DOCUMENTS

| | | | |
|---|---|---|---|
| 2019/0098946 A1 | 4/2019 | Bee et al. |
| 2019/0098958 A1 | 4/2019 | Bee et al. |
| 2019/0099967 A1 | 4/2019 | Bee et al. |
| 2019/0099968 A1 | 4/2019 | Bee et al. |
| 2019/0099978 A1 | 4/2019 | Bee et al. |
| 2019/0099979 A1 | 4/2019 | Bee et al. |
| 2019/0113655 A1 | 4/2019 | Bee et al. |
| 2019/0113656 A1 | 4/2019 | Bee et al. |
| 2019/0163011 A1 | 5/2019 | Cao |
| 2019/0337321 A1 | 11/2019 | Yamada |
| 2019/0346603 A1 | 11/2019 | Sahara et al. |
| 2019/0365047 A1 | 12/2019 | Larson et al. |
| 2019/0387830 A1 | 12/2019 | Dua et al. |
| 2020/0018876 A1 | 1/2020 | Chen et al. |
| 2020/0040882 A1 | 2/2020 | Kalmari et al. |
| 2020/0088908 A1 | 3/2020 | Bee et al. |
| 2020/0113287 A1 | 4/2020 | Johnson et al. |
| 2020/0181550 A1 | 6/2020 | Kalmari et al. |
| 2020/0217986 A1 | 7/2020 | Bee et al. |
| 2020/0217987 A1 | 7/2020 | Bee et al. |
| 2020/0240667 A1 | 7/2020 | Lind |
| 2020/0269561 A1 | 8/2020 | Bee et al. |
| 2020/0275728 A1 | 9/2020 | Bee et al. |
| 2020/0290311 A1 | 9/2020 | Kim et al. |
| 2020/0305526 A1 | 10/2020 | Gantz et al. |
| 2020/0305527 A1 | 10/2020 | Gantz et al. |
| 2020/0308734 A1 | 10/2020 | Gantz et al. |
| 2020/0314185 A1 | 10/2020 | Mäkynen et al. |
| 2020/0371272 A1 | 11/2020 | Bee et al. |
| 2020/0407838 A1 | 12/2020 | Gantz et al. |
| 2021/0096289 A1 | 4/2021 | Guo et al. |
| 2021/0177096 A1 | 6/2021 | Park et al. |
| 2021/0186157 A1 | 6/2021 | Capone et al. |
| 2021/0215864 A1 | 7/2021 | Kawashita |
| 2021/0244131 A1 | 8/2021 | Capone et al. |
| 2021/0370714 A1 | 12/2021 | Gantz et al. |
| 2021/0373211 A1 | 12/2021 | Gantz et al. |
| 2021/0373214 A1 | 12/2021 | Gantz et al. |
| 2021/0382201 A1 | 12/2021 | Bee et al. |
| 2022/0039504 A1 | 2/2022 | Bee et al. |
| 2022/0039505 A1 | 2/2022 | Bee et al. |
| 2022/0039519 A1 | 2/2022 | Kovel et al. |
| 2022/0061450 A1 | 3/2022 | Bee et al. |
| 2022/0066079 A1 | 3/2022 | Trottier-Lapointe et al. |
| 2022/0107443 A1 | 4/2022 | Bee et al. |

FOREIGN PATENT DOCUMENTS

| | | |
|---|---|---|
| CH | 702116 B1 | 5/2011 |
| CN | 1088511 A | 6/1994 |
| CN | 1324222 A | 11/2001 |
| CN | 1725045 A | 1/2006 |
| CN | 1799857 | 7/2006 |
| CN | 101035685 A | 9/2007 |
| CN | 101356245 A | 1/2009 |
| CN | 101381903 A | 3/2009 |
| CN | 101396884 A | 4/2009 |
| CN | 101633786 A | 1/2010 |
| CN | 101666886 A | 3/2010 |
| CN | 101781860 A | 7/2010 |
| CN | 102548752 A1 | 7/2012 |
| CN | 102691202 A | 9/2012 |
| CN | 103173039 A | 6/2013 |
| CN | 103965699 A | 8/2014 |
| CN | 104334042 A | 2/2015 |
| CN | 104592971 A | 5/2015 |
| CN | 105050442 A | 11/2015 |
| CN | 105271796 A | 1/2016 |
| CN | 105862000 A | 8/2016 |
| CN | 106080001 A | 11/2016 |
| CN | 107111002 A | 8/2017 |
| CN | 206553403 U | 10/2017 |
| CN | 107407747 A | 11/2017 |
| CN | 109567305 A | 4/2019 |
| DE | 4307648 A1 | 9/1994 |
| DE | 20200346 U1 | 4/2002 |
| DE | 102010025159 A1 | 12/2011 |
| EP | 0109003 A1 | 5/1984 |
| EP | 0335309 A1 | 10/1989 |
| EP | 0905530 A2 | 3/1999 |
| EP | 1047961 A1 | 11/2000 |
| EP | 1266928 A1 | 12/2002 |
| EP | 1379900 A1 | 1/2004 |
| EP | 1560416 | 8/2005 |
| EP | 1624026 A1 | 2/2006 |
| EP | 1653256 A1 | 5/2006 |
| EP | 1923229 A1 | 5/2008 |
| EP | 2012148 A1 | 1/2009 |
| EP | 2077459 A1 | 7/2009 |
| EP | 2462908 A1 | 6/2012 |
| EP | 2508922 A1 | 10/2012 |
| EP | 2538247 A2 | 12/2012 |
| EP | 2642321 A1 | 9/2013 |
| EP | 2649896 A2 | 10/2013 |
| EP | 3151042 A1 | 4/2017 |
| EP | 3244240 A1 | 11/2017 |
| EP | 3278150 A1 | 2/2018 |
| EP | 3290968 | 3/2018 |
| GB | 1358710 A | 7/1974 |
| GB | 2374818 A | 10/2002 |
| GB | 2481697 A | 1/2012 |
| GB | 2524840 A | 10/2015 |
| GB | 2525020 A | 10/2015 |
| JP | S601180 U | 1/1985 |
| JP | S63120642 A | 5/1988 |
| JP | 10151647 A | 6/1998 |
| JP | 3057345 U | 5/1999 |
| JP | 2001516272 A | 9/2001 |
| JP | 2002524317 A | 8/2002 |
| JP | 2002530712 A | 9/2002 |
| JP | 2003131029 A | 5/2003 |
| JP | 2004004495 A | 1/2004 |
| JP | 2005153192 A | 6/2005 |
| JP | 2005174647 A | 6/2005 |
| JP | 2005226196 A | 8/2005 |
| JP | 2006508698 A | 3/2006 |
| JP | 2006288907 A | 10/2006 |
| JP | 2008037962 A | 2/2008 |
| JP | 2008515491 A | 5/2008 |
| JP | 2009205123 A | 9/2009 |
| JP | 2009211077 A | 9/2009 |
| JP | 2010111974 A | 5/2010 |
| JP | 2010201652 A | 9/2010 |
| JP | 2011085779 A | 4/2011 |
| JP | 2011104931 A | 6/2011 |
| JP | 2012159589 A | 8/2012 |
| JP | 2013029805 A | 2/2013 |
| JP | 2013041027 A | 2/2013 |
| JP | 2013080049 A | 5/2013 |
| JP | 2014189719 A | 10/2014 |
| JP | 2015069076 A | 4/2015 |
| JP | 2015101024 A | 6/2015 |
| JP | 5740937 B2 | 7/2015 |
| JP | 2015520044 A | 7/2015 |
| JP | 2015529136 A | 10/2015 |
| JP | 2016502470 A | 1/2016 |
| JP | 2017032409 A | 2/2017 |
| KR | 1019840000425 B1 | 4/1984 |
| KR | 100539131 B1 | 12/2005 |
| KR | 101472929 B1 | 12/2014 |
| TW | 200628089 A | 8/2006 |
| WO | 9420568 A1 | 9/1994 |
| WO | 9701972 A1 | 1/1997 |
| WO | 2000031571 A1 | 6/2000 |
| WO | 2003046039 A1 | 6/2003 |
| WO | 03068525 A1 | 8/2003 |
| WO | 3095657 A2 | 11/2003 |
| WO | 2007037393 A1 | 4/2007 |
| WO | 2007038097 A1 | 4/2007 |
| WO | 2007096914 A1 | 8/2007 |
| WO | 2008076339 A2 | 6/2008 |
| WO | 2009062341 A1 | 5/2009 |
| WO | 2010047322 A1 | 4/2010 |
| WO | 2010119248 A2 | 10/2010 |

(56) References Cited

FOREIGN PATENT DOCUMENTS

| | | |
|---|---|---|
| WO | 2011161482 A1 | 12/2011 |
| WO | 2012055105 A1 | 5/2012 |
| WO | 2012065926 A1 | 5/2012 |
| WO | 2013013784 A1 | 1/2013 |
| WO | 2013151547 A1 | 10/2013 |
| WO | 2014022049 A1 | 2/2014 |
| WO | 2014059424 A2 | 4/2014 |
| WO | 2014117673 A1 | 8/2014 |
| WO | 2014133514 A1 | 9/2014 |
| WO | 2015051367 A1 | 4/2015 |
| WO | 2015079652 A1 | 6/2015 |
| WO | 2015151479 A1 | 10/2015 |
| WO | 2015170120 A1 | 11/2015 |
| WO | 2015195123 | 12/2015 |
| WO | 2016015973 A1 | 2/2016 |
| WO | 2016092014 A1 | 6/2016 |
| WO | 2016103980 A1 | 6/2016 |
| WO | 2016140779 A1 | 9/2016 |
| WO | 2016156863 A2 | 10/2016 |
| WO | 2016164551 A1 | 10/2016 |
| WO | 2016191255 A1 | 12/2016 |
| WO | 2016193252 A1 | 12/2016 |
| WO | 2017000162 A1 | 1/2017 |
| WO | 2017006314 A1 | 1/2017 |
| WO | 2017032928 A1 | 3/2017 |
| WO | 2017041085 A1 | 3/2017 |
| WO | 2017115806 A1 | 7/2017 |
| WO | 2017151496 A1 | 9/2017 |
| WO | 2018130856 A1 | 7/2018 |
| WO | 2018160866 A1 | 9/2018 |
| WO | 2019038560 A | 2/2019 |
| WO | 2019067969 A1 | 4/2019 |
| WO | 2019086770 A1 | 5/2019 |
| WO | 2019117413 A1 | 6/2019 |
| WO | 2019224426 A1 | 11/2019 |
| WO | 2020013229 A1 | 1/2020 |
| WO | 2020030844 A1 | 2/2020 |
| WO | 2020197774 A1 | 10/2020 |

OTHER PUBLICATIONS

Written Opinion of the International Preliminary Examining Authority for PCT/US2021/034888, dated Apr. 7, 2022.
Written Opinion of the International Preliminary Examining Authority for PCT/US2021/034891, dated Apr. 7, 2022.
International Preliminary Report on Patentability for PCT/US2021/034781, dated Aug. 12, 2022.
International Preliminary Report on Patentability for PCT/US2021/034888, dated Aug. 12, 2022.
International Preliminary Report on Patentability for PCT/US2021/034891, dated Aug. 12, 2022.
International Preliminary Report on Patentability for PCT/US2021/034897, dated Aug. 12, 2022.
International Preliminary Report on Patentability for PCT/US2021/034876, dated Aug. 12, 2022.
International Preliminary Report on Patentability for PCT/US2021/034880, dated Aug. 17, 2022.
International Preliminary Report on Patentability for PCT/US2021/034865, dated Aug. 17, 2022.
International Preliminary Report on Patentability for PCT/US2021/034872, dated Aug. 17, 2022.
International Preliminary Report on Patentability for PCT/US2021/034921, dated Aug. 17, 2022.
International Preliminary Report on Patentability for PCT/US2021/044891 dated Jul. 6, 2022 (SHB).
International Preliminary Report on Patentability for PCT/US2021/044890 dated Jul. 6, 2022 (SHB).
International Preliminary Report on Patentability for PCT/US2021/044893 dated Jun. 17, 2022 (SHB).
International Preliminary Report on Patentability for PCT/US2021/044894 dated Jul. 6, 2022 (SHB).
International Preliminary Report on Patentability for PCT/US2020/022148 dated Sep. 29, 2021.
International Search Report and Written Opinion for PCT/US2022/071922, dated Aug. 31, 2022.
Color—www.dictionary.com, Jun. 2, 2020 (Year: 2020).
International Preliminary Report on Patentability for PCT/US2018/053467 dated Dec. 17, 2019).
International Preliminary Report on Patentability for PCT/US2018/053478 dated Mar. 31, 2020.
International Preliminary Report on Patentability for PCT/US2018/053488 dated Mar. 31, 2020.
International Preliminary Report on Patentability for PCT/US2018/053510 dated Dec. 20, 2019.
International Preliminary Report on Patentability for PCT/US2018/053516 dated Mar. 31, 2020.
International Preliminary Report on Patentability for PCT/US2018/053521 dated Sep. 3, 2019.
International Preliminary Report on Patentability for PCTUS2014015275 dated Mar. 23, 2015.
International Preliminary Report on Patentability for PCTUS2018053529 dated Dec. 18, 2019.
International Search Report and Written Opinion for PCT/US2018/053478 dated Jun. 4, 2019.
International Search Report and Written Opinion for PCT/US2018/053502 dated May 28, 2019.
International Search Report and Written Opinion for PCT/US2020/022129 dated Jun. 8, 2020.
International Search Report and Written Opinion for PCT/US2020/022148 dated Jul. 15, 2020.
International Search Report and Written Opinion for PCT/US2020/043271 dated Oct. 30, 2020.
International Search Report and Written Opinion for PCT/US2020/043273 dated Oct. 8, 2020.
International Search Report and Written Opinion for PCT/US2020/044624 dated Oct. 30, 2020.
International Search Report and Written Opinion for PCT/US2020/044626 dated Oct. 30, 2020.
International Search Report and Written Opinion for PCT/US2020/044628 dated Oct. 30, 2020.
International Search Report and Written Opinion for PCT/US2020/055543 dated Feb. 5, 2021.
International Search Report and Written Opinion for PCT/US2020/056300 dated Feb. 16, 2021.
International Search Report for PCT/2020/022099 dated Jun. 22, 2020.
International Search Report for PCT/US2018/053467 dated Jun. 3, 2019.
International Search Report for PCT/US2018/053488 dated Jun. 4, 2019.
International Search Report for PCT/US2018/053502 dated Mar. 31, 2020.
International Search Report for PCT/US2018/053510 dated May 29, 2019.
International Search Report for PCT/US2018/053516 dated May 31, 2019.
International Search Report for PCT/US2018/053521 dated Jun. 3, 2019.
International Search Report for PCT/US2018/053529 dated Jan. 28, 2019.
International Search Report for PCT/US2020/022109 dated Jul. 13, 2020.
Iohara Ket Al: "Structurally Colored Fibers", Chemical Fibers International, vol. 50, No. 1, Feb. 1, 2000 (Feb. 1, 2000), p. 38/39, XP000908694, ISSN: 0340-3343.
Masanori Iwata et al., Bio-Inspired Bright Structurally Colored Colloidal Amorphous Array Enhanced by Controlling Thickness and Black Background, Advanced Materials, Feb. 21, 2017, 1-8, 1605050, Germany.
Texture—www.vocabulary.com, Jun. 2, 2020 (Year: 2020).
TOPAS: Cycloolefin Copolymer (COC) Brochure. TOPAS Advanced Polymers. Retrieved online Jan. 11, 2021 from https://topas.com/sites/default/files/files/topas_product-brochure_english.pdf. Published 2008. (Year: 2008).

(56) References Cited

OTHER PUBLICATIONS

Written Opinion of the International Preliminary Examining Authority for PCT/2020/022099 dated Dec. 1, 2020.
Written Opinion of the International Preliminary Examining Authority for PCT/US2018/053510 dated Sep. 24, 2019.
Written Opinion of the International Preliminary Examining Authority for PCT/US2020/022109 dated Dec. 16, 2020.
Written Opinion of the International Preliminary Examining Authority for PCT/US2020/022129 dated Nov. 13, 2020.
Written Opinion of the International Preliminary Examining Authority for PCT/US2020/022148 dated Oct. 13, 2020.
Written Opinion of the International Preliminary Examining Authority for PCT/US2020/043271 dated Feb. 11, 2021.
Written Opinion of the International Preliminary Examining Report for PCTUS2018053529 dated Aug. 6, 2019.
Written Opinion of the International Preliminary Examining Authority dated May 12, 2021.
International Search Report and Written Opinion for PCT/US2021/034781 dated Sep. 24, 2021.
International Search Report and Written Opinion for PCT/US2021/034865 dated Oct. 5, 2021.
International Search Report and Written Opinion for PCT/US2021/034872 dated Oct. 5, 2021.
International Search Report and Written Opinion for PCT/US2021/034921 dated Oct. 7, 2021.
CreatexColorsCo: "How To Paint a Candy Fade" YouTube, Mar. 7, 2020 (Mar. 7, 2020), XP054982299, Retrieved from the Internet: URL:https://www.youtube.com/watch?v=q3UyGE kxEHk&ab channel=CreatexColorsCo [retrieved on Sep. 6, 2021] the whole document.
International Search Report and Written Opinion for PCT/US2021/034776 dated Nov. 17, 2021.
International Preliminary Report on Patentability for PCT/US2020/043271 dated Nov. 8, 2021.
Dwyer, Ross, "Stranger Things x Nike "Upside Down" Collection Release Date", SneakerNews.com Available Online at: https://sneakernews.com/2019/08/12/stranger-things-nike-upside-down-collection-release-date/, Aug. 12, 2019, 5 pages.
International Search Report and Written Opinion received for PCT Patent Application No. PCT/US2014/015275, dated Jun. 25, 2014, 11 pages.
Nike's New Air Force 1 "Reveal" Comes With DIY Tear-Away Uppers, hypebeast.com, Available online at: https://hypebeast.com/2021/2/nike-air-force-1-low-reveal-fauna-brown-arctic-punch-pale-vanilla-dj9941-244-info, Feb. 8, 2021, 10 pages.
Northman, Tora, "Nike's Latest Air Force 1 Reveals Hidden Colors", hypebae.com, Available online at: https://hypebae.com/2020/4/nike-air-force-1-reveal-diy-peel-sneakers-hidden-colors, Apr. 25, 2020, 9 pages.
Ruiz, Derick, "The Nike Air Force 1 "Reveal" Drops This Week", www.modern-notoriety.com, Available online at: https://www.modern-notoriety.com/nike-wmns-air-force-1-air-max-98-lx-tear-away-release-date/, May 23, 2020, 20 pages.
The 'Stranger Things' x Nike "Upside Down" Pack, hypebeast.com, Available online at: https://hypebeast.com/2019/8/stranger-things-nike-upside-down-pack-tailwind-cortez-mid-blazer-sail-deep-royal-blue-release-info, Aug. 7, 2019, 12 pages.
Written Opinion of the International Preliminary Examining Authority received for PCT Patent Application No. PCT/US2020/055543, dated May 12, 2021, 7 pages.
International Preliminary Report on Patentability for PCT/US2020/055543, dated Jan. 25, 2022.
Written Opinion of the International Preliminary Examining Authority for PCT/US2021/034781, dated Feb. 16, 2022.
International Preliminary Report on Patentability for PCT/US2020/056300, dated Feb. 17, 2022.
International Preliminary Report on Patentability for PCT/US2021/072456, dated Jun. 8, 2023.
Written Opinion of the International Preliminary Examining Authority for PCT/US2022/071922, dated Jun. 27, 2023.
Written Opinion of the International Preliminary Examining Authority for PCT/US2022/071918, dated July 3, 2023.
International Search Report and Written Opinion for PCT/US2022/071918, dated Sep. 21, 2022.
Written Opinion of the International Preliminary Examining Authority for PCT/US2022/071920 dated Jul. 6, 2023.
Written Opinion for PCT/US2021/034872, dated Dec. 9, 2021.
Written Opinion of the Inlemational Preliminary Examining Authority for PCT/U82021I034865 dated Dec. 23, 2021.
Kinoshita, Colors Due to Different Coloration Mechanisms—Structural Colors—, Journal of the Imaging Society of Japan, 2011, vol. 50, Issue 6, pp. 543-555.
Written Opinion of the International Preliminary Examining Authority for PCT/US2022/071918, dated Jul. 3, 2023.
International Search Report and Written Opinion for PCT/US2021/072456, dated Mar. 17, 2022.
Written Opinion of the International Preliminary Examining Authority for PCT/US2021/034776, dated Mar. 29, 2022.
Written Opinion of the International Preliminary Examining Authority for PCT/US2021/034876, dated Mar. 25, 2022.
Written Opinion of the International Preliminary Examining Authority for PCT/US2021/034897, dated Mar. 29, 2022.
International Search Report and Written Opinion for PCT/US2021/034876, dated Jan. 3, 2022.
International Search Report and Written Opinion for PCT/US2021/034880, dated Jan. 3, 2022.
International Search Report and Written Opinion for PCT/US2021/034888, dated Jan. 4, 2022.
International Search Report and Written Opinion for PCT/US2021/034891, dated Jan. 3, 2022.
International Search Report and Written Opinion for PCT/US2021/034897, dated Jan. 3, 2022.
International Search Report and Written Opinion for PCT application No. PCT/US2021/044890, dated Nov. 12, 2021 (SHB).
International Search Report and Written Opinion for PCT application No. PCT/US2021/044891, dated Nov. 1, 2021 (SHB).
International Search Report and Written Opinion received for PCT Patent Application No. PCT/U32021I044893, dated Nov. 16, 2021 (SHB).
International Search Report and Written Opinion received for PCT Patent Application No. PCT/US2021/044894, dated Nov. 11, 2021 (SHB).
International Search Report and Written Opinion for PCT/US2022/071920, dated Oct. 20, 2022.
"Need Shoes in Two Different Sizes? It's Not As Odd As You'd Think", GBH News, URL: https://www.wgbh.org/news/lifestyle/2018/09/13/need-shoes-in-two-different-sizes-its-not-as-odd-as-youd-think, Accessed Dec. 13, 2022, Published at least as of Sep. 13, 2018 (Year: 2018).
https://www.britannica.com/dictionary/iridescent (accessed online Mar. 22, 2023), 1 page.
Zheng et al., "Reflective low-sideband plasmonic structural colors", Optical Materials Express, vol. 6, No. 2, Jan. 7, 2016, pp. 381-387.
International Preliminary Report on Patentability for PCT/US2022/071918 mailed Feb. 19, 2024.
International Preliminary Report on Patentability for PCT/US2022/071920 mailed Feb. 19, 2024.
Albert H. Munsell, "A Color Notation", Geo. H. Ellis Co. Boston, Year 1905, 92 pages.
International Preliminary Report on Patentability for PCT/US2022/071922, mailed Apr. 4, 2024.

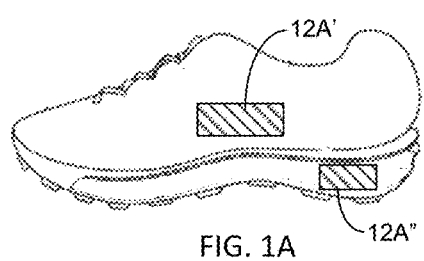
FIG. 1A
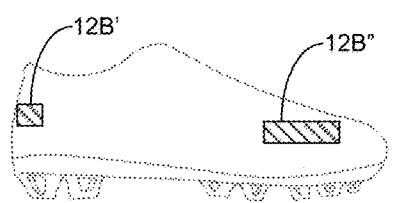
FIG. 1B
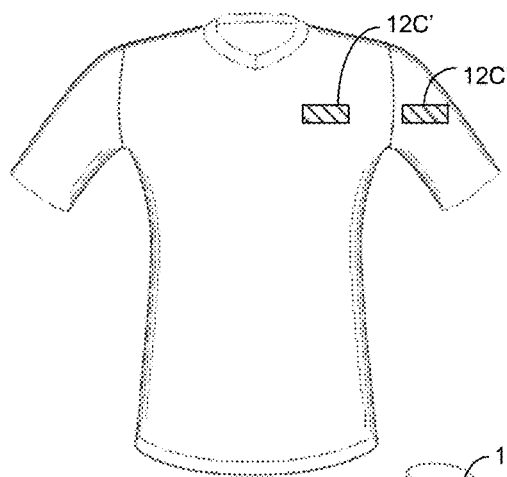
FIG. 1C
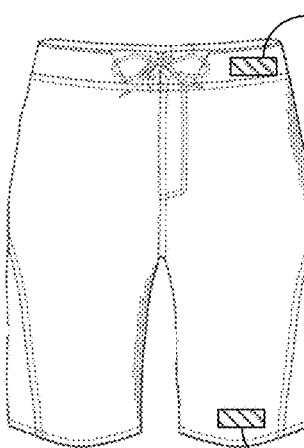
FIG. 1D
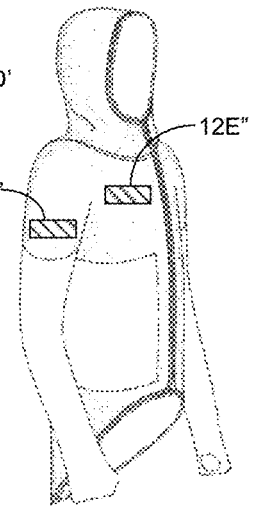
FIG. 1E
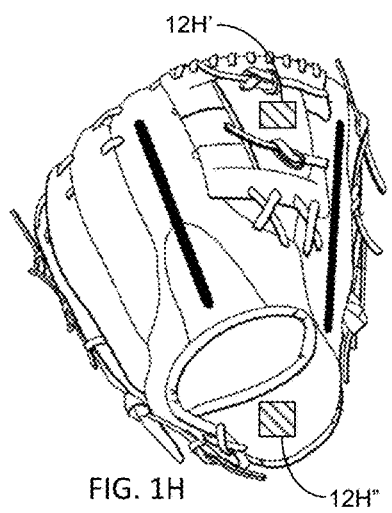
FIG. 1H
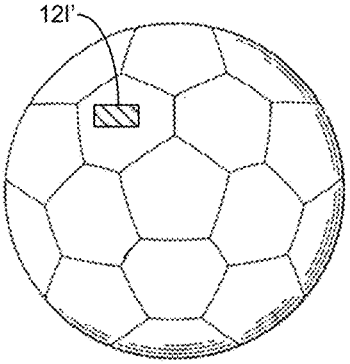
FIG. 1F
FIG. 1G
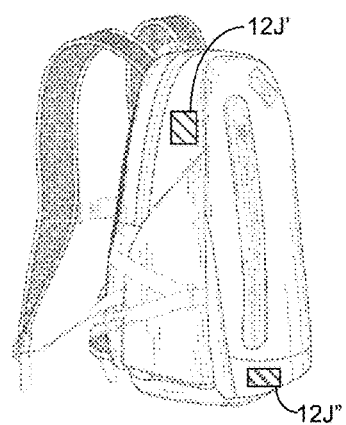
FIG. 1I
FIG. 1J
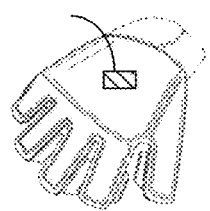
FIG. 1K
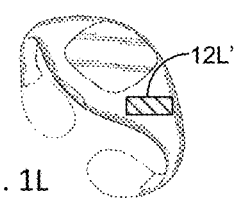
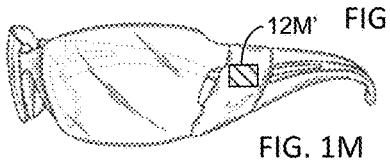
FIG. 1L
FIG. 1M

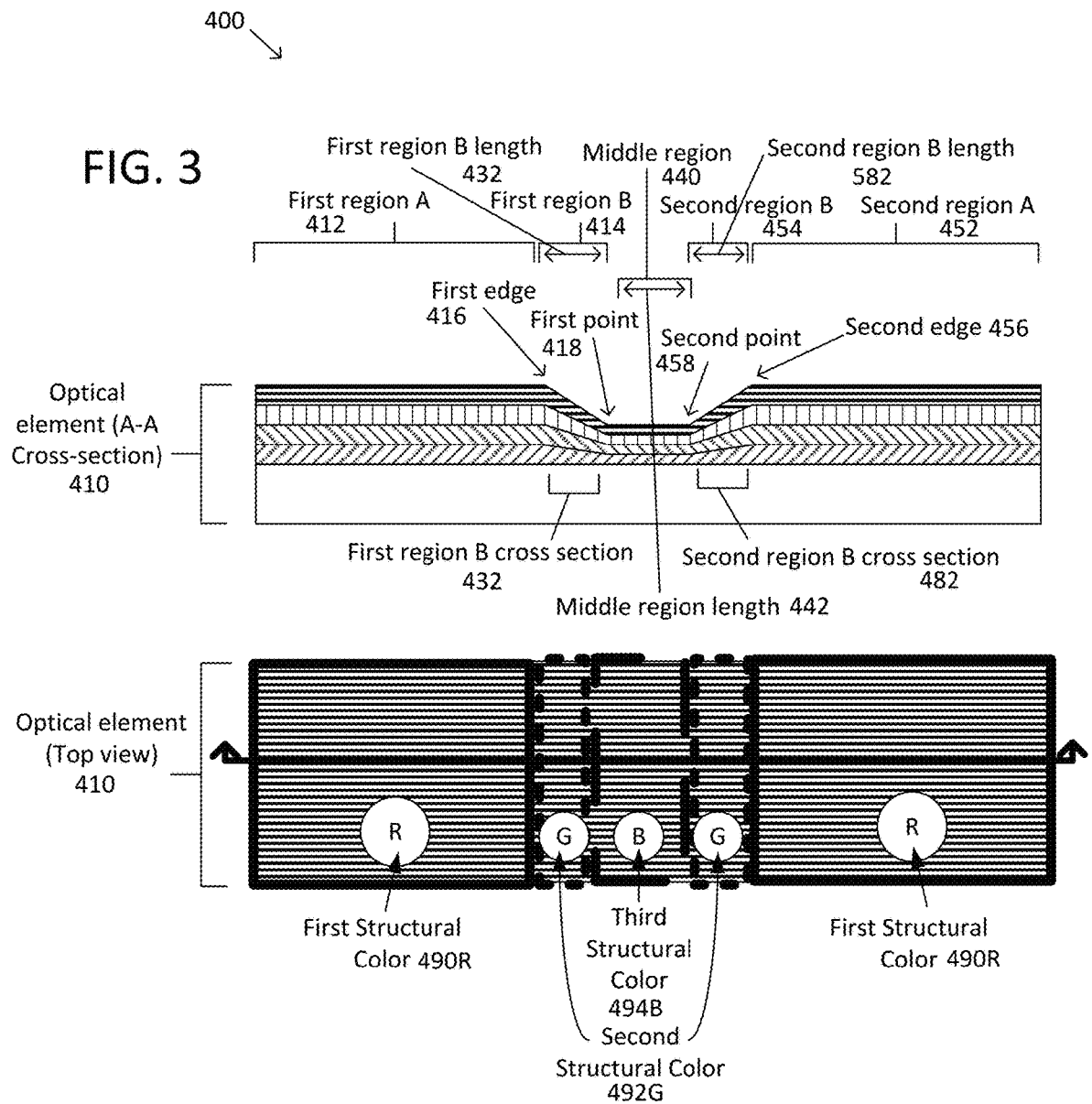

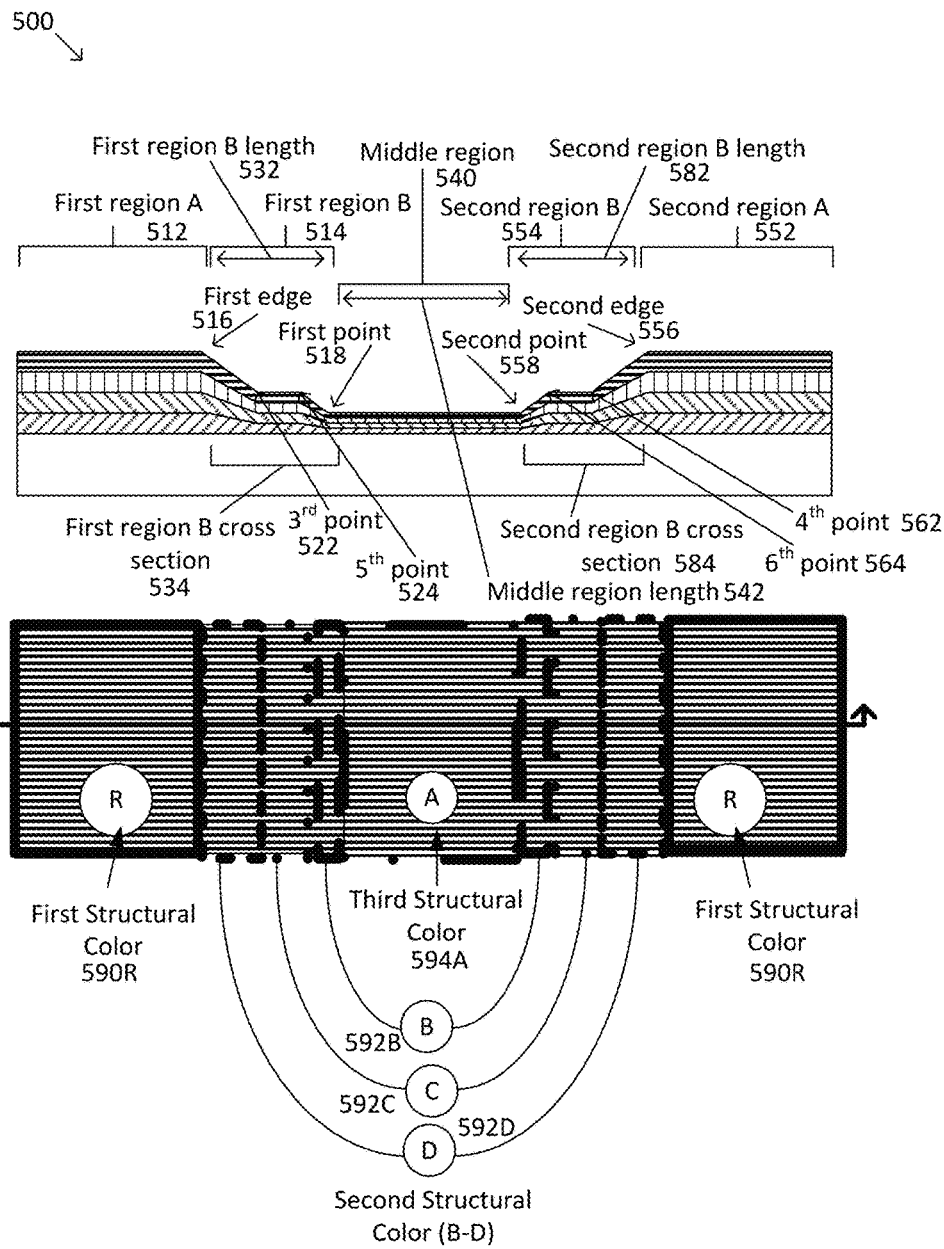

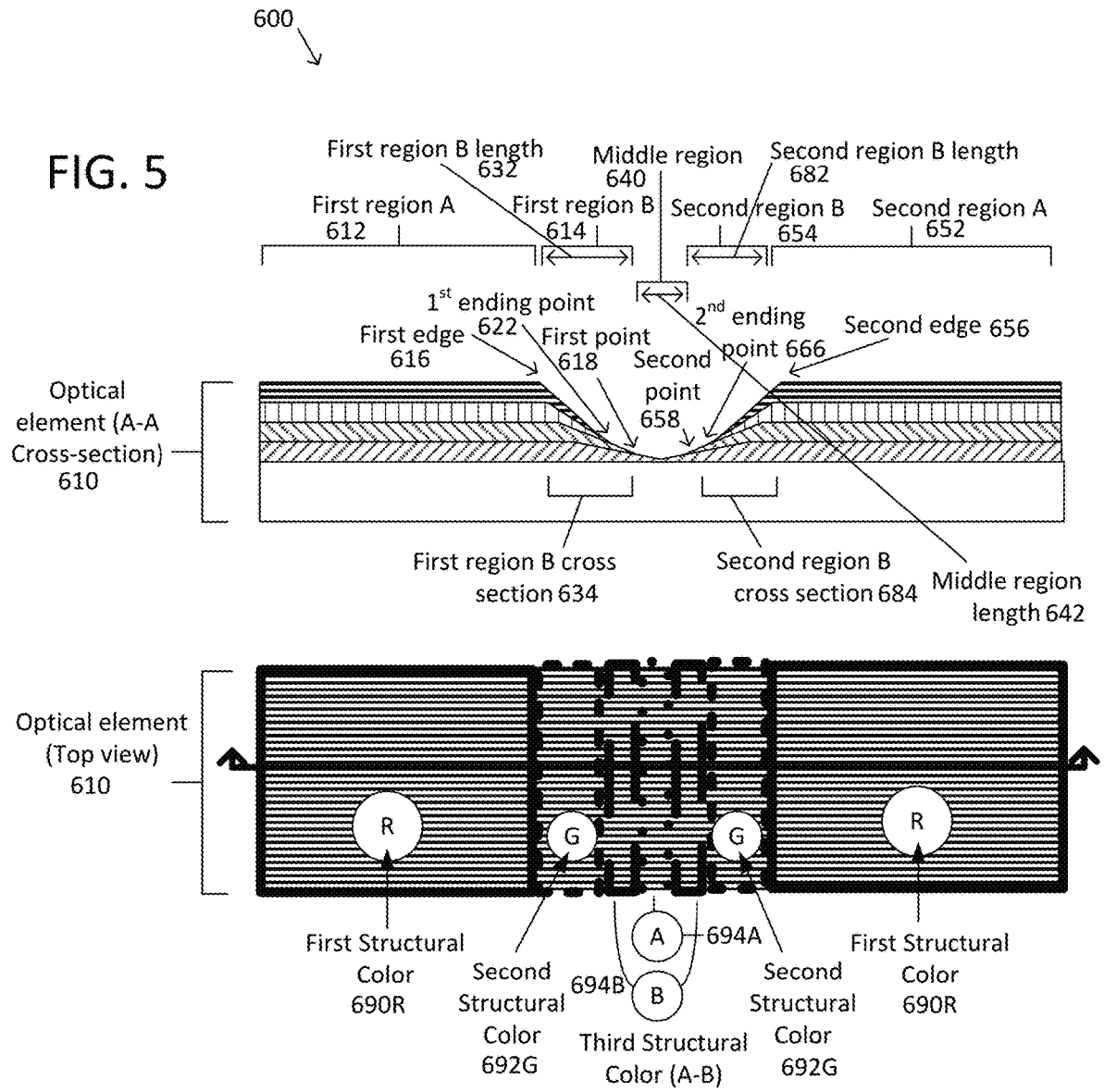

STRUCTURALLY-COLORED ARTICLES HAVING LAYERS WHICH TAPER IN THICKNESS

CLAIM OF PRIORITY TO RELATED APPLICATION

This application claims the benefit of and priority to U.S. Provisional Application Ser. No. 63/032,052, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,061, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,064, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,067, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,076, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,081, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,084, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/032,090, having the title "STRUCTURALLY-COLORED ARTICLES AND METHODS FOR MAKING AND USING STRUCTURALLY-COLORED ARTICLES", filed on May 29, 2020, and to U.S. Provisional Application Ser. No. 63/052,143, having the title "STRUCTURALLY-COLORED ARTICLES AND METHODS FOR MAKING AND USING STRUCTURALLY-COLORED ARTICLES", filed on Jul. 15, 2020, and to U.S. Provisional Application Ser. No. 63/052,135, having the title "STRUCTURALLY-COLORED ARTICLES AND METHODS FOR MAKING AND USING STRUCTURALLY-COLORED ARTICLES", filed on Jul. 15, 2020.

BACKGROUND

Structural color is caused by the physical interaction of light with the micro- or nano-features of a surface and the bulk material as compared to color derived from the presence of dyes or pigments that absorb or reflect specific wavelengths of light based on the chemical properties of the dyes or pigments. Color from dyes and pigments can be problematic in a number of ways. For example, dyes and pigments and their associated chemistries for fabrication and incorporation into finished goods may not be environmentally friendly.

BRIEF DESCRIPTION OF THE DRAWINGS

Further embodiments of the present disclosure will be more readily appreciated upon review of the detailed description of its various embodiments, described below, when taken in conjunction with the accompanying drawings.

FIGS. 3-5 illustrate articles including an optical element.

Figure 1N:
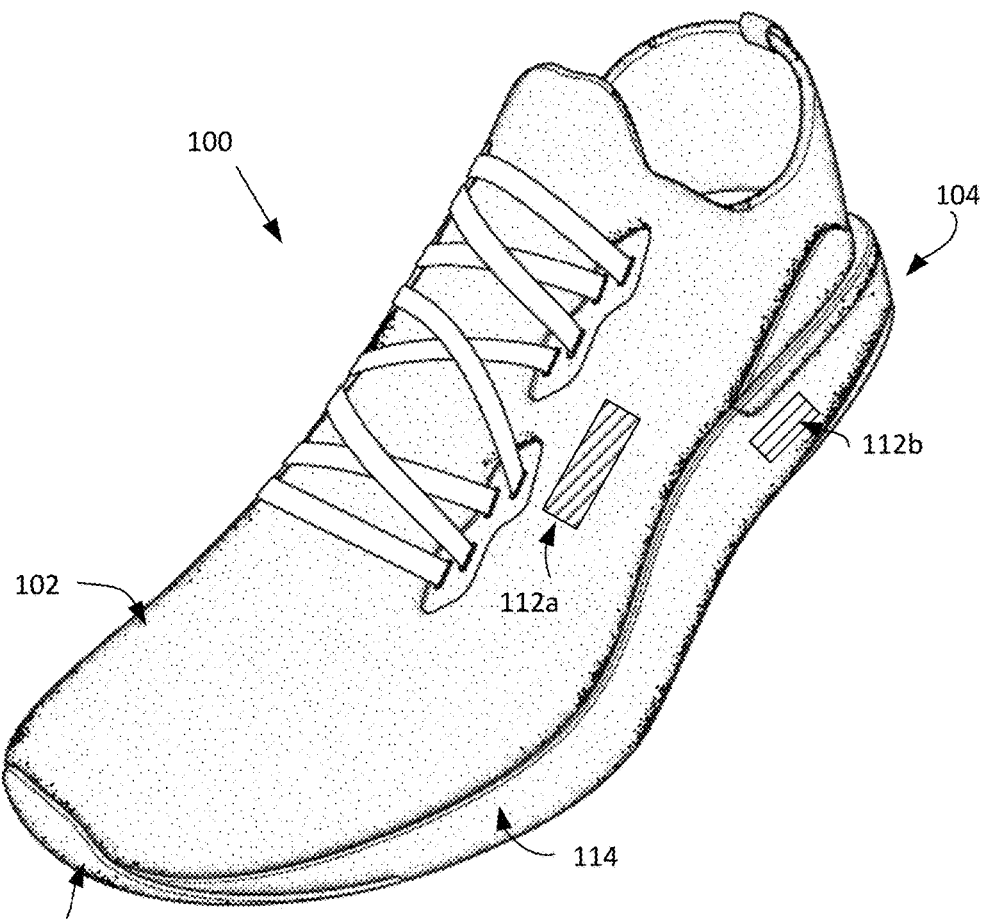
FIGS. 1A-1M shows various articles of footwear, apparel, athletic equipment, container, electronic equipment, and vision wear that include the primer layer in accordance with the present disclosure, while FIGS. 1N(a)-1Q(e) illustrate additional details regarding different types of footwear.
Figure 1N:
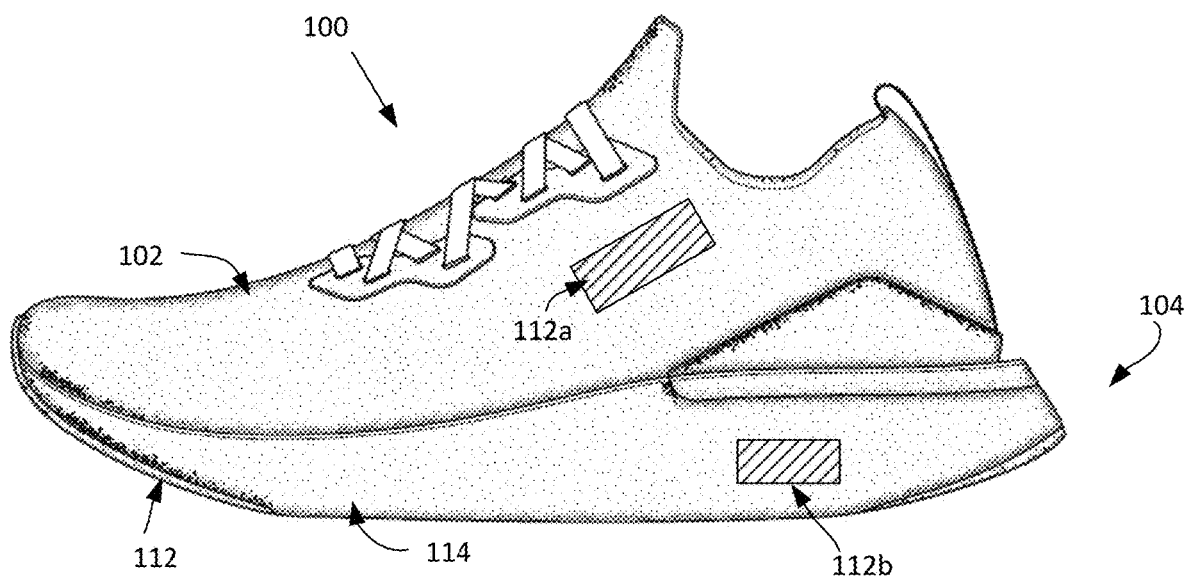
Figure 10A:
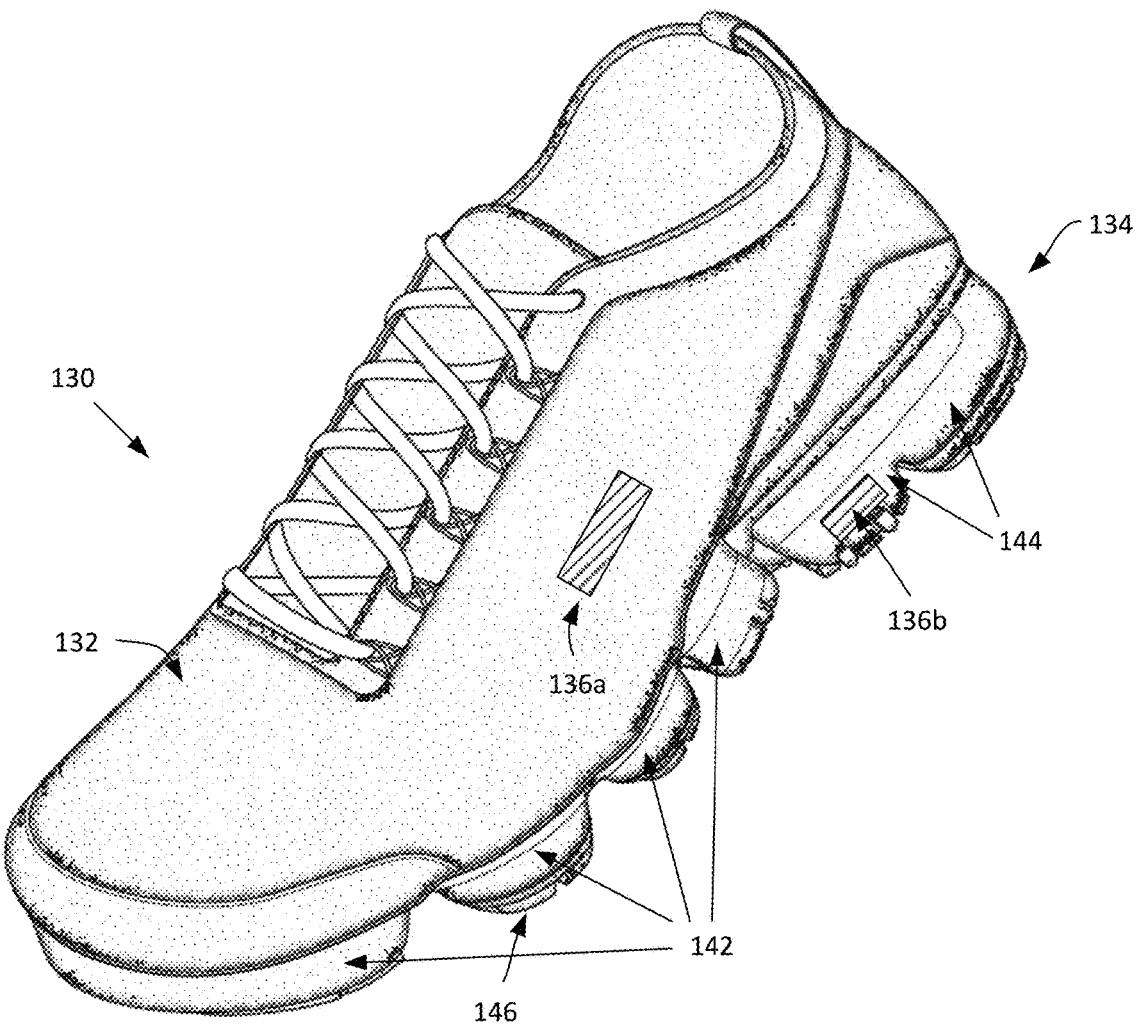
Figure 10B:
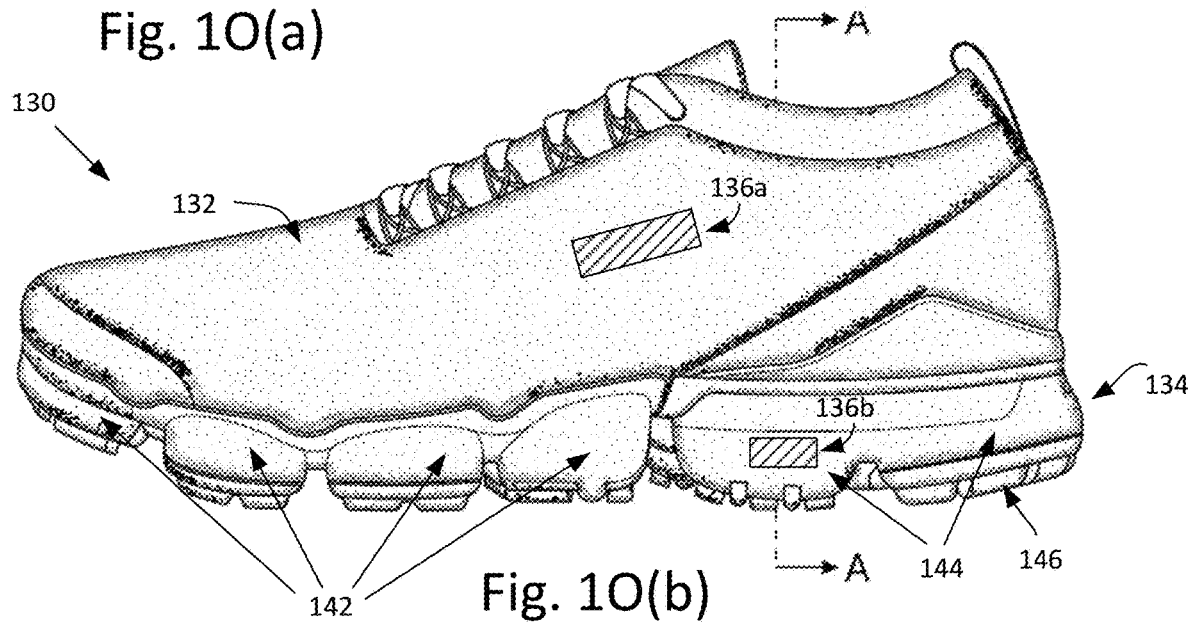
Figure 10C:
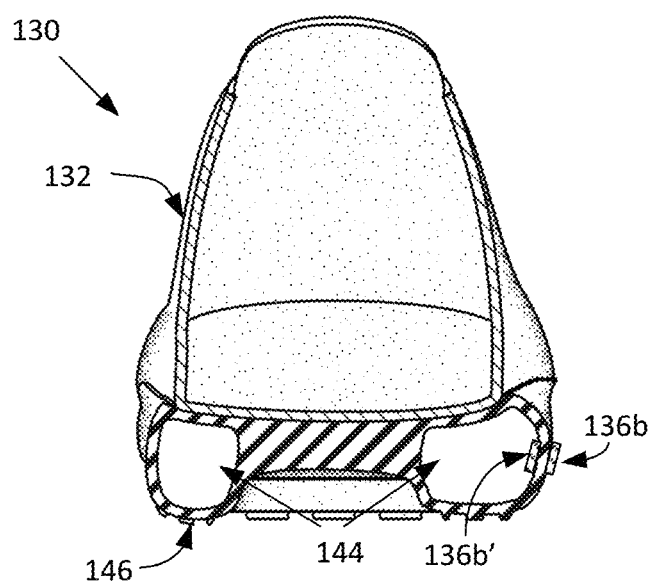

The drawings described herein are for illustration purposes only and are not intended to limit the scope of the present disclosure in any way.

DESCRIPTION

The present disclosure provides for articles that exhibit structural colors through the use of an optical element having one or more layers. Structural colors ("single-hued" or "multi-hued" or "multi-hued with full iridescence" or "multi-hued with limited iridescence") are visible colors produced, at least in part, through optical effects (e.g., through scattering, refraction, reflection, interference, and/or diffraction of visible wavelengths of light). The structural color produced can be characterized based on the color parameter of the color (e.g., its hue, value, chroma, color space coordinates, iridescence type (limited or full), or any combination thereof) as determined at a single angle of observation, as well as whether or not the properties of the color shift as the angle of observation shifts. The present disclosure provides for single-hued structural colors (colors which do not shift between hues as the angle of observation changes) as well as multi-hued structural colors (e.g., multi-hued structural color, multi-hued structural color with limited iridescence, and multi-hued structural color with full iridescence). The structural colors can exhibit no iridescence (e.g., single-hued structural colors), multi-hued structural color (e.g., appears to shift between hues), or can exhibit limited iridescence, or can exhibit full iridescence by shifting between all or nearly all the hues of visible light when viewed at different angles of observation. The methods and optical elements described herein can be used to impart two or more different colors to an article. Unlike conventional pigment or dye-based methods, which use different type of colorants and/or different concentrations of colorants to impart different colors to an article, the optical elements described herein can be formed using a single process and a single set of raw materials, while producing an optical element having a layered structure that produces structural color which varies across the surface of the article. This variation in the layered structure of the optical element imparts a variety of different structural colors to different regions of a surface of an article.

For example, the optical element can include at least a first region A and a first region B disposed on a first area of the article. In addition, the optical element can include a second region A and a second region B disposed on a second area of the article. Between the first area and the second area is a middle region, specifically, the middle region is between the first region B and the second region B. The middle region includes at least one layer of the optical element. The different regions (e.g., first region A, a first region B, second region A, a second region B, and the middle region) are part of the same optical element and can impart structural color (e.g., at least first region A, a first region B, second region A, and a second region B impart structural color while the middle region may impart a structural color). Additional regions can also be part of the optical element.

The first region A and second region A of the optical element impart a first structural color to the article. The first region B and second region B of the optical element impart a second structural color to the article. The middle region has a third color, which can be a third structural color. A first structural color (e.g., characterized by a color parameter such as a hue, value, chroma, color space coordinates, iridescence type (limited or full), or any combination thereof) and the second structural color (e.g., characterized by a color parameter such as a hue, value, chroma, color space coordinates, iridescence type (limited or full), or any combination thereof) are different (e.g., differ in at least one color parameter such as hue, value, chroma, color system coordinates, type of iridescence, or any combination thereof, or differ in at least one of hue, value and chroma, or differ in hue) when viewed from the same angle of observation (e.g., to a viewer having 20/20 visual acuity and normal color vision from a distance of about 1 meter under normal lighting conditions (e.g., about 30 lux of sunlight)). Similarly, the third color is different from the first structure color or the second structural color or both when viewed from the same angle of observation (e.g., to a viewer having 20/20 visual acuity and normal color vision from a distance of about 1 meter under normal lighting conditions (e.g., about 30 lux of sunlight)). In particular, the third structural color is different from the first structure color and the second structural color when viewed from the same angle of observation (e.g., to a viewer having 20/20 visual acuity and normal color vision from a distance of about 1 meter under normal lighting conditions (e.g., about 30 lux of sunlight)). In this way, the optical element on the article can include multiple different structural colors in a patterned or random design so as to provide an aesthetically pleasing and unique appearance as a result of the multiple different structural colors.

The optical element comprises at least one layer (e.g., constituent layer, reflective layer). A total number of the one or more layers in each of the first region A, the first region B, the second region A, and the second region B of the optical element correspond (e.g., each region has the same number of layers). Each corresponding layer in the first region A, the first region B, the second region A and the second region B of the optical element consists essentially of the same material. Vertically adjacent layers can be made of different materials. The first region A and the first region B are structurally different and the second region A and the second region B are structurally different. The middle region can include the same number of layers as the first region A, the first region B, the second region A, and the second region B but can optionally only one layer up to one less layer than the other regions. In particular, the middle region can include the same number of layers, one less layer, two less layers, three less layers and so on than the first region B and the second region B.

The first region A and the second region A have a stacked (if more than one layer) layer structure where each layer, independently, has the same or substantially (e.g., at least 90 percent) the same thickness along the length and width of the layer. In contrast, the first region B and the second region B can have a sloping, tapering, or stair-step design so that from the top surface of the optical element, the layer(s) trends down toward the surface of the article at the edge of the middle region. At the point where the layer trends downward, the layer is thicker than at the point where the layer terminates on another layer. In a cross-sectional view, for example, the middle region may appear as a channel or lower area within the optical element between the first region B and the second region B. For example, at least one of the layers of the first region B tapers from a first edge of the first region A to a first point of the first region B so that the thickness of the layer at the first edge of the first region A is greater than the thickness at the first point in the first region B. Similarly, at least one of the layers of the second region B tapers from a second edge of the second region A to a second point of the second region B so that the thickness of the layer at the second edge of the second region A is greater than the thickness at the second point in the second region B. The layer(s) of the first region B slopes down to the edge of the middle region from one side while the layer(s) of the second region B slopes down to the edge of the middle region from another side (e.g., the side opposite the first region B) so that the middle region is between the first region B and the second region B. A first region B cross section and a second region B cross section are the same or substantially the same (e.g., structurally very similar so that the first region B and the second region B impart the same structural color). At least one layer of the first region A has an average thickness that is greater than the average thickness of the corresponding layer in the first region B. Similarly, at least one layer of the second region A has an average thickness that is greater than the average thickness of the corresponding layer in the second region B.

The middle region can have a stacked (if more than one layer) layer structure where each layer, independently, has the same or substantially (e.g., at least 90 percent) the same thickness along the length and width of the layer. Alternatively, the middle region can have a sloping, tapering, or stair-step design to the lowest point or area of the middle region.

A variety of methods can be used to vary the thickness of a layer of the optical element. In one example, when using a deposition method to form the layer, depending upon the positioning of the article relative to the source emitting the material forming the layer, the layer can be deposited unevenly across the surface. Differences in relative heights of elements on or above the surface, including elements of the surface or masks or both, can cast shadows on one or more sections of the surface during the deposition process, creating variability in the thickness of one or more layers In another example, a mask can be used to cover one or more sections of the surface during the deposition process, creating variability in the thickness of one or more layers. When using a deposition method, the materials being deposited can be attracted to sections of the article for example by using a magnet, and/or the materials being deposited can be repelled from sections of the article for example by using a gas, in order to vary the thickness of a layer. One or more of this variety of methods can be used to vary the thickness of one or more layers within a single optical element.

In addition, the optical element can include an optional textured surface, where the optical element is disposed on a surface of the article with the optional textured surface between the optical element and the surface or where the textured surface is part of the optical element, depending upon the design. The combination of the optical element and the optional textured surface can contribute to imparting the first structural color and/or the second structural color (or the third structural color), to the article, where one or both of the first and second structural colors (or third structural color) can be designed to be different than the color of the components of the optical element and/or the underlying material, optionally with or without the application of pigments or dyes to the article.

In this way, the structural colors can impart an aesthetically appealing patterned or random design to the article without requiring the use of inks or pigments and the environmental impact associated with their use, although the structural colors optionally can be modified by the application of pigments or dyes to the article.

After disposing the optical element onto the article, the article exhibits a different color from the underlying surface of the article. For example, the structural color can differ from the color of the underlying surface of the article based on a color parameter such as hue, value, chroma, color space coordinates, iridescence type (limited or full), or any combination thereof. In particular examples, the structural colors themselves, and/or the structural color(s) and the color of the underlying surface of the article, differ from each other in hue and/or iridescence type.

The article can be a finished article such as, for example, an article of footwear, apparel or sporting equipment. The article can be a component of an article of footwear, apparel or sporting equipment, such as, for example, an upper or a sole for an article of footwear, a waistband or arm or hood of an article of apparel, a brim of a hat, a portion of a backpack, or a panel of a soccer ball, and the like. The optical element can be disposed on the surface so that the layer(s) of the optical element is parallel or substantially parallel the surface (e.g., the plane of the layer is parallel the plane of the surface of the article) (also referred to as "in-line", or "in-line" configuration) or so that the layer is perpendicular or substantially perpendicular the surface (also referred to as the optical element laying "on its side", or "on its side" configuration).

The optical element can be disposed (e.g., affixed, attached, adhered, bonded, joined) on a surface of one or more components of the footwear, such as on the shoe upper and/or the sole. The optical element can be incorporated into the sole by incorporating it into a cushioning element such as a bladder or a foam. The sole and/or upper can be designed so that one or more portions of the structurally colored component are visible in the finished article, by including an opening, or a transparent component covering the structurally colored component, and the like.

In an aspect, the optical element can be disposed on a surface of a polymeric layer of the article, where the polymeric layer has a minimum percent transmittance of 30 percent so that the structural color from the side facing the polymeric layer can be observed. In this way, the optical element can be used to provide structural color through the polymeric layer.

The present disclosure provides for an article comprising: an optical element disposed on a surface of the article, wherein the optical element includes at least a first region A and a first region B disposed on a first area of the article and a second region A and a second region B disposed on a second area of the article, wherein the first region A and second region A of the optical element imparts a first structural color to the article, wherein the first region B and second region B of the optical element imparts a second structural color to the article, wherein an area between the first region B and the second region B is a middle region having a third color (optionally a third structural color), wherein a color parameter such as a hue, a value, a chroma, or any combination thereof of the first structural color, the second structural color, and the third color are each different when viewed from the same angle of observation; and wherein the optical element comprises at least one layer, wherein a total number of the at least one layer in the first region A and the first region B of the optical element correspond and wherein a total number of the at least one layer in the second region A and the second region B of the optical element correspond, wherein each corresponding layer in the first region A, the first region B, the second region A and the second region B of the optical element consists essentially of the same material, wherein at least one of the layers of the first region B tapers from a first edge of the first region A to a first point of the first region B so that the thickness of the layer at the first edge of the first region A is greater than the thickness at the first point in the first region B, wherein at least one of the layers of the second region B tapers from a second edge of the second region A to a second point of the second region B so that the thickness of the layer at the second edge of the second region A is greater than the thickness at the second point in the second region B, wherein the middle region includes a first layer that consists essentially of the same material as one of the layers of the first region B or second region B.

The present disclosure provides for a method of making an article comprising: applying a masking element to or offset from a surface of an article, creating a portion of the surface including adjacent masked and unmasked regions, disposing an optical element to the portion, removing the masking element from the portion, exposing a structurally colored surface including at least a first structural color and a second structural color, the first structural color and the second structural color are different when viewed from the same angle of observation. In an aspect, the structurally colored surface includes an optical element with a structure comprising the structure as described above and herein. The masking element can include a film, a fiber, a filament, or a yarn and can be positioned above the surface of the article prior to forming the layer, for example.

The present disclosure will be better understood upon reading the following numbered aspects, which should not be confused with the claims. Any of the numbered aspects below can, in some instances, can be combined with aspects described elsewhere in this disclosure and such combinations are intended to form part of the disclosure.

Aspect 1. An article comprising:
an optical element disposed on a surface of the article, wherein the optical element includes at least a first region A and a first region B disposed on a first area of the article and a second region A and a second region B disposed on a second area of the article, wherein the first region A and second region A of the optical element imparts a first structural color (characterized by first color parameter, e.g., a first hue, value, chroma, color system coordinates, type of iridescence, or any combination thereof) to the article, wherein the first region B and second region B of the optical element imparts a second structural color (characterized by a second color parameter, e.g., characterized by a second hue, value, chroma, color system coordinates, type of iridescence, or any combination thereof) to the article, wherein an area between the first region B and the second region B is a middle region having a third color (characterized by a third color parameter, e.g., characterized by a third hue, value, chroma, color system coordinates, type of iridescence, or any combination thereof) (optionally a third structural color), wherein first structural color, the second structural color, and the third color (optionally the third structural color) differ from each other (e.g., differ in at least one color parameter, for example, differ in at least one of hue, value, chroma, color system coordinates, type of iridescence, or any combination thereof, or differ in at least one of hue, value and chroma, or differ in hue) when viewed from the same angle of observation, for example by a viewer having 20/20 visual acuity and normal color vision from a distance of about 1 meter under normal lighting conditions;

wherein the optical element comprises at least one layer, wherein a total number of the at least one layer in the first region A and the first region B of the optical element correspond and wherein a total number of the at least one layer in the second region A and the second region B of the optical element correspond, wherein each corresponding layer in the first region A, the first region B, the second region A and the second region B of the optical element consists essentially of the same material, wherein at least one of the layers of the first region B tapers from a first edge of the first region A to a first point of the first region B so that the thickness of the layer at the first edge of the first region A is greater than the thickness at the first point in the first region B, wherein at least one of the layers of the second region B tapers from a second edge of the second region A to a second point of the second region B so that the thickness of the layer at the second edge of the second region A is greater than the thickness at the second point in the second region B, wherein the middle region includes a first layer that consists essentially of the same material as one of the layers of the first region B or second region B.

Aspect 2. The article of aspect 1, wherein the middle region includes at least one layer, wherein the total number of the at least one layer in the middle region, the first region B, and the second region B of the optical element correspond, wherein each corresponding layer in the middle region, the first region B, and the second region B of the optical element consists essentially of the same material, wherein at least one of the layers of the middle region has a thickness less than the thickness of the corresponding layer in the first region A or second region A.

Aspect 3. The article of aspect 1, wherein the total number of the layers in the middle region, the first region B, and the second region B of the optical element correspond, wherein each corresponding layer in the middle region, the first region B, and the second region B of the optical element consists essentially of the same material, wherein each layer of the middle region has a thickness less than the thickness of the corresponding layer in the first region A or second region A.

Aspect 4. The article of aspect 1, wherein the middle region includes at least one layer, wherein the total number of the at least one layer in the middle region is different that the total number of the at least one layer in the first region B and the second region B of the optical element correspond.

Aspect 5. The article of aspect 1, wherein at least one of the layers of the middle region has a thickness less than the thickness of the corresponding layer in the first region A or second region A.

Aspect 6. The article of aspect 1, wherein each layer of the first region B tapers from a first edge of the first region A to a first point of the first region B so that the thickness of each layer at the first edge of the first region A is greater than the thickness at the first point in the first region B; and wherein each layer of the second region B tapers from a second edge of the second region A to a second point of the second region B so that the thickness of each layer at the second edge of the second region A is greater than the thickness at the second point in the second region B; wherein the middle region is between the first point and the second point (optionally, wherein the first point is the thinnest thickness of each layer in the first region B) (optionally, wherein the second point is the thinnest thickness of each layer in the second region B).

Aspect 7. The article of aspect 1, wherein at least one of the layers of the first region B tapers from a first edge of the first region A to a third point of the first region B so that the thickness of the layer at the first edge of the first region A is greater than the thickness at the third point in the second region B, wherein the first point and the third point are at different locations, wherein the middle region is between the first point and the second point (optionally, wherein at least one of the layers of the second region B tapers from a second edge of the second region A to a fourth point of the second region B so that the thickness of the layer at the second edge of the second region A is greater than the thickness at the fourth point in the second region B, wherein second point and the fourth point are at different locations).

Aspect 8. The article of aspect 1, wherein at least one of the layers of the first region B tapers from the first edge of the first region A to a first ending point of said layer so that the first ending point has the thinnest thickness of each the layers in the first region B at the first ending point (optionally, wherein the first ending point is at a position where the layer terminates at the edge of the middle region; optionally, wherein the first ending point is at a position where the layer terminate on another layer in the first region B) (optionally, wherein at least one of the layers of the second region B tapers from the second edge of the second region A to a second ending point of said layer so that the second ending point has the thinnest thickness of each the layers in the second region B at the second ending point) (optionally, wherein the second ending point is at a position where the layer terminates at the edge of the middle region; optionally, wherein the second ending point is at a position where the layer terminate on another layer in the second region B).

Aspect 9. The article of aspect 1, wherein a layer of the first region B is disposed on an adjacent layer, wherein the layer terminates at a point on the adjacent layer, wherein the adjacent layer terminates at a different point than the layer disposed on it.

Aspect 10. The article of aspect 1, wherein at least one of the layers of the first region B tapers in a stair-step manner from the first edge of the first region A to the first point of the first region B; wherein at least one of the layers of the second region B tapers in a stair-step manner from the second edge of the second region A to the second point of the second region B; wherein the middle region is between the first point and the second point.

Aspect 11. The article of aspect 1, wherein the first region B has a first region B cross section that is a stair-step cross section between a first edge and a first point; wherein the second region B has a second region B cross section that is a stair-step cross section between a second edge and a second point; wherein the middle region is between the first point and the second point.

Aspect 12. The article of aspect 10 or 11, wherein at least one of the layers of the first region B does not taper from a third point to a fifth point so that the thickness from the third point to the fifth point of the first region B is substantially (e.g., at least 90 percent) the same (optionally, wherein from the fifth point of the first region B to a seventh point of the first region B the layer tapers in thickness), (wherein at least one of the layers of the second region B does not taper from a fourth point to a sixth point so that the thickness from the fourth point to the sixth point of the first region B is substantially (e.g., at least 90 percent) the same) (optionally, wherein from the sixth point of the second region B to an eight point of the second region B the layer tapers in thickness).

Aspect 12. The article of any preceding aspect, wherein each the layers of the first region B does not taper from a third point to a fifth point so that the thickness of each individual layer from the third point to the fifth point of the first region B is substantially (e.g., at least 90 percent) the same, wherein each individual layer independently has a thickness that are the same or different thickness of other layers (optionally, wherein from the fifth point of the first region B to a seventh point of the first region B each layer tapers in thickness). (wherein each of the layers of the second region B does not taper from a fourth point to a sixth point so that the thickness of each individual layer from the fourth point to the sixth point of the first region B is substantially (e.g., at least 90 percent) the same, wherein each individual layer independently has a thickness that are the same or different thickness of other layers) (optionally, wherein from the sixth point of each layer of the second region B to an eight point of each layer of the second region B each layer tapers in thickness)

Aspect 13. The article of aspect 1, wherein at least one layer of the first region A has a layer first region A average thickness and at least one layer of the middle region has a layer middle region average thickness, wherein the layer middle region average thickness is about 5 to 90% of the thickness of the layer first region A average thickness (optionally, wherein at least one layer of the first region A has a layer first region A average thickness and at least one layer of the first region B has a layer first region B average thickness, wherein the layer first region B average thickness is about 5 to 90% of the thickness of the layer first region A average thickness) (optionally, wherein at least one layer of the second region A has a layer second A region average thickness and at least one layer of the second region B has a layer second B region average thickness, wherein the layer second region B average thickness is about 5 to 90% of the thickness of the layer second region A average thickness)

Aspect 14. The article of any preceding aspect, wherein the surface of the article is a flat or a substantially flat surface, or wherein the surface of the article is non-flat or not substantially non-flat.

Aspect 15. A method of making an article, comprising: disposing the optical element of any one of aspects 1 to 14 onto the surface of the article.

Aspect 16. A method of making an article, comprising:
applying a masking element to or offset from a surface of an article, creating a portion of the surface including adjacent masked and unmasked regions,
disposing an optical element to the portion,
removing the masking element from the portion, exposing a structurally colored surface including at least a first structural color (characterized by a first color parameter, e.g., a first hue, value, chroma, color system coordinates, type of iridescence, or any combination thereof) and a second structural color (characterized by a second color parameter, e.g., a second hue, value, chroma, color system coordinates, type of iridescence, or any combination thereof), wherein the first structural color and the second structural color are different from each other (e.g., differ in at least one color parameter, for example, differ in at least one of hue, value, chroma, color system coordinates, type of iridescence, or any combination thereof, or differ in at least one of hue, value and chroma, or differ in hue) when viewed from the same angle of observation.

Aspect 17. The method of aspect 16, wherein the structurally colored surface includes an optical element with a structure comprising the structure described in the article aspects 1-15.

Aspect 18. The method of aspects 16 or 17, wherein the masking element comprises a film, a fiber, a filament, or a yarn.

Aspect 19. The method of any of aspects 16-18, wherein applying the masking element to the surface comprises disposing the optical element at a distance from the surface of the article and between the surface of the article and a source disposing the optical element, such that, during the disposing, the masking element partially blocks a portion of the surface of the article or casts a shadow onto a portion of the surface of the article.

Aspect 20. The method of aspect 19, wherein the masking element is disposed at least 1 millimeter away from the surface of the article during the disposing.

Aspect 21. The method of aspect 19 or 20, wherein the distance from the surface of the article to the masking element varies during the disposing.

Aspect 22. The method of aspect 19 or 20, wherein the distance from the surface of the article to the masking element is substantially (e.g., at least 90 percent) constant during the disposing.

Aspect 23. An article comprising: a product of the method of any one of aspects 15 to 22.

Aspect 24. The article or method of any one of the preceding aspects, wherein when measured according to the CIE 1976 color space under a given illumination condition at a first observation angle of about −15 to 180 degrees or about or about −15 degrees and +60 degrees, the optical element has a first color measurement having coordinates $L_1^*$ and $a_1^*$ and $b_1^*$ as measured from the first region A (or second region A, or second region B) of the optical element, and optical element has a second color measurement having coordinates $L_2^*$ and $a_2^*$ and $b_2^*$ as measured from the first region B of the optical element, where $\Delta E^*_{ab} = [(L_1^* - L_2^*)^2 + (a_1^* - a_2^*)^2 + (b_1^* - b_2^*)^2]^{1/2}$, wherein the $\Delta E^*_{ab}$ between the first color measurement and the second color measurement is greater than about 2.2, or optionally the $\Delta E^*_{ab}$ is greater than about 3, or optionally is greater than 4, or optionally is greater than 5, the first structural color (or third structural color) and the second structural color are different.

Aspect 25. The article or method of any one of the preceding aspects, wherein when measured according to the CIE 1976 color space under a given illumination condition at a first observation angle of about −15 to 180 degrees or about or about −15 degrees and +60 degrees, the optical element has a first color measurement having coordinates $L_1^*$ and $a_1^*$ and $b_1^*$ as measured from the first region A of the optical element, and optical element has a second color measurement having coordinates $L_2^*$ and $a_2^*$ and $b_2^*$ as measured from the second region A of the optical element, wherein the $\Delta E^*_{ab}$ between the first color measurement and the second color measurement is less than about 3, where $\Delta E^*_{ab} = [(L_1^* - L_2^*)^2 + (a_1^* - a_2^*)^2 + (b_1^* - b_2^*)^2]^{1/2}$, or optionally the $\Delta E^*_{ab}$ is less than about 2.2, the first structural color and the second structural color are the same or substantially the same.

Aspect 26. The article or method of any one of the preceding aspects, wherein when measured according to the CIE 1976 color space under a given illumination condition at a first observation angle of about −15 to 180 degrees or about or about −15 degrees and +60 degrees, the optical element has a first color measurement having coordinates $L_1^*$ and $a_1^*$ and $b_1^*$ as measured from the first region A of the optical element, and optical element has a second color measurement having coordinates $L_2^*$ and $a_2^*$ and $b_2^*$ as measured from the first region B of the optical element, wherein the first structural color and the second structural color are different structural colors when measured and assigned values in the L*a*b* system differ by at least 5 percent for at least one of the L*, a* or b* coordinates, or by at least 10 percent for at least one of the L*, a* or b* coordinates.

Aspect 27. The article or method of any one of the aspects, wherein the optical element is on and visible from an outside surface of the article or the optical element is on and visible from an inside surface of the article.

Aspect 28. The article or method of any one of the preceding aspects, wherein the optical element is a single layer reflector, a single layer filter, a multilayer reflector or a multilayer filter.

Aspect 29. The article or method of any one of the preceding aspects, wherein the optical element includes at least one layer, optionally wherein the at least one layer includes at least one constituent layer, optionally wherein the at least one layer includes at least one reflective layer, optionally wherein the at least one layer includes at least one constituent layer and at least one reflective layer.

Aspect 30. The article or method of any one of the preceding aspects, wherein the optical element is an inorganic optical element, an organic optical element, or a mixed inorganic/organic optical element.

Aspect 31. The article or method of any one of the preceding aspects, wherein the organic optical element has at least one layer that is made of an organic material, optionally wherein the at least one layer is made of a non-metal or non-metal oxide material, optionally, wherein at least one layer is made of a polymeric material (optionally a synthetic polymeric material), optionally wherein the at least one layer is made an organic material that does not include a metal or metal oxide, optionally wherein the at least one layer is made of a polymeric (optionally a synthetic polymeric material) that does not include a metal or metal oxide.

Aspect 32. The article of any one of the preceding aspects, wherein the optical element has 2 to 20 constituent layers and wherein, optionally, each constituent layer has a thickness of about one quarter of the wavelength of the wavelength to be reflected.

Aspect 33. The article of any one of the preceding aspects, wherein each of the constituent layers have different refractive indices.

Aspect 34. The article of any one of the preceding aspects, each constituent layer has a thickness of at least 10 nanometers (optionally at least 30 nanometers, optionally at least 40 nanometers, optionally at least 50 nanometers, optionally at least 60 nanometers, optionally a thickness of from about 10 nanometers to about 100 nanometers, or of from about 30 nanometers to about 80 nanometers, or from about 40 nanometers to about 60 nanometers).

Aspect 35. The article of any of the preceding aspects, wherein the optical element has a thickness of about 100 to about 700 nanometers, or of about 200 to about 500 nanometers.

Aspect 36. The article of any one of the preceding aspects, wherein the at least one constituent layers is made of a material selected from a metal or a metal oxide.

Aspect 37. The article of any one of the aspects, wherein the at least one constituent layer is made of a metal.

Aspect 38. The article of any one of the preceding aspects, wherein the metal is selected from the group consisting of: titanium, aluminum, silver, zirconium, chromium, magnesium, silicon, gold, platinum, and a combination thereof.

Aspect 39. The article of any one of the preceding aspects, wherein at least one of the constituent layers comprises a metal selected from the group consisting of: titanium, aluminum, silver, zirconium, chromium, magnesium, silicon, gold, platinum, niobium, an oxide of any of these, and a combination thereof.

Aspect 40. The article of any one of the preceding aspects, wherein at least one of the constituent layers is made of a material selected from the group consisting of: silicon dioxide, titanium dioxide, zinc sulfide, magnesium fluoride, tantalum pentoxide, and a combination thereof.

Aspect 41. The methods and/or articles of any one of the preceding aspects, wherein the surface of the article is made of a material is selected from: thermoplastic polymer, thermoset polymer, elastomeric polymers, silicone polymers, natural and synthetic rubbers; composite materials including polymers reinforced with carbon fiber and/or glass; natural leather; natural stone; porcelain materials; ceramic materials, metallic materials, glass materials, and combinations thereof.

Aspect 42. The methods and/or articles of any one of the preceding aspects, wherein the thermoplastic material includes one or more thermoplastic polyurethanes, thermoplastic polyethers, thermoplastic polyesters, thermoplastic polyamides, thermoplastic polyolefins, thermoplastic copolymers thereof, or a combination thereof.

Aspect 43. The methods and/or articles of any one of the preceding aspects, wherein the at least one constituent layer further comprises a textured surface, and the textured surface and the optical element imparts the first structural color, the second structural color, or both.

Aspect 44. The methods and/or articles of any one of the preceding aspects, wherein the surface of the article is a textured surface, wherein the at least one constituent layer is on the textured surface, and the textured surface of the substrate and the optical element impart the first structural color, the second structural color, or both.

Aspect 45. The methods and/or articles of any one of the preceding aspects, wherein the textured surface includes a plurality of profile features and flat planar areas, wherein the profile features extend above the flat areas of the textured surface, optionally wherein the dimensions of the profile features, a shape of the profile features, a spacing among the plurality of the profile features, in combination with the optical element create the first structural color, the second structural color, or both, optionally wherein the profile features are in random positions relative to one another for a specific area, optionally wherein the spacing among the profile features is set to reduce distortion effects of the profile features from interfering with one another in regard to the first structural color, the second structural color, or both of the article, optionally wherein the profile features and the flat areas result in at least one layer of the optical element having an undulating topography across the textured surface, wherein there is a planar region between neighboring profile features that is planar with the flat planar areas of the textured surface, wherein the planar region has dimensions relative to the profile features to impart the first structural color, the second structural color, or both, optionally wherein the profile features and the flat areas result in each layer of the optical element having an undulating topography across the textured surface.

Aspect 46. The article and/or method of any of the preceding aspects, wherein the height of the profile feature is about 50 micrometers to 250 micrometers, optionally wherein at least one of the length and width of the profile feature is less than 250 micrometers or both the length and the width of the profile feature is less than 250 micrometers.

Aspect 47. The article and/or method of any of the preceding aspects, wherein at least one of the dimensions of the profile feature is in the nanometer range, while at least one other dimension is in the micrometer range.

Aspect 48. The article and/or method of any of the preceding aspects, wherein the nanometer range is about 10 nanometers to about 1000 nanometers, while the micrometer range is about 5 micrometers to 250 micrometers.

Aspect 49. The article and/or method of any of the preceding aspects, wherein at least one of the length and width of the profile feature is in the nanometer range, while the other of the length and the width of the profile feature is in the micrometer range.

Aspect 50. The article and/or method of any of the preceding aspects, wherein at least one of the length and width of the profile feature is in the nanometer range and the other in the micrometer range, where the height is about 250 nanometers to 250 micrometers.

Aspect 51. The article and/or method of any of the preceding aspects, wherein spatial orientation of the profile features is periodic.

Aspect 52. The article and/or method of any of the preceding aspects, wherein spatial orientation of the profile features is a semi-random pattern or a set pattern.

Aspect 53. The article and/or method of any of the preceding aspects, wherein the surface of the layers of the optical element are a substantially three dimensional flat planar surface or a three dimensional flat planar surface.

Aspect 54. The methods and/or articles of any one of the preceding aspects, wherein the first structural color and the second structural color, independently, exhibits a single hue group or hue or multiple different hue groups or hues when viewed from different viewing angles at least 15 degrees apart.

Aspect 55. The methods and/or articles of any one of the preceding aspects, wherein the article is a fiber.

Aspect 56. The methods and/or articles of any one of the preceding aspects, wherein the article is a yarn optionally a monofilament yarn.

Aspect 57. The methods and/or articles of any one of the preceding aspects, wherein the article is a rolled good.

Aspect 58. The methods and/or articles of any one of the preceding aspects, wherein the article is a textile.

Aspect 59. The methods and/or articles of any one of the preceding aspects, wherein the article is a knit textile.

Aspect 60. The methods and/or articles of any one of the preceding aspects, wherein the article is a non-woven textile.

Aspect 61. The methods and/or articles of any one of the preceding aspects, wherein the article is a synthetic leather.

Aspect 62. The methods and/or articles of any one of the preceding aspects, wherein the article is a film.

Aspect 63. The methods and/or articles of any one of the preceding aspects, wherein the article is an article of footwear, a component of footwear, an article of apparel, a component of apparel, an article of sporting equipment, or a component of sporting equipment.

Aspect 64. The methods and/or articles of any one of the preceding aspects, wherein the article is an article of footwear.

Aspect 65. The methods and/or articles of any one of the preceding aspects, wherein the article is a sole component of an article of footwear.

Aspect 66. The methods and/or articles of any one of the preceding aspects, wherein the article is foam midsole component of an article of footwear.

Aspect 67. The methods and/or articles of any one of the preceding aspects, wherein the article is an upper component of an article of footwear.

Aspect 68. The methods and/or articles of any one of the preceding aspects, wherein the article is a knit upper component of an article of footwear.

Aspect 69. The methods and/or articles of any one of the preceding aspects, wherein the article is a non-woven synthetic leather upper for an article of footwear.

Aspect 70. The methods and/or articles of any one of the preceding aspects, wherein the article is a bladder including a volume of a fluid, wherein the bladder has a first bladder wall having a first bladder wall thickness, wherein the first bladder wall has a gas transmission rate of 15 $cm^3/m^2 \cdot atm \cdot day$ or less for nitrogen for an average wall thickness of 20 mils.

Aspect 71. The methods and/or articles of any one of the preceding aspects, wherein the article is a bladder, and the optical element is optionally on an inside surface of the bladder or optionally the optical element is on an outside surface of the bladder.

Aspect 72. The methods and/or articles of any preceding aspect, wherein the first structural color, the second structural color, any combination of two, independently, visible to a viewer having 20/20 visual acuity and normal color vision from a distance of about 1 meter from the bladder.

Aspect 72. The methods and/or articles of any preceding aspect, wherein the first structural color, the second structural color, and/or the third structural color are multi-hued having full iridescence.

Aspect 73. The methods and/or articles of any preceding aspect, wherein the first structural color, the second structural color, and/or the third structural color are multi-hued having limited iridescence.

Aspect 74. The methods and/or articles of the preceding aspect, wherein the first structural color, the second structural color, and/or the third structural color are multi-hued having limited iridescence such that, when a hue of each of the structural colors imparted at the same angle, or wherein each color is visible at each possible angle of observation, and is, independently, assigned to a single hue selected from the group consisting of the primary, secondary and tertiary colors on the red yellow blue (RYB) color wheel, all of the assigned hues fall into a single hue group, and the single hue group includes at least two hues (optionally at least three hues) selected from red, red-orange, orange, orange-yellow, yellow, yellow-green, green, green-blue, blue, blue-purple, purple, and purple-red.

Aspect 75. The methods and/or articles of Aspect 74, wherein, in the single hue group, the hue of at least two of the first structural color, the second structural color, and the third structural color are directly adjacent to the other two hues on the RYB color wheel (the hues include two analogous hues), optionally wherein the hues of all three structural colors are directly adjacent to each other on the RYB color wheel (all three hues are analogous).

Aspect 76. The methods and/or articles of Aspect 74, wherein the single hue group is one of a) red and red-orange; b) red-orange and orange; c) orange and orange-yellow; d) orange-yellow and yellow; e) yellow and yellow-green; f) yellow-green and green; g) green and green-blue; h) green-blue and blue; i) blue and blue-purple; j) blue-purple and purple; k) purple and purple-red; and l) purple-red and red.

Aspect 77. The methods and/or articles of Aspect 74, wherein the single hue group is one of a) yellow-green, yellow, and orange-yellow; b) yellow, orange-yellow, and orange; c) orange-yellow, orange, and red-orange; d) red-orange, red, and purple-red; e) red, purple-red, and purple; f) red-purple, purple, and blue-purple; g) purple, blue-purple, and blue; h) blue-purple, blue, and green-blue; i) blue, green-blue, and green; and j) green-blue, green, and yellow-green.

Aspect 78. The methods and/or articles of Aspect 74, wherein, in the single hue group, the hue of at least two of the first structural color, the second structural color, and the third structural color are not directly adjacent to the others hues on the RYB color wheel (at least two of the hues are non-analogous), optionally wherein the hues of all three of the first structural color, the second structural color, and the third structural color are not directly adjacent to each other on the RYB color wheel (all three hues are non-analogous).

Aspect 79. The methods and/or articles of Aspect 74, wherein the single hue group is one of a) red and orange; b) red-orange and orange-yellow; c) yellow and green; d) yellow-green and green-blue; e) green and blue; f) green-blue and blue-purple; g) blue and purple; h) blue-purple and purple-red; i) purple and red; and j) purple-red and red-orange.

Aspect 80. The methods and/or articles of Aspect 74, wherein the single hue group is one of a) red and orange-yellow; b) red-orange and yellow; c) orange and yellow-green; d) yellow-orange and green; e) yellow and green-blue; f) yellow-green and blue; g) green and blue-purple; h) green-blue and purple; i) blue and purple-red; j) blue-purple and red; k) purple and red-orange; and l) purple-red and orange.

Aspect 81. The methods and/or articles of Aspect 74, wherein the single hue group is one of a) red and yellow; b) red-orange and yellow-green; c) orange and green; d) orange-yellow and green-blue; e) yellow and blue; f) yellow-green and blue-purple; g) green and purple; h) green-blue and purple-red; i) blue and red; j) blue-purple and red-orange; k) purple and orange; and l) purple-red and orange-yellow.

Aspect 82. The methods and/or articles of Aspect 74, wherein the single hue group is one of a) red and yellow-green; b) red-orange and green; c) orange and green-blue; d) orange-yellow and blue; e) yellow and blue-purple; f) yellow-green and purple; g) green and purple-red; h) green-blue and red; i) blue and red-orange; j) blue-purple and orange, k) purple and orange-yellow, and l) purple-red and yellow.

Aspect 83. The methods and/or articles of Aspect 74, wherein the single hue group includes a complementary pair of hues, optionally wherein the complementary pair of hues includes a) red and green; b) red-orange and green-blue; c) orange and blue; d) orange-yellow and blue-purple; e) yellow and purple; and f) yellow-green and purple-red.

Aspect 84. The methods and/or articles of the preceding aspect, wherein at least one of the first structural color, the second structural color, and the third structural color is an achromatic color, optionally wherein the achromatic color is black, gray or white.

Now having described embodiments of the present disclosure generally, additional discussion regarding embodiments will be described in greater details.

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method may be carried out in the order of events recited or in any other order that is logically possible.

Embodiments of the present disclosure will employ, unless otherwise indicated, techniques of material science, chemistry, textiles, polymer chemistry, and the like, which are within the skill of the art. Such techniques are explained fully in the literature.

Unless otherwise defined, all technical and scientific terms used herein have the same meaning as commonly understood by one of ordinary skill in the art of material science, chemistry, textiles, polymer chemistry, and the like. Although methods and materials similar or equivalent to those described herein can be used in the practice or testing of the present disclosure, suitable methods and materials are described herein.

As used in the specification and the appended claims, the singular forms "a," "an," and "the" may include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

The present disclosure provides for articles (e.g., structurally colored articles) that exhibit different structural colors in different regions of the article using an optical element, where the optical element has different structures (e.g., cross-sectional structures) in at least two of those regions. The optical element (e.g., a single layer reflector, a single layer filter, a multilayer reflector or a multilayer filter) is disposed on the article and has a first region A, a first region B, a second region B, a second region A, and a middle region. A middle region is disposed between the first region B and the second region B and includes at least one layer of the optical element. The first region A is adjacent first region B, while the second region A is adjacent second region B. The first region A and the second region A impart the same structural color (e.g., first structural color) and the first region B and the second region B impart the same structural color (e.g., second structural color), that is different than that of the first region A and the second region A. The middle region has a color (e.g., a third structural color) associated with the optical element. Each corresponding structural color is a visible color (e.g., to a viewer having 20/20 visual acuity and normal color vision from a distance of about 1 meter under normal lighting conditions (e.g., about 30 lux of sunlight)) produced, at least in part, through optical effects such as through scattering, refraction, reflection, interference, and/or diffraction of visible wavelengths of light. The structural color from each region can be a single-hued structural color or a multi-hued structural color. In this way, articles including the optical element can provide for a plurality of appealing visual colors in a patterned or random design. The optical element can be incorporated onto one or more components of an article, for example, when the article is an article of footwear, on an upper or sole of an article of footwear.

Each region of the optical element includes at least one layer (e.g., constituent layer, reflective layer), where the number of layer(s) in each region is the same with the possible exception of the middle region, which may or may not include the same number of layers. For example, the first region A of the optical element has six layers and the second region A of the optical element incudes six layers, while the middle region may have six layers or one or more layers less than six. Also, the first region B of the optical element has six layers and the second region B of the optical element incudes six layers. The average thickness of the corresponding layers of the first region A and the second region A is the same or substantially the same (e.g., about 90 percent, about 95 percent, or about 99 percent or more). The average thickness of the corresponding layers of the first region B and the second region B is the same or substantially the same (e.g., about 90 percent, about 95 percent, or about 99 percent or more). The average thickness of the corresponding layer(s) in the middle region is less than that of the first region A or second region A. The first region B cross section and the second region B cross section are the same or substantially (e.g., about 90 percent, about 95 percent, or about 99 percent or more) the same but are different than the cross section of the first region A and the second region A. The middle region cross section is different than the first region A, second region A, the first region B, and the second region B. The different dimensions of the first region A and second region A as compared to the first region B and the second region B can contribute to the difference in the first structural color and the second structural color. Similarly, the different dimensions of the middle region may contribute to a different color, in particular a different third structural color.

In regard to the phrase "corresponding layer", this phrase references a layer that was formed at the same time for each region (e.g., first layer of the first region A and the first layer of the second region B are corresponding layers; the third layer of the first region B and the third layer of the second region B are corresponding layers; the second layer of the first region A and the second layer of the middle layer; and so on). The phrase "non-corresponding layer" refers to one or more layers that are formed at a different time and/or using a technique (e.g., mask) that allows formation of the layer in one region of the optical element and not in another region of the optical element. While reference is made to five regions, a plurality of regions is contemplated and can include 10 s to 100 s to 1000 s or more depending upon the article and the desired effect, where the different regions can be present at a different cross-sectional area.

Each corresponding layer in the first region A, the first region B, the second region A and the second region B of the optical element consists essentially of the same material. For the corresponding layer in the middle layer, each corresponding layer consists of essentially the same material as the first region B layer and second region B layer. Vertically adjacent layers can be made of different materials. The materials can be inorganic (e.g., metal oxides) materials, organic materials (e.g., polymers), or a mixture of inorganic and organic material. Also, vertically adjacent layers can be made of inorganic materials, organic materials, or a mixture of inorganic and organic materials (e.g., first layer is made of a metal oxide, the second layer is made of a polymer, and the third layer is a made of a metal oxide, or the like).

As stated herein, the first region A and second region A of the optical element impart a first structural color to the article. The first region B and second region B of the optical element imparts a second structural color to the article. The middle region has a third color and can optionally impart a third structural color. A color parameter such as a hue, a value, a chroma, or any combination thereof of the first structural color and the second structural color are different when viewed from the same angle of observation. Similarly, a hue, a value, a chroma, or any combination thereof of the third color (in particular the third structural color) is different from the first structure color or the second structural color or both when viewed from the same angle of observation.

In general, each individual layer, independently of any of layers present (if present), of the first region A and the second region A have about the same or substantially (e.g., about 90 percent, about 95 percent, or about 99 percent or more) the same thickness across the entire region. Each individual layer, independently of any of layers present (if present), in the first region B and the second region B can have a thickness that is different at different points along the length of the layer from the edge of the layer adjacent the first region A or second region A, respectively, towards the edge of the middle region. In some aspects, along some lengths of the first region B and second region B, the thickness is the same but will change at portions along the length (e.g., a stair step patterns). In general, the thickness closer to the edge of the first region A or the second region A is greater than the thickness along the length of the layer moving towards the edge of the middle region, but in some configurations the thickness at an point along the length can be thicker, albeit the trend along the entire length is thinner. In an aspect, the first region B and the second region B can have a sloping, tapering, or stair-step design (e.g. cross section) from the edge of the first region A or the second region B, respectively, so that the layer(s) trends down toward the surface of the article at the edge of the middle region and the thickness generally decreases. At the point where the layer trends downward from first region A or second region A, the layer is thicker than at the point where the layer terminates on the surface on the edge of the middle region (or on another layer if one is present in some aspects).

In general, each individual layer, independently of any of layers present (if present), of the middle region have about the same or substantially (e.g., about 90 percent, about 95 percent, or about 99 percent or more) the same thickness across the entire region. Alternatively, each individual layer, independently of any of layers present (if present), in the middle region can have a thickness that is different at different points along the length of the layer, typically towards a point in the middle of the middle layer.

In a cross-sectional view, for example, the middle region may appear as a channel within the optical element between the first region B and the second region B as the layers angle up towards to the higher points of the optical element. A first region B cross section and a second region B cross section are the same or substantially the same (e.g., structurally very similar so that the first region B and the second region B impart the same structural color), where the middle region is disposed between them.

Generally, the optical element can include one or more layers (e.g., constituent layers, reflective layers). Also as described herein, the optical element can optionally include a textured surface, such as a textured layer and/or a textured structure. Optionally, the optical element can include one or more layers (e.g., protection layer, and the like) to provide one or more characteristics to the optical element (e.g., better wear characteristic, better adhesion characteristic, and the like).

The optical element can be disposed on a surface in a variety of ways. For example, the optical element can be disposed on the surface so that each of the layers of the optical element are parallel or substantially parallel (e.g., about 90 percent or more) the surface (e.g., disposed "in line"). In other words, the length and width of the layers of the optical element define the plane, while the thickness of the layer is the smallest dimension. In another example, each of the layers of the optical element are perpendicular or substantially perpendicular (e.g., about 90 percent or more) the surface. In either configuration, the optical element can produce an aesthetically pleasing appearance.

In one or more embodiments of the present disclosure the surface of the article includes the optical element, and is optionally a textured surface, where the optical element and optionally the textured surface impart structural color (e.g., single-hued structural color or a multi-hued structural color). The optional textured surface can be disposed between the optical element and the surface or be part of the optical element, depending upon the design. Additional details are provided herein.

In an embodiment, the structural color (e.g. the first structural color, the second structural color, the third structural color) is not used in combination with a pigment and/or dye. In another aspect, the structural color can be used in combination with a pigment and/or dye, but the structural color is not the same hue, value, chroma, or any combination of a hue, a value and a chroma as the pigment and/or dye, meaning that the structural color alone, and the structural color in combination with the pigment and/or dye differ from each other in at least one color property or characteristic (e.g., hue, value, chroma, color space coordinate, iridescence type, etc.). In this regard, the structural color is the product of the textured surface, the optical element, and/or the pigment and/or dye. In an embodiment, the structural color can be used in combination with a pigment and/or dye to enhance the color of the pigment and/or dye in regard to the color of the pigment and/or dye or enhance a hue, value, chroma or other color property associated with the pigment and/or dye. In an aspect, the structural color is imparted solely by the layers of the optical element and not by pigments and/or dyes. In an aspect, the structural color is imparted solely by the layers of the optical element and not by the textured surface. In an aspect, the structural color is imparted solely by the layers of the optical element and not by pigments and/or dyes or the textured surface.

The article can be an article of manufacture or a component of the article. The article of manufacture can include footwear, apparel (e.g., shirts, jerseys, pants, shorts, gloves, glasses, socks, hats, caps, jackets, undergarments), containers (e.g., backpacks, bags), and upholstery for furniture (e.g., chairs, couches, car seats), bed coverings (e.g., sheets, blankets), table coverings, towels, flags, tents, sails, and parachutes, or components of any one of these. In addition, the optical element can be used with or disposed on textiles or other items such as striking devices (e.g., bats, rackets, sticks, mallets, golf clubs, paddles, etc.), athletic equipment (e.g., golf bags, baseball and football gloves, soccer ball restriction structures), protective equipment (e.g., pads, helmets, guards, visors, masks, goggles, etc.), locomotive equipment (e.g., bicycles, motorcycles, skateboards, cars, trucks, boats, surfboards, skis, snowboards, etc.), balls or pucks for use in various sports, fishing or hunting equipment, furniture, electronic equipment, construction materials, eyewear, timepieces, jewelry, and the like.

The surface of the article can be a flat or a substantially flat surface (e.g., can include topographical features that are less than about 1 millimeter). The surface of the article can be non-flat or not substantially non-flat (e.g., include topographical features (e.g., random or patterned) greater than about 1 millimeter that do not contribute to imparting optical color).

The article can be an article of footwear. The article of footwear can be designed for a variety of uses, such as sporting, athletic, military, work-related, recreational, or casual use. Primarily, the article of footwear is intended for outdoor use on unpaved surfaces (in part or in whole), such as on a ground surface including one or more of grass, turf, gravel, sand, dirt, clay, mud, pavement, and the like, whether as an athletic performance surface or as a general outdoor surface. However, the article of footwear may also be desirable for indoor applications, such as indoor sports including dirt playing surfaces for example (e.g., indoor baseball fields with dirt infields).

In particular, the article of footwear can be designed for use in indoor or outdoor sporting activities, such as global football/soccer, golf, American football, rugby, baseball, running, track and field, cycling (e.g., road cycling and mountain biking), and the like. The article of footwear can optionally include traction elements (e.g., lugs, cleats, studs, and spikes as well as tread patterns) to provide traction on soft and slippery surfaces, where components of the present disclosure can be used or applied between or among the traction elements and optionally on the sides of the traction elements but on the surface of the traction element that contacts the ground or surface. Cleats, studs and spikes are commonly included in footwear designed for use in sports such as global football/soccer, golf, American football, rugby, baseball, and the like, which are frequently played on unpaved surfaces. Lugs and/or exaggerated tread patterns are commonly included in footwear including boots design for use under rugged outdoor conditions, such as trail running, hiking, and military use.

In particular, the article can be an article of apparel (i.e., a garment). The article of apparel can be an article of apparel designed for athletic or leisure activities. The article of apparel can be an article of apparel designed to provide protection from the elements (e.g., wind and/or rain), or from impacts.

In particular, the article can be an article of sporting equipment. The article of sporting equipment can be designed for use in indoor or outdoor sporting activities, such as global football/soccer, golf, American football, rugby, baseball, running, track and field, cycling (e.g., road cycling and mountain biking), and the like.

FIGS. 1A-1M illustrates footwear, apparel, athletic equipment, container, electronic equipment, and vision wear that include the structure (e.g., the optical element, optionally the textured surface) of the present disclosure. The structure can include the optical element in the "in-line" configuration and/or the "on its side" configuration. The structure including the optical element is represented by hashed areas 12A'/12M'-12A"/12M'. The location of the structure is provided only to indicate one possible area that the structure can be located. Also, two locations are illustrated in some of the figures and one location is illustrated in other figures, but this is done only for illustration purposes as the items can include one or a plurality of structure, where the size and location can be determined based on the item. The structure(s) located on each item can represent a number, letter, symbol, design, emblem, graphic mark, icon, logo, or the like.

FIGS. 1N(a) and 1N(b) illustrate a perspective view and a side view of an article of footwear 100 that include a sole structure 104 and an upper 102. The structure including the optical element is represented by 122a and 122b. The sole structure 104 is secured to the upper 102 and extends between the foot and the ground when the article of footwear 100 is worn. The primary elements of the sole structure 104 are a midsole 114 and an outsole 112. The midsole 114 is secured to a lower area of the upper 102 and may be formed of a polymer foam or another appropriate material. In other configurations, the midsole 114 can incorporate fluid-filled chambers, plates, moderators, and/or other elements that further attenuate forces, enhance stability, or influence motions of the foot. The outsole 112 is secured to a lower surface of the midsole 114 and may be formed from a wear-resistant rubber material that is textured to impart traction, for example. The upper 102 can be formed from various elements (e.g., lace, tongue, collar) that combine to provide a structure for securely and comfortably receiving a foot. Although the configuration of the upper 102 may vary significantly, the various elements generally define a void within the upper 102 for receiving and securing the foot relative to sole structure 104. Surfaces of the void within upper 102 are shaped to accommodate the foot and can extend over the instep and toe areas of the foot, along the medial and lateral sides of the foot, under the foot, and around the heel area of the foot. The upper 102 can be made of one or more materials such as textiles, a polymer foam, leather, synthetic leather, and the like that are stitched or bonded together. Although this configuration for the sole structure 104 and the upper 102 provides an example of a sole structure that may be used in connection with an upper, a variety of other conventional or nonconventional configurations for the sole structure 104 and/or the upper 102 can also be utilized. Accordingly, the configuration and features of the sole structure 104 and/or the upper 102 can vary considerably.

FIGS. 1O(a) and 1O(b) illustrate a perspective view and a side view of an article of footwear 130 that include a sole structure 134 and an upper 132. The structure including the optical element is represented by 136a and 136b/136b'. The sole structure 134 is secured to the upper 132 and extends between the foot and the ground when the article of footwear 130 is worn. The upper 132 can be formed from various elements (e.g., lace, tongue, collar) that combine to provide a structure for securely and comfortably receiving a foot. Although the configuration of the upper 132 may vary significantly, the various elements generally define a void within the upper 132 for receiving and securing the foot relative to the sole structure 134. Surfaces of the void within the upper 132 are shaped to accommodate the foot and can extend over the instep and toe areas of the foot, along the medial and lateral sides of the foot, under the foot, and around the heel area of the foot. The upper 132 can be made of one or more materials such as textiles including natural and synthetic leathers, molded polymeric components, polymer foam and the like that are stitched or bonded together.

The primary elements of the sole structure 134 are a forefoot component 142, a heel component 144, and an outsole 146. Each of the forefoot component 142 and the heel component 144 are directly or indirectly secured to a lower area of the upper 132 and formed from a polymer material that encloses a fluid, which may be a gas, liquid, or gel. During walking and running, for example, the forefoot component 142 and the heel component 144 compress between the foot and the ground, thereby attenuating ground reaction forces. That is, the forefoot component 142 and the heel component 144 are inflated and may be pressurized with the fluid to cushion the foot. The outsole 146 is secured to lower areas of the forefoot component 142 and the heel component 144 and may be formed from a wear-resistant rubber material that is textured to impart traction. The forefoot component 142 can be made of one or more polymers (e.g., layers of one or more polymers films) that form a plurality of chambers that includes a fluid such as a gas. The plurality of chambers can be independent or fluidically interconnected. Similarly, the heel component 144 can be made of one or more polymers (e.g., layers of one or more polymers films) that form a plurality of chambers that includes a fluid such as a gas and can also be independent or fluidically interconnected. In some configurations, the sole structure 134 may include a foam layer, for example, that extends between the upper 132 and one or both of the forefoot component 142 and the heel component 144, or a foam element may be located within indentations in the lower areas of the forefoot component 142 and the heel component 144. In other configurations, the sole structure 132 may incorporate plates, moderators, lasting elements, or motion control members that further attenuate forces, enhance stability, or influence the motions of the foot, for example. Although the depicted configuration for the sole structure 134 and the upper 132 provides an example of a sole structure that may be used in connection with an upper, a variety of other conventional or nonconventional configurations for the sole structure 134 and/or the upper 132 can also be utilized. Accordingly, the configuration and features of the sole structure 134 and/or the upper 132 can vary considerably.

FIG. 1O(c) is a cross-sectional view of A-A that depicts the upper 132 and the heel component 144. The optical element 136b can be disposed on the outside wall of the heel component 144 or alternatively or optionally the optical element 136b' can be disposed on the inside wall of the heel component 144.

Figure 1P:
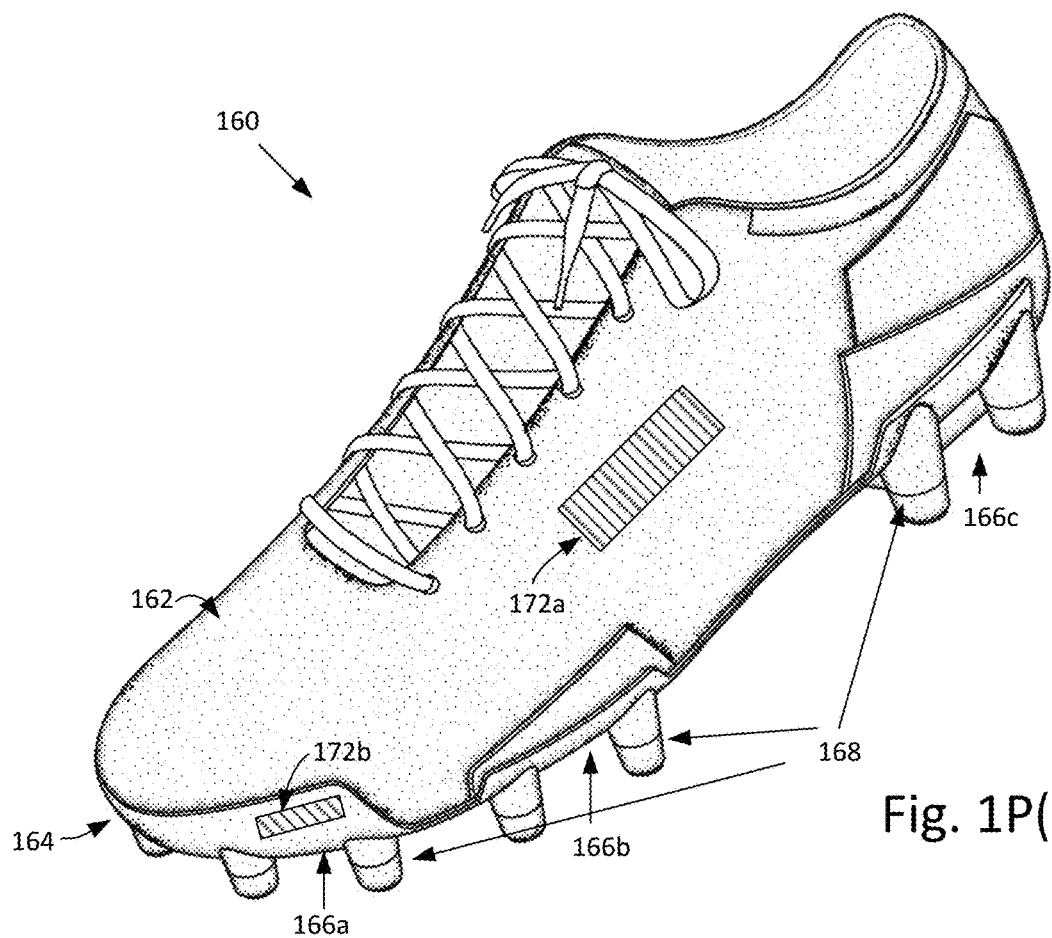
Figure 1P:
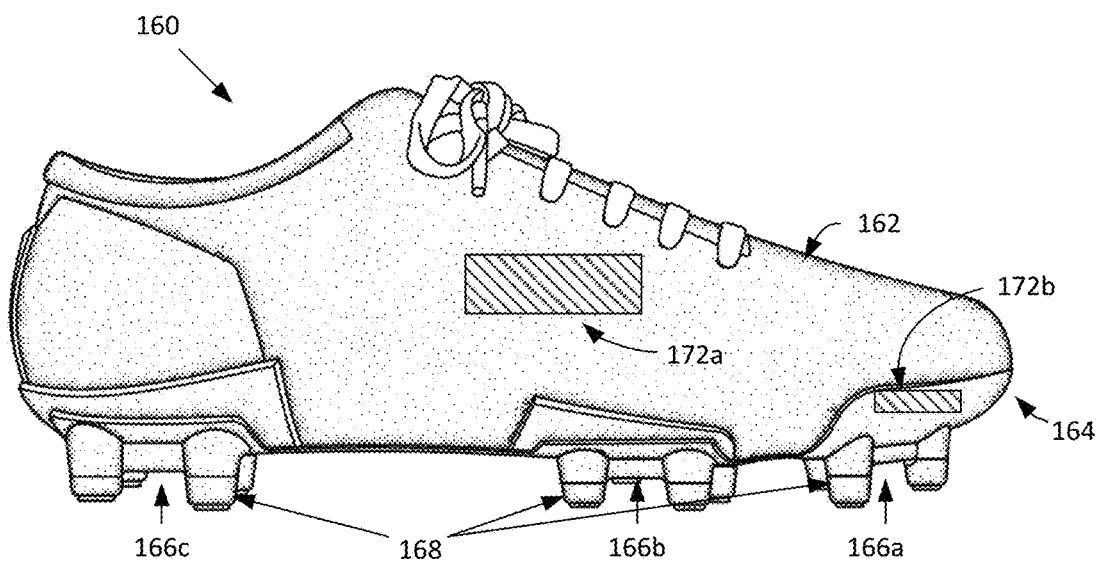

FIGS. 1P(a) and 1P(b) illustrate a perspective view and a side view of an article of footwear 160 that includes traction elements 168. The structure including the optical element is represented by 172a and 172b. The article of footwear 160 includes an upper 162 and a sole structure 164, where the upper 162 is secured to the sole structure 164. The sole structure 164 can include one or more of a toe plate 166a, a mid-plate 166b, and a heel plate 166c. The plate can include one or more traction elements 168, or the traction elements can be applied directly to a ground-facing surface of the article of footwear. As shown in FIGS. 1P(a) and (b), the traction elements 168 are cleats, but the traction elements can include lugs, cleats, studs, and spikes as well as tread patterns to provide traction on soft and slippery surfaces. In general, the cleats, studs and spikes are commonly included in footwear designed for use in sports such as global football/soccer, golf, American football, rugby, baseball, and the like, while lugs and/or exaggerated tread patterns are commonly included in footwear (not shown) including boots design for use under rugged outdoor conditions, such as trail running, hiking, and military use. The sole structure 164 is secured to the upper 162 and extends between the foot and the ground when the article of footwear 160 is worn. The upper 162 can be formed from various elements (e.g., lace, tongue, collar) that combine to provide a structure for securely and comfortably receiving a foot. Although the configuration of the upper 162 may vary significantly, the various elements generally define a void within the upper 162 for receiving and securing the foot relative to the sole structure 164. Surfaces of the void within upper 162 are shaped to accommodate the foot and extend over the instep and toe areas of the foot, along the medial and lateral sides of the foot, under the foot, and around the heel area of the foot. The upper 162 can be made of one or more materials such as textiles including natural and synthetic leathers, molded polymeric components, a polymer foam, and the like that are stitched or bonded together. In other aspects not depicted, the sole structure 164 may incorporate foam, one or more fluid-filled chambers, plates, moderators, or other elements that further attenuate forces, enhance stability, or influence the motions of the foot. Although the depicted configuration for the sole structure 164 and the upper 162 provides an example of a sole structure that may be used in connection with an upper, a variety of other conventional or nonconventional configurations for the sole structure 164 and/or the upper 162 can also be utilized. Accordingly, the configuration and features of the sole structure 164 and/or the upper 162 can vary considerably.

Figure 1Q:
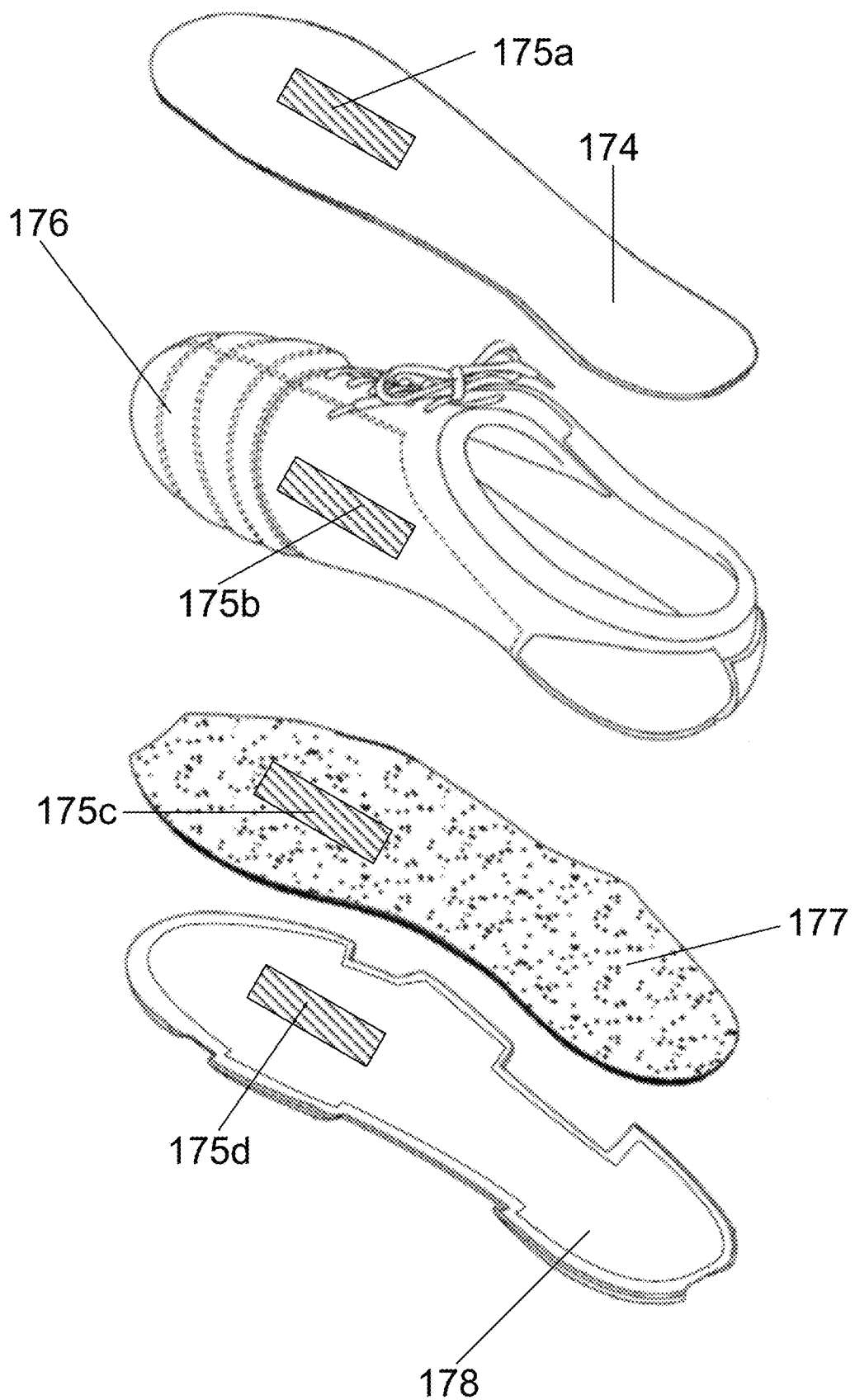
Figure 1Q:
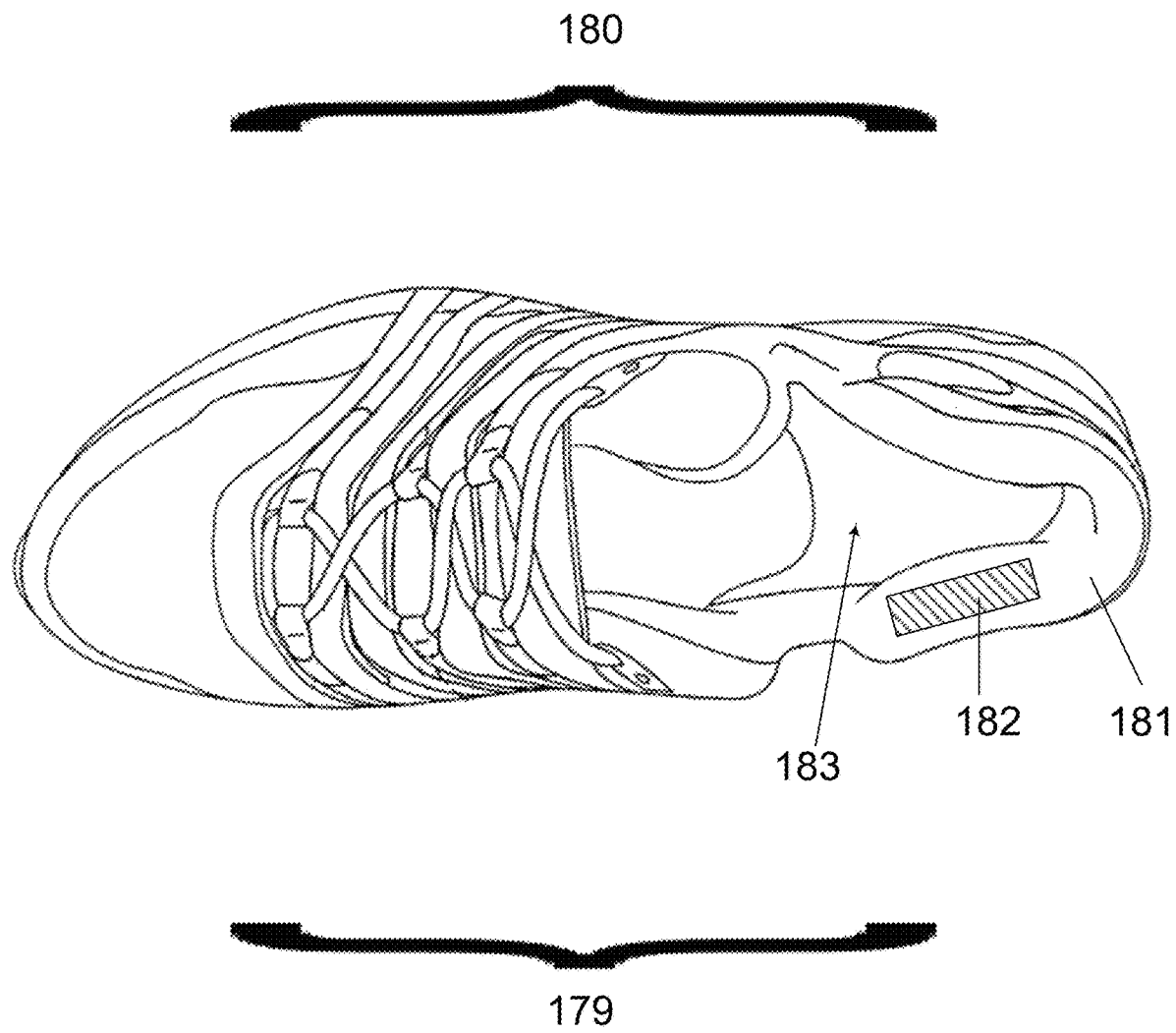
Figure 1Q:
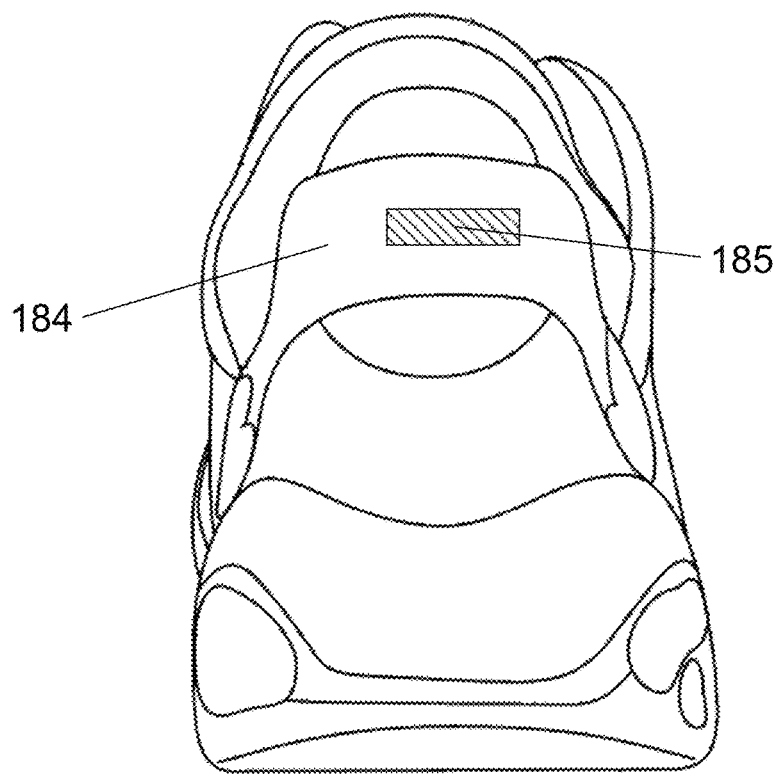
Figure 1Q:
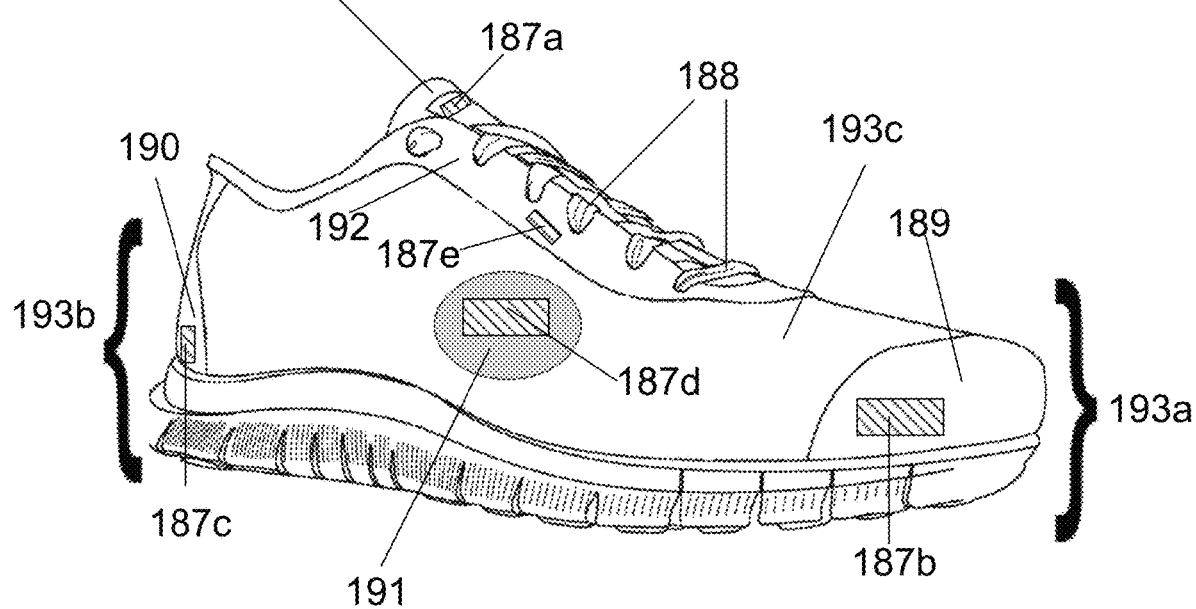
Figure 1Q:
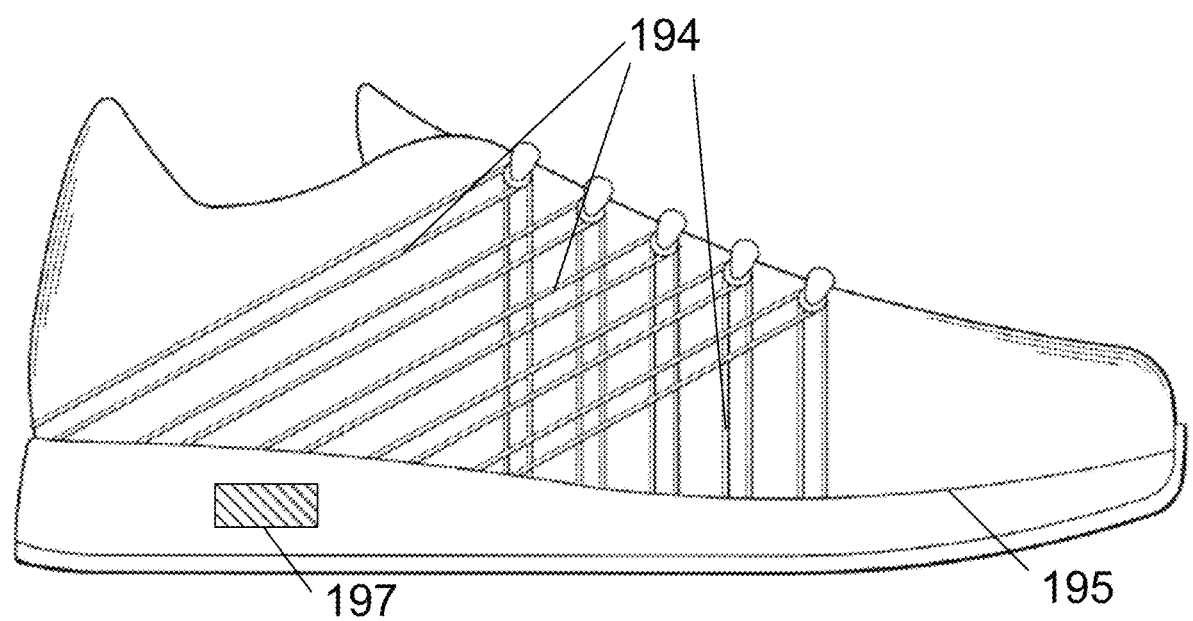

FIGS. 1Q(a)-1Q(e) illustrate additional views of exemplary articles of athletic footwear including various configurations of upper 176. FIG. 1Q(a) is an exploded perspective view of an exemplary article of athletic footwear showing insole 174, upper 176, optional midsole or optional lasting board 177, and outsole 178, which can take the form of a plate. Structures including optical elements are represented by 175a-175d. FIG. 1Q(b) is a top view of an exemplary article of athletic footwear indicating an opening 183 configured to receive a wearer's foot as well as an ankle collar 181 which may include optical element 182. The ankle collar is configured to be positioned around a wearer's ankle during wear, and optionally can include a cushioning element. Also illustrated are the lateral side 180 and medial side 179 of the exemplary article of athletic footwear. FIG. 1Q(c) is a back view of the article of footwear depicted in FIG. 1Q(b), showing an optional heel clip 184 that can include optical element 185. FIG. 1Q(d) shows a side view of an exemplary article of athletic footwear, which may optionally also include a tongue 186, laces 188, a toe cap 189, a heel counter 190, a decorative element such as a logo 191, and/or eyestays for the laces 192 as well as a toe area 193a, a heel area 193b, and a vamp 193c. In some aspects, the heel counter 190 can be covered by a layer of knitted, woven, or nonwoven fabric, natural or synthetic leather, film, or other shoe upper material. In some aspects, the eyestays 192 are formed as one continuous piece; however, they can also comprise several separate pieces or cables individually surrounding a single eyelet or a plurality of eyelets. Structures including optical elements are represented by 187a-187e. While not depicted, optical elements can be present on the eyestays 192 and/or the laces 188. In some configurations, the sole structure can include a sole structure, such as a midsole having a cushioning element in part or substantially all of the midsole, and the optical element can be disposed on an externally-facing side of the sole structure, including on an externally-facing side of the midsole. FIG. 1Q(e) is a side view of another exemplary article of athletic footwear. In certain aspects, the upper can comprise one or more containment elements 194 such as wires, cables or molded polymeric component extending from the lace structure over portions of the medial and lateral sides of the exemplary article of athletic footwear to the top of the sole structure to provide lockdown of the foot to the sole structure, where the containment element(s) can have an optical element (not shown) disposed on an externally-facing side thereof. In some configurations, a rand (not shown) can be present across part or all of the biteline 195.

Now having described embodiments of the present disclosure generally, additional details are provided. As has been described herein, the structural color can include one of a number of colors. The "color" of an article as perceived by a viewer can differ from the actual color of the article, as the color perceived by a viewer is determined by the actual color of the article (e.g., the color of the light leaving the surface of the article), by the presence of optical elements which may absorb, refract, interfere with, or otherwise alter light reflected by the article, the viewer's visual acuity, by the viewer's ability to detect the wavelengths of light reflected by the article, by the characteristics of the perceiving eye and brain, by the intensity and type of light used to illuminate the article (e.g., sunlight, incandescent light, fluorescent light, and the like), as well as other factors such as the coloration of the environment of the article. As a result, the color of an object as perceived by a viewer can differ from the actual color of the article.

Conventionally, non-structural color is imparted to man-made objects by applying colored materials such as pigments or dyes to the object. Non-structurally colored materials are made of molecules (e.g., chromophores) that absorb all but particular wavelengths of light and reflect back the unabsorbed wavelengths, or which absorb and emit particular wavelengths of light. In non-structural color, it is the unabsorbed and/or the emitted wavelengths of light which impart the color to the article. As the color-imparting property is due to molecule's chemical structure, the only way to remove or eliminate the color is to remove the molecules or alter their chemical structure.

While "structural color" is found in nature, more recently, methods of imparting "structural color" to man-made objects have been developed. Structural color is color that is produced, at least in part, by microscopically structured surfaces that interfere with visible light contacting the surface. The structural color is color caused by physical structures which produce optical phenomena including the scattering, refraction, reflection, interference, and/or diffraction of light. In some aspects, structural color can be caused by one or more of these optical phenomena in combination with absorption or emission. For example, optical phenomena which impart structural color can include multilayer interference, thin-film interference, refraction, dispersion, light scattering, including Mie scattering, and diffraction, including diffraction grating. As structural color is produced by physical structures, destroying or altering the physical structures can eliminate or alter the imparted color. The ability to eliminate color by destroying the physical structure, such as by grinding or melting an article can facilitate recycling and reuse colored materials. In various aspects described herein, the structural color imparted to a region of an external surface of an article is visible to a viewer having 20/20 visual acuity and normal color vision from a distance of about 1 meter from the article, when the structurally-colored region is illuminated by about 30 lux of sunlight, incandescent light, or fluorescent light. In some such aspects, the structurally-colored region is at least one square centimeter in size.

As described herein, structural color is produced, at least in part, by the optical element, as opposed to the color being produced solely by pigments and/or dyes. The coloration of a structurally-colored article can be due solely to structural color (i.e., the article, a colored portion of the article, or a colored outer layer of the article can be substantially free of pigments and/or dyes). In another aspect, an optical element can impart a "combined color," where a "combined color" can be described as having a structural component and a non-structural color component. For example, structural color can be used in combination with pigments and/or dyes to alter all or a portion of a structural color, forming a combined color. In a combined color, the structural color component, when viewed without the non-structural color component, imparts a structural color having a first color and the non-structural color component, when viewed without the structural color component imparts a second color, where the first color and the second color differ in at least one of a color property or characteristic such as hue, value, chroma, color space coordinate, iridescence type, etc., or differ in hue or chroma. Further in this aspect, when viewed together, the first color and the second color combine to form a third, combined color, which differs in at least one color property or characteristic, or differ in hue and chroma from either the first color or the second color, for example, through shifting the reflectance spectrum of the optical element.

In another aspect, an optical element can impart a "modified color," where a "modified color" can be described as having a structural color component and a modifier component. In a modified color, the structural color component, when viewed without the modifier component, imparts a structural color having a specific hue and/or chroma and the modifier component, when viewed without the structural color component, does not impart any color, hue, or chroma. Further in this aspect, when viewed together, the modifier component can expand, narrow, or shift the range of wavelengths of light reflected by the structural color component.

In still another aspect, an optical element can impart a "modified combined color," where a "modified combined color" can be described has having a structural color component having a first color, a non-structural color component having a second color, and a modifier component not imparting a color but instead functioning to expand, narrow, or shift the range of wavelengths of light reflected by the combined color formed from the structural color component and the non-structural color component.

In one aspect, the structural color component, combined color component, or modified color component disclosed herein is opaque; that is, it prevents light from passing through any articles to which they are applied. Further in this aspect, most wavelengths of light are absorbed by one or more layers of the structural color, combined color, or modified color component, with only a narrow band of light reflected about the wavelength of maximum reflectance.

"Hue" is commonly used to describe the property of color which is discernible based on a dominant wavelength of visible light, and is often described using terms such as magenta, orange, yellow, green, cyan, blue, indigo, violet, etc. or can be described in relation (e.g., as similar or dissimilar) to one of these. The hue of a color is generally considered to be independent of the intensity or lightness of the color. For example, in the Munsell color system, the properties of color include hue, value (lightness) and chroma (color purity). Particular hues are commonly associated with particular ranges of wavelengths in the visible spectrum: the range of about 750 to 635 nanometers is associated with red, the range of about 635 to 590 nanometers is associated with orange, the range of about 590 to 560 nanometers is associated with yellow, the range of about 560 to 520 nanometers is associated with green, the range of about 520 to 490 nanometers is associated with cyan, the range of about 490 nanometers to 450 nanometers is associated with blue, and the range of about 450 to 400 nanometers is associated with violet.

In various aspects described herein, the hue or hues of the structural color imparted to a region of an external surface of an article is visible to a viewer having 20/20 visual acuity and normal color vision from a distance of about 1 meter from the article, when the structurally-colored region is illuminated by about 30 lux of sunlight, incandescent light, or fluorescent light. Similarly, a viewer having 20/20 visual acuity and normal color vision, when viewing two structurally-colored regions under these conditions, where either both regions are on the same article, or the two regions are individually on different articles, can determine whether or not the hues imparted to the two regions are the same or different. Further, a viewer having 20/20 visual acuity and normal color vision, when viewing one structurally-colored region under these conditions but at two different viewing angles, can determine whether or not the hues imparted to the region are the same or different.

When used in the context of structural color, one can characterize the hue of a structurally-colored article, i.e., an article that has been structurally colored by incorporating an optical element into the article, based on the wavelengths of light the structurally-colored portion of the article absorbs and reflects (e.g., linearly and non-linearly). While the optical element may impart a first structural color, the presence of an optional textured surface and/or primer layer can alter the structural color. Other factors such as coatings or transparent elements may further after the perceived structural color. The hue of the structurally colored article can include any of the hues described herein as well as any other hues or combination of hues.

The structural color can be referred to as a "single-hued" or "multi-hued" or "multi-hued with full iridescence" or "multi-hued with limited iridescence".

As used herein, single-hued structural color refers to a structural color in which the hue of the structural color does not vary (e.g., does not appear to shift between hues), or does not vary substantially (e.g., varies by about 10 percent or less, or by about 5 percent or less, or by about 1 percent or less) when the angle of observation or illumination is varied between or among two or more different angles that are at least 15 degrees apart from each other (such as from 30 degrees to 45 degrees, from 45 degrees to 60 degrees, from 60 degrees to 75 degrees, and so on). In this way, the hue of a single-hued structural color can be described as being angle-independent, and a single-hued color is understood not to be iridescent or have a limited or full iridescence as described herein. A number of different color names, color systems and color wheels can be used to describe hues. The value (degree of lightness), or the chroma (the purity of the hue), or both the value and the chroma of a single-hued structural color can be angle dependent or can be angle independent. For example, the structural color can be a single-hued angle independent structural color in which the value and chroma of the single hue does not vary or does not vary substantially as the angle of observation or illumination is varied. Alternatively, the structural color can be a single-hued angle independent structural color in which the value, the chroma, or both the value and the chroma varies or varies substantially as the angle of observation or illumination is varied.

As used herein, multi-hued structural color refers to a structural color in which the hue of the structural color varies (e.g., appears to shift between hues) or varies substantially (e.g., varies by about 90 percent, about 95 percent, or about 99 percent) as the angle of observation or illumination is varied between or among two or more different angles that are at least 15 degrees apart from each other (such as from 30 degrees to 45 degrees, from 45 degrees to 60 degrees, from 60 degrees to 75 degrees, and so on). In this way, a multi-hued structural color can be described as being angle-dependent, and a multi-hued structural color is understood to be iridescent or have limited or full iridescence, as described here. For example, a multi-hued structural color can display a different hue (e.g., as the angle of observation or illumination is varied, the imparted hue changes between/among 2, 3, 4, 5, 6 or more distinct hues). Each of the individual hues exhibited by the multi-hued structural color can be a primary color such as magenta, yellow or cyan, or red, yellow or blue, or can be a secondary hue such as orange, green or purple, or can be a tertiary hue such as red-orange or orange-red. The value, chroma or both the value and chroma of an individual hue exhibited by the multi-hued structural color can be angle dependent, meaning that the value, the chroma or both the value and the chroma of the individual hue varies as the angle of observation or illumination varies. The value, chroma or both the value and the chroma of the individual hue exhibited by the multi-hued structural can be angle independent, meaning that—the value, the chroma, or both the value and chroma of the individual hue do not vary or do not vary substantially as the angle of observation or illumination is varied.

Multi-hued structural colors can be classified based on the type of iridescence they display. A multi-hued structural color can be a multi-hued structural color with full iridescence, meaning that it appears to display all or virtually all the hues of visible light in order (from shortest wavelength to longest wavelength, or from longest wavelength to shortest wavelength) as the angle of observation or illumination is varied, providing a "rainbow" effect. As used herein, multi-hued structural color with limited iridescence is understood to refer to multi-hued structural colors which vary between a limited number of individual hues (between 2 hues, 3 hues, or 4 distinct hues) as the angle of observation or illumination is varied between or among two or more different angles that are at least 15 degrees apart from each other. Thus, multi-hued structural colors with limited iridescence do not exhibit the "rainbow" effect, but instead exhibit only a few hues and is distinguishable from multi-hued structural color with full iridescence and single-hued structural color.

The individual hues of the multiple hues exhibited by multi-hued structural colors with limited iridescence can be adjacent to each other on the color wheel (e.g., the multiple hues can include, and vary between, blue and blue-purple, or among blue-green, blue, and blue-purple). Alternatively, the individual hues of the multiple hues exhibited by a multi-hued structural color with limited iridescence may include hues which are not directly adjacent to each other on the color wheel, such that some hues directly adjacent to the imparted hues on the color wheel are omitted or "skipped over" (e.g., the multiple imparted hues can include, and vary between, orange-red and yellow-green, or the multiple imparted hues can include orange-red, orange, and yellow-green). In a multi-hued structural color with limited iridescence, each individual hue of the limited number of multiple hues may only be observed at a few angles (e.g., about 10 to 90 degrees or about 10 to 120 degrees or about 10 to 60 degrees) of observation or illumination. For example, a first hue (e.g., blue) can be exhibited at a majority (e.g., about 1 to 300 degrees or about 1 to 200 degrees) of angles of observation or illumination within a 360 degree radius, while a second hue (e.g., blue-purple) or the second hue and/or a third hue (e.g., blue-green) can be exhibited at a minority (e.g., about 10 to 90 degrees or about 10 to 120 degrees or about 10 to 60 degrees) of angles of observation or illumination within the 360 degree radius. In another example where the degree radius is less than 360 degrees, a first hue (e.g., blue) can be exhibited at a majority (e.g., about 50 to 90 percent of the degrees (e.g., about 90 to 162 degrees when the degree radius is 180) or about 50 to 80 percent or about 50 to 70 percent or about 60 to 90 percent or about 70 to 90 percent of the degrees) of angles of observation or illumination within a specific degree radius, while a second hue (e.g., blue-purple) or the second hue and/or a third hue (e.g., blue-green) can be exhibited at a minority (e.g., about 1 to 49 percent of the degrees or about 10 to 35 percent or about 10 to 25 percent of the degrees) of angles of observation or illumination within the specific degree radius.

When the multiple hues imparted by a multi-hued structural colors with limited iridescence includes one or more hues which are not directly adjacent to each other on the color wheel, the structural color can shift abruptly (e.g., changes quickly with a small (e.g., less than 15 degrees, less than 10 degrees, less than 5 degrees) change in the observation angle) from the first hue to the second hue as the angle of observation or illumination is varied, since the hues located on the color wheel between the imparted hues are omitted or "skipped over" and not imparted. For example, for a multi-hued structural color with limited iridescence which exhibits the hues of orange-red and yellow-green, when the angle of observation or illumination is varied within a 360 radius (or other specific radius, for example 180 degrees), a plurality of intermediate hues between orange-red and yellow-green, such as orange, yellow-orange, and yellow, as well as hues on either side of orange-red and yellow-green, such as red, red-orange, etc. (hues representing colors of light having shorter wavelengths than orange-red) and green, green-yellow, green, blue, etc. (hues representing colors of light having longer wavelengths than yellow-green) are not imparted.

In an aspect, when the multiple hues imparted by a multi-hued structural colors with limited iridescence includes one or more hues which are directly adjacent to each other on the color wheel (e.g., hues which are analogous) or which are not directly adjacent to each other (e.g., complementary or split complementary hues, hues exhibiting a triadic or tetradic harmony, etc.) on the color wheel, the structural color can shift abruptly (e.g., changes quickly with a small (e.g., less than 15 degrees, less than 10 degrees, less than 5 degrees) change in the observation angle) from the first hue to the second hue as the angle of observation or illumination is varied. In another aspect, when the multiple hues imparted by a multi-hued structural colors with limited iridescence includes one or more hues which are directly adjacent to each other on the color wheel or which are not directly adjacent to each other on the color wheel, the structural color can shift gradually (e.g., changes over a long (e.g., great than 15 degrees, greater than 20 degrees, greater than 30 degrees) change in the observation angle) from the first hue to the second hue as the angle of observation or illumination is varied.

Similarly, other properties of the structural color, such as the lightness of the color, the saturation of the color, and the purity of the color, among others, can be substantially the same regardless of the angle of observation or illumination, or can vary depending upon the angle of observation or illumination. The structural color can have a matte appearance, a glossy appearance, or a metallic appearance, or a combination thereof.

As discussed above, the color (including hue) of a structurally-colored article (e.g., an article including an structural color) can vary depending upon the angle at which the structurally-colored article is observed or illuminated. The hue or hues of an article can be determined by observing the article, or illuminating the article, at a variety of angles using constant lighting conditions. As used herein, the "angle" of illumination or viewing is the angle measured from an axis or plane that is orthogonal to the surface. The viewing or illuminating angles can be set between about 0 and 180 degrees. The viewing or illuminating angles can be set at 0 degrees, 15 degrees, 30 degrees, 45 degrees, 60 degrees, and −15 degrees and the color can be measured using a colorimeter or spectrophotometer (e.g., manufactured by Konica, Minolta, etc.), which focuses on a particular area of the article to measure the color. The viewing or illuminating angles can be set at 0 degrees, 15 degrees, 30 degrees, 45 degrees, 60 degrees, 75 degrees, 90 degrees, 105 degrees, 120 degrees, 135 degrees, 150 degrees, 165 degrees, 180 degrees, 195 degrees, 210 degrees, 225 degrees, 240 degrees, 255 degrees, 270 degrees, 285 degrees, 300 degrees, 315 degrees, 330 degrees, and 345 degrees and the color can be measured using a colorimeter or spectrophotometer. In a particular example of a multi-hued article colored using only structural color can exhibit multi-hued structural color with limited iridescence, when measured at 0 degrees, 15 degrees, 30 degrees, 45 degrees, 60 degrees, and −15 degrees, the hues measured for the article consisted of "blue" at three of the measurement angles, "blue-green" at 2 of the measurement angles and "purple" at one of the measurement angles.

Various methodologies exist for defining color coordinate systems and for assigning color space coordinates to a color. One example is L*a*b* color space, where, for a given illumination condition, L* is a value for lightness, and a* and b* are values for color-opponent dimensions based on the CIE coordinates (CIE 1976 color space or CIELAB). In an embodiment, a structurally-colored article having structural color can be considered as having a "single" color when the change in color measured for the article is within about 10% or within about 5% of the total scale of the a* or b* coordinate of the L*a*b* scale (CIE 1976 color space) at three or more measured observation or illumination angles selected from measured at observation or illumination angles of 0 degrees, 15 degrees, 30 degrees, 45 degrees, 60 degrees, and −15 degrees.

A difference between two color measurements can be described mathematically in the CIELAB space based on the differences between the color coordinates of the two colors. For example, a first measurement has coordinates $L_1^*$, $a_1^*$ and $b_1^*$, and a second measurement has coordinates $L_2^*$, $a_2^*$ and $b_2^*$. The total difference between these two measurements on the CIELAB scale can be expressed as $\Delta E^*_{ab}$, which is calculated as follows: $\Delta E^*_{ab} = [(L_1^* - L_2^*)^2 + (a_1^* - a_2^*)^2 + (b_1^* - b_2^*)^2]^{1/2}$. Generally speaking, if two colors have a $\Delta E^*_{ab}$ of less than or equal to 1, the difference in color is not perceptible to human eyes, and if two colors have a $\Delta E^*_{ab}$ of greater than 100 the colors are considered to be opposite colors, while a $\Delta E^*_{ab}$ of about 2-3, or of 3 or more, is considered the threshold for perceivable color difference by most humans.

In an aspect, a first structural color (e.g., imparted to a first section or article) and a second structural color (e.g., imparted to a second section or article) can be considered different structural colors if they have a $\Delta E^*_{ab}$ of greater than 2.2, greater than 3, greater than 4, greater than 5, or greater than 10. In another aspect, a first structural color (e.g., imparted to a first section) and a second structural color (e.g., imparted to a second section) can be considered the same structural color if they have a $\Delta E^*_{ab}$ of less about 3 or less than 2.2.

In another aspect, a first section can be considered as having a "single" color when the $\Delta E^*_{ab}$ is less than 3, or less than 2.2, between pairs of measurements across three or more measured observation or illumination angles selected from measured at observation or illumination angles of 0 degrees, 15 degrees, 30 degrees, 45 degrees, 60 degrees, and −15 degrees. In yet another aspect, a first section can be can be considered to be multi-hued when the $\Delta E^*_{ab}$ between at least one pair of measurements is greater than 2.2, greater than 3, greater than 4, greater than 5, or greater than 10, where the measurements are taken at each of three or more observation or illumination angles chosen from 0 degrees, 15 degrees, 30 degrees, 45 degrees, 60 degrees, and −15 degrees. In an aspect, the first section can be multi-hued by imparting 2 different structural colors, multi-hued by imparting 3 different structural colors, or multi-hued by imparting 4 different structural colors, each at different angles of observation or illumination (e.g., about 15 degrees or more apart).

In the CIELAB space, the threshold of perceptible color difference based on the $\Delta E^*_{ab}$ calculation is about 2-3 and the perception of color by a viewer is dependent upon the physiology of the viewer, the viewing conditions, and the like, an individual viewer observing the first structural color and the second structural color may not be able to detect that the two structural colors are different, while the two structural colors may be considered to be different based on the $\Delta E^*_{ab}$ calculation, or based on a difference between their a* coordinates, their b* coordinates, or their a* and b* coordinates.

Similarly, the structural color at two different angles can be considered as corresponding substantially to one another by measuring according to the CIE 1976 color space, under a given illumination condition. The illumination condition can be at a single observation angle of about −15 to 180 degrees or about −15 and 60 degrees perpendicular the horizontal plane of the optical element (e.g., the plane parallel the layers of the optical element). A first color measurement at a first angle of observation having coordinates $L_1^*$ and $a_1^*$ and $b_1^*$ over the wavelength range of 380 to 625 nanometers can be obtained. In addition, a second color measurement at the first angle of observation having coordinates $L_2^*$ and $a_2^*$ and $b_2^*$ over the first wavelength value can be obtained. The structural color can be compared in different ways. In one approach described above, $\Delta E^*_{ab} = [(L_1^* - L_2^*)^2 + (a_1^* - a_2^*)^2 + (b_1^* - b_2^*)^2]^{1/2}$, can be used to compare the first color measurement and the second color measurement. The first structural color and the second structural color can be considered the same or substantially indistinguishable when the $\Delta E^*_{ab}$ between the first color measurement and the second color measurement can be less than or equal to about 3, or optionally the $\Delta E^*_{ab}$ can be between the first color measurement and the second color measurement is less than or equal to about 2.2. If $\Delta E^*_{ab}$ is greater than 3, then the first structural color and the second structural color are different.

In another aspect, the minimum percent of reflectance of the wavelength range, the at least one peak, or set of peaks is independent of the angle of incident light upon the optical element. The structural color is independent upon observation angle. Alternatively, the minimum percent of reflectance of the wavelength range, the at least one peak, or set of peaks is dependent of the angle of incident light upon the optical element. The structural color is dependent upon observation angle.

The observation angle independence or dependence of a structural color can be determined. At a first observation angle the structural color is a first structural color and at a second observation angle the structural color is a second structural color. The first structural color and the second structural color can be the same or different. The similarity or difference in the first structural color and the second structural color at their respective angles of observation can be determined according to the CIE 1976 color space under a given illumination condition at two observation angles of about −15 to 180 degrees or about −15 degrees and +60 degrees and which are at least 15 degrees apart from each other. A first color measurement at the first observation angle having coordinates $L_1^*$ and $a_1^*$ and $b_1^*$ can be obtained. A second color measurement at the second observation angle having coordinates $L_2^*$ and $a_2^*$ and $b_2^*$ can be obtained. $\Delta E^*_{ab}$, as described above and herein, $\Delta E^*_{ab} = [(L_1^* - L_2^*)^2 + (a_1^* - a_2^*)^2 + (b_1^* - b_2^*)^2]^{1/2}$, can be used to correlate the first structural color and the second structural color at their angles of observation. When the $\Delta E^*_{ab}$ between the first color measurement and the second color measurement is less than or equal to about 2.2, or optionally the $\Delta E^*_{ab}$ between the first color measurement and the second color measurement is less than or equal to about 3, then the first structural color and the second structural color are the same or indistinguishable to the average observer. The first structural color and the second structural color are considered distinguishable or different when the $\Delta E^*_{ab}$ between the first color measurement and the second color measurement is greater than 3, or optionally wherein the $\Delta E^*_{ab}$ between the first color measurement and the second color measurement is greater than or equal to about 4 or 5, or 10.

Another example of a color scale is the CIELCH color space, where, for a given illumination condition, L* is a value for lightness, C* is a value for chroma, and h° denotes a hue as an angular measurement. In an aspect, a first structural color (e.g., imparted to a first section (e.g., region) or article using an optical element) and a second structural color (e.g., imparted to a second section or article using an optical element) can be considered to have the same color or hue when the hue measured for the first section is less than 10 degrees different or less than 5 degrees different than the hue measured for the second section at the h° angular coordinate of the CIELCH color space, at three or more measured observation or illumination angles selected from measured at observation or illumination angles of 0 degrees, 15 degrees, 30 degrees, 45 degrees, 60 degrees, and −15 degrees. In a further aspect, a first structural color (e.g., imparted to a first section or article) and a second structural color (e.g., imparted to a second section or article) can be considered to have different colors or hues when the hue measured for the first section is at least 25 or is at least 45 degrees different than the hue measured for the second section at the h° angular coordinate of the CIELCH color space, at three or more measured observation or illumination angles selected from measured at observation or illumination angles of 0 degrees, 15 degrees, 30 degrees, 45 degrees, 60 degrees, and −15 degrees. In another aspect, an optical element can be said to be single-hued when all areas of the optical element have the same color in the CIELCH color space as defined herein, or can be multi-hued or multi-colored when at least two areas of the optical element have different colors in the CIELCH color space.

Another system for characterizing color includes the "PANTONE" Matching System (Pantone LLC, Carlstadt, New Jersey, USA), which provides a visual color standard system to provide an accurate method for selecting, specifying, broadcasting, and matching colors through any medium. In an example, a first optical element and a second optical element can be said to have the same color when the color measured for each optical element is within a certain number of adjacent standards, e.g., within 20 adjacent PANTONE standards, at three or more measured observation or illumination angles selected from 0 degrees, 15 degrees, 30 degrees, 45 degrees, 60 degrees, and 75 degrees. In an alternative aspect, the first optical element and the second optical element can be said to have different colors when the color measured for each optical element is outside a certain number of adjacent standards, e.g., at least 20 adjacent PANTONE standards or farther apart, at three or more measured observation or illumination angles selected from 0 degrees, 15 degrees, 30 degrees, 45 degrees, 60 degrees, and 75 degrees. In another aspect, an optical element can be said to be single-hued when all areas of the optical element have the same PANTONE color as defined herein, or can be multi-hued or multi-colored when at least two areas of the optical element have different PANTONE colors.

Another example of a color scale is the Natural Color System® or NCS, which is built on principles of human physiological vision and describes color by using color similarity relationships. The NCS is based on the premise that the human visual system consists of six elementary color precepts, or colors that can be challenging to define perceptually in terms of other colors. These colors consist of three pairs: (i) the achromatic colors of black (S) and white (W), (ii) the opposing primary color pair of red (R) and green (G), and (iii) the opposing primary color pair of yellow (Y) and blue (B). In the NCS, any color that can be perceived by the human eye can be similar to the two achromatic colors and a maximum of two non-opposing primary colors. Thus, for example, a perceived color can have similarities to red and blue but not to red and green. NCS descriptions of colors are useful for colors that belong to the surfaces of materials, so long as the surfaces are not fluorescent, translucent, luminescent, or the like; the NCS does not encompass other visual properties of the surface such as, for example, gloss and texture.

The NCS color space is a three dimensional model consisting of a flat circle at which the four primary colors are positioned in order at 0 degrees, 90 degrees, 180 degrees, and 270 degrees. For example, if yellow is at 0 degrees, red is at 90 degrees, blue is at 180 degrees, and green is at 270 degrees. White is represented above the circle and black below such that a hue triangle forms between the black/white (grayscale) axis and any point on the circle.

Percentage "blackness" (s) is defined in the NCS as a color's similarity to the elementary color black. Percentage "chromaticness" (c) represents similarity to the most saturated color in a hue triangle. "Hue" (φ) in the NCS, meanwhile, represents similarity of a color to one or at most two non-opposing primary colors. Blackness and chromaticness add up to a value less than or equal to 100 percent; any remaining value is referred to as "whiteness" (w) of a color. In some cases, the NCS can be used to further describe "saturation" (m), a value from 0 to 1 determined in terms of chromaticness and whiteness (e.g., m=c/(w+c)). NCS can further be used to describe "lightness" (v), a description of whether the color contains more of the achromatic elementary colors black or white. A pure black article would have a lightness of 0 and a pure white article would have a lightness of 1. Purely neutral grays (c=0) have lightness defined by v=(100−s)/100, while chromatic colors are first compared to a reference scale of grays and lightness is then calculated as for grays.

NCS notation takes the generic form sc-A$\phi$B, where sc defines "nuance," ss is the percent blackness and cc refers to the chromaticity; A and B are the two primary colors to which the color relates; and $\phi$ is a measure of where a color falls between A and B. Thus, a color (e.g., orange) that has equal amounts of yellow and red could be represented such that A$\phi$B=Y50R (e.g., yellow with 50 percent red), whereas a color having relatively more red than yellow is represented such that A$\phi$B=Y60R, Y70R, Y80R, Y90R, or the like. The color having equal amounts of yellow and red with a relatively low (10 percent) amount of darkness and a medium (50 percent) level of chromaticity would thus be represented as 1050-Y50R. In this system, neutral colors having no primary color components are represented by sc-N, where sc is defined in the same manner as with a non-neutral color and N indicates neutrality, while a pure color would have a notation such as, for example, 3050-B (for a blue with 30 percent darkness and 50 percent chromaticity). A capital "S" in front of the notation indicates that a value was present in the NCS 1950 Standard, a reduced set of samples. As of 2004, the NCS system contains 1950 standard colors.

The NCS is more fully described in ASTM E2970-15, "Standard Practice for Specifying Color by the Natural Colour System (NCS)." Although the NCS is based on human perception and other color scales such as the CIELAB or CIELCH spaces may be based on physical properties of objects, NCS and CIE tristimulus values are interconvertible.

In an example, a first color imparted by a region A and the middle region can be considered as being the same color when the colors measured for each optical element are within a certain number of adjacent standards, e.g., within 20 adjacent NCS values, at three or more measured observation or illumination angles selected from 0 degrees, 15 degrees, 30 degrees, 45 degrees, 60 degrees, and −15 degrees. In another example, two colors can be considered as being different colors when the measurements of the two colors are outside a certain number of adjacent standards, e.g., farther apart than at least 20 adjacent NCS values, at three or more measured observation or illumination angles selected from 0 degrees, 15 degrees, 30 degrees, 45 degrees, 60 degrees, and −15 degrees. In another aspect, two colors can be considered to be the same when both colors have the same NCS color as defined herein, or can be considered to be different when they have different NCS colors. In a still further aspect, a color can be said to be fully iridescent if it exhibits at least five different NCS colors as defined herein at different measured observation or illumination angles.

A change or difference in color between two measurements and/or two colors (e.g., structural color imparted by the first region A and the second region A or imparted by the first region B and the second region B) in the CIELAB space can be determined mathematically. For example, a first measurement (e.g., from the first region A) has coordinates $L_1^*$, $a_1^*$ and $b_1^*$, and a second measurement (e.g., from the second region A) has coordinates $L_2^*$, $a_2^*$ and $b_2$. The total difference between these two measurements on the CIELAB scale can be expressed as $\Delta E^*_{ab}$, which is calculated as follows: $\Delta E^*_{ab}=[(L_1^*-L_2^*)^2+(a_1^*-a_2^*)^2+(b_1^*-b_2^*)^2]^{1/2}$.

Generally speaking, if two colors (e.g., the structural color imparted by the first region A and the second region A) have a $\Delta E^*_{ab}$ of less than or equal to 1, the difference in color is not perceptible to human eyes, and if two colors (e.g., structural color from the first region A and the first region B) have a $\Delta E^*_{ab}$ of greater than 100 the colors are considered to be opposite colors, while a $\Delta E^*_{ab}$ of about 2-3, or 3 or more is considered the threshold for perceivable color difference. In certain embodiments, a structural color (e.g., first, second, and/or third structural color) or can be considered as having a "single" color when the $\Delta E^*_{ab}$ is less than 2, or less than 3, between three or more measured observation or illumination angles selected from measured at observation or illumination angles of 0 degrees, 15 degrees, 30 degrees, 45 degrees, 60 degrees, and −15 degrees.

In regard to a potential difference between structural colors, the optical element can have a first structural color and a second structural color (or third structural color). The first structural color and the second structural color can be different. The difference can be determined in the CIELAB space mathematically. For example, a first measurement (e.g., obtained from the first region A of the optical element) has coordinates $L_1^*$, $a_1^*$ and $b_1^*$, and a second measurement (e.g., obtained from the first region B (a different structural color) of the optical element or the second region A (the same structural color)) has coordinates $L_2^*$, $a_2^*$ and $b_2^*$. The total difference between these two measurements on the CIELAB scale can be expressed as $\Delta E^*_{ab}$, which is calculated as follows: $\Delta E^*_{ab}=[(L_1^*-L_2^*)^2+(a_1^*-a_2^*)^2+(b_1^*-b_2^*)^2]^{1/2}$. Generally speaking, if two structural colors have a $\Delta E^*_{ab}$ of less than or equal to 1, the difference in color is not perceptible to human eyes, and if two structural colors have a $\Delta E^*_{ab}$ of greater than 100 the colors are considered to be opposite colors, while a $\Delta E^*_{ab}$ of about 2-3 or greater than 3 is considered the threshold for perceivable color difference and can depend upon the person perceiving the structural colors, the illumination considerations, and the like. The first structural color (e.g., from the first region A or second region B) and the second structural color (e.g., from the first or second region B) can be different in that they can have a $\Delta E^*_{ab}$ of greater than about 2.2, greater than about 3, greater than about 4, greater than about 5, or greater than about 10 or more. The structural color from the first region A and the second region A or the first region B and the second region B can be the same or substantially the same in that they can have a $\Delta E^*_{ab}$ of less than about 3 or less than about 3 or less than about 2. Since the threshold of perceivable color difference is about 2-3 and the perception is depended upon the person perceiving, the conditions, and the like, the first structural color and the second structural color may be subjectively the same or different depending upon the circumstance.

The method of making the structurally colored article can include disposing (e.g., affixing, attaching, bonding, fastening, joining, appending, connecting, binding) the optical element onto an article (e.g., an article of footwear, an article of apparel, an article of sporting equipment, etc.) in an "in-line" or "on its side" configuration. The article includes a component, and the component has a surface upon which the optical element can be disposed. The surface of the article can be made of a material such as a thermoplastic material or thermoset material, as described herein. For example, the article has a surface including a thermoplastic material (i.e., a first thermoplastic material), for example an externally-facing surface of the component or an internally-facing surface of the component (e.g., an externally-facing surface or an internally-facing surface a bladder). The optical element can be disposed onto the thermoplastic material, for example. The surface upon which the optical element is disposed is not opaque and is semi-transparent or transparent to light in from 380 to 740 nanometers, for example, the surface can have a minimum percent transmittance of about 30 percent or more, about 40 percent or more, or about 50 percent or more, for light in the visible spectrum.

In an aspect, the temperature of at least a portion of the first surface of the article including the thermoplastic material is increased to a temperature at or above creep relaxation temperature (Tcr), Vicat softening temperature (Tvs), heat deflection temperature (Thd), and/or melting temperature (Tm) of the thermoplastic material, for example to soften or melt the thermoplastic material. The temperature can be increased to a temperature at or above the creep relaxation temperature. The temperature can be increased to a temperature at or above the Vicat softening temperature. The temperature can be increased to a temperature at or above the heat deflection temperature. The temperature can be increased to a temperature at or above the melting temperature. While the temperature of the at least a portion of the first side of the article is at or above the increased temperature (e.g., at or above the creep relaxation temperature, the heat deflection temperature, the Vicat softening temperature, or the melting temperature of the thermoplastic material), the optical element is affixed to the thermoplastic material within the at least a portion of the first side of the article. Following the affixing, the temperature of the thermoplastic material is decreased to a temperature below its creep relaxation temperature to at least partially re-solidify the thermoplastic material. The thermoplastic material can be actively cooled (e.g., removing the source that increases the temperature and actively (e.g., flowing cooler gas adjacent the article reducing the temperature of the thermoplastic material) or passively cooled (e.g., removing the source that increases the temperature and allowing the thermoplastic layer to cool on its own).

Now having described color and other aspects generally, additional details regarding the optical element are provided. As described herein, the article includes the optical element. FIG. 3 illustrates a cross-sectional view (upper) and top view (lower) of an article 400 having the optical element 410 disposed thereon. The top view (lower illustration) shows areas of different structural colors (e.g., first structural color 490R, second structural color 492G, and third structural color 494B) as denoted by "R", "G", and "B" for the article 400. The sections denoted as "R", "G", and "W" correspond to the regions in the cross-section shown in the upper portion of FIG. 3. Sections "R", "G", and "B" correspond to the structural color Imparted by the first region A 412 and the second region A 452, the first region B 414 and the second region B 454, and the middle region 440, respectively, of the optical element 410, where the top view of the structural colors line-up with the different areas of the article in the cross-sectional view directly above. While a structural color is imparted by the middle region 440 in this embodiment, in other embodiments the middle region may not impart structural color and may be a non-structural color.

The second structural color 492G may be a blend of different structural colors, the second structural color may be a transitional zone of colors, or the second structural color may be independently discernible structural colors. So while reference is made to the "second structural color", it may be more complex than a single structural color. The first region B 414 and the second region B 454 can be designed to impart the desired structural color.

Each region 412, 414, 452, and 454 in FIG. 3 includes 4 layers. Each layer independently can have a thickness that is independent of the other layers. Each layer independently can be made of a material that is independent of the other layers. The combination of the thickness and materials of the layers, at least in part, imparts the first structural color 490R (e.g., the first region A 412 and the second region A 452), the second structural color 492G (e.g., the first region B 414 and the second region B 454), and the third structural color 494B (e.g., the middle region 440).

The first region A 412 and the second region A 452 have corresponding layers in that the number of layers is the same, the material of the corresponding layers consist essentially of the same material (e.g., they are the same material, less contaminants which are less that about 1 percent, less that about 2 percent, less that about 3 percent or less that about 5 percent) or are the same material (e.g., about 98 percent or more or about 99 percent or more), and the average thickness of the corresponding layers is the same or substantially the same (e.g., about 85 to 99 percent or about 90 to 99 percent or about 95 to 99 percent identical). The first region A 412 and the second region A 452 have a stacked structure, where each corresponding layer has the same or similar average thickness. Vertically adjacent layers can have the same or different thicknesses. The length of the first region A 412 and the second region A 452 can be in the micrometer to millimeter range to centimeter range or more depending upon the design desired. The overall dimensions of the optical element 410 can be on the micrometer to centimeter range (e.g., about 1 micrometer to 500 centimeters or about 1 micrometer to about 100 centimeters).

In regard to the structure of the first region B 414, each layer of the first region B 414 tapers from a first edge 416 of the first region A 412 to a first point 418 of the first region B 414 so that the thickness of each layer at the first edge 416 of the first region A 412 is greater than the thickness at the first point 418 in the first region B 414. The first point 418 is the thinnest thickness of each layer in the first region B 414. Similarly, each layer of the second region B 454 tapers from a second edge 456 of the second region A 452 to a second point 458 of the second region B 454 so that the thickness of each layer at the second edge 458 of the second region A 452 is greater than the thickness at the second point 458 in the second region B 454. The second point 458 is the thinnest thickness of each layer in the second region B 454. The angle from the first edge 416 or second edge 456 to the first point 418 or the second point 458, respectively, can vary in different embodiments and can be steep or gradual. The first point 428 and the second point 458 terminate at the middle region 440. The middle region 440 is from the first point 418 to the second point 458. The length of the first region B 414 and the second region B 454 can be in the nanometer to micrometer to micrometer to millimeter range or more depending upon the design desired. In general, the length of the first region B 414 and the second region B 458 can be about 100 nanometers to 500 millimeters, about 1 micrometer to 100 millimeters, about 1 micrometer to about 100 millimeters.

In regard to the middle region 440, the middle region 440 is a stack structure similar to the first region A 412 and the second region A 452, where the main difference is the thickness of the corresponding layers. In general, the length of the middle region 440 can be in the nanometer to micrometer to micrometer to millimeter range or more depending upon the design desired. In general, the length of the middle region 440 can be about 100 nanometers to 5000 millimeters, about 1 micrometer to 1000 millimeters, about 1 micrometer to about 1000 millimeters.

At least one layer of the first region A 412 has a layer first region A average thickness and at least one layer of the first region B 414 has a layer first region B average thickness. The layer first region B average thickness is about 5 to 90% of the thickness of the layer first region A average thickness. Similarly, at least one layer of the second region A 452 has a layer second A region average thickness and at least one layer of the second region B 454 has a layer second B region average thickness. The layer second region B average thickness is about 5 to 90% of the thickness of the layer second region A average thickness. Also, at least one layer of the middle region 440 has a layer middle region average thickness. The layer middle region average thickness is about 5 to 90% of the thickness of the layer first region A average thickness.

FIG. 4 illustrates a cross-sectional view (upper) and top view (lower) of an article 500 having the optical element 510 disposed thereon. The top view (lower illustration) shows areas of different structural colors (e.g., the first structural color 590R, the second structural color (B-D) 592B-D, and third structural color (A) 594A) as denoted by "R", "B-D", and "A" for the article. The sections denoted as "R", "B-D", and "A" correspond to the sections in the cross-section shown in the upper portion of FIG. 4. Sections "R", "B-D", and "A" correspond to the structural color imparted by the first region A 512 and the second region A 552, the first region B 514 and the second region B 554, and the middle region 540, respectively, of the optical element 510, where the top view of the structural colors line-up with the different areas of the article 500 in the cross-sectional view directly above.

The second structural color 592B-D is represented by B-D to illustrate the different areas of the first region B 514 and the second region B 554. The second structural color 592B-D may be a blend of different structural colors imparted by B-D, the second structural color may be a transitional zone of colors imparted by B-D, or the second structural color may be independently discernible structural colors B-D (e.g., so while this is referred to as the "second structural color", it may be more complex than a single structural color). The first region B 514 and the second region B 554 can be designed to impart the desired structural color.

Each region 512, 514, 552, 554 in FIG. 4 includes 4 layers. Each layer independently can have a thickness that is independent of the other layers. Each layer independently can be made of a material that is independent of the other layers. The combination of the thickness and materials of the layers, at least in part, imparts the first structural color 590R (e.g., the first region A 512 and the second region A 514), the second structural color 592B-D (e.g., the first region B 514 and the second region B 554), and the third structural color 594A (e.g., the middle region 540).

The first region A 512 and the second region A 554 have corresponding layers in that the number of layers is the same, the material of the corresponding layers consist essentially of the same material (e.g., they are the same material, less contaminants which are less that about 1 percent, less that about 2 percent, less that about 3 percent or less that about 5 percent) or are the same material (e.g., about 98 percent or more or about 99 percent or more), and the average thickness of the corresponding layers is the same or substantially the same (e.g., about 85 to 99 percent or about 90 to 99 percent or about 95 to 99 percent identical). The first region A 512 and the second region A 554 have a stacked structure, where each corresponding layer has the same or similar average thickness. Vertically adjacent layers can have the same or different thicknesses. The length of the first region A 512 and the second region A 552 can be in the micrometer to millimeter range to centimeter range or more depending upon the design desired. The overall dimensions of the optical element can be on the micrometer to centimeter range (e.g., about 1 micrometer to 500 centimeters or about 1 micrometer to about 100 centimeters).

The first region B 514 has a first region B cross section 534 that is a stair-step cross section. Similarly, the second region B 514 has a second region B cross section 584 that is a stair-step cross section. In general, at least one of the layers of the first region B 514 tapers in a stair-step manner from the first edge 516 of the first region A 512 to the first point 518 of the first region B 514. At least one of the layers of the first region B 514 does not taper from a third point 522 to a fifth point 524 so that the average thickness from the third point 522 to the fifth point 524 of the first region B 514 is substantially (e.g., about 90 percent, about 95 percent, or about 99 percent or more) the same. From the fifth point 524 of the first region B 514 to the first point 516 of the first region B 514 the layer tapers in thickness. In this way, the first region B 514 has a stair-step cross-section. Similarly, at least one of the layers of the second region B 554 tapers in a stair-step manner from the second edge 556 of the second region A 552 to the second point 558 of the second region B 554. At least one of the layers of the second region B 554 does not taper from a fourth point 562 to a sixth point 564 so that the average thickness from the fourth point 562 to the sixth point 564 of the second region B 554 is substantially (e.g., about 90 percent, about 95 percent, or about 99 percent or more) the same. From the sixth point 564 of the second region B 554 to the second point 558 of the second region B 554 the layer tapers in thickness.

As illustrated in FIG. 4 each the layers of the first region B 514 does not taper from a third point 522 to a fifth point 524 so that the average thickness of each individual layer, independently from one another, from the third point 522 to the fifth point 524 of the first region B 514 is substantially (e.g., about 90 percent, about 95 percent, or about 99 percent or more) the same. From the fifth point 524 of each layer of the first region B 514 to the first point 518 of each layer of the first region B 514 each layer tapers in thickness. Similarly, each of the layers of the second region B 554 does not taper from a fourth point 562 to a sixth point 564 so that the average thickness of each individual layer, independently from one another, from the fourth point 562 to the sixth point 564 of the first region B 554 is substantially (e.g., about 90 percent, about 95 percent, or about 99 percent or more) the same. From the sixth point 564 of each layer of the second region B 554 to the second point 558 of each layer of the second region B 554 each layer tapers in thickness.

In regard to the middle region 540, the middle region 540 is a stack structure similar to the first region A 512 and the second region A 552, where the main difference is the thickness of the layers. In general, the length of the middle region 540 can be in the nanometer to micrometer to micrometer to millimeter range or more depending upon the design desired. In general, the length of the middle region can be about 100 nanometers to 5000 millimeters, about 1 micrometer to 1000 millimeters, about 1 micrometer to about 1000 millimeters.

At least one layer of the first region A 512 has a layer first region A average thickness and at least one layer of the first region B 514 has a layer first region B average thickness. The layer first region B average thickness is about 5 to 90% of the thickness of the layer first region A average thickness. Similarly, at least one layer of the second region A 552 has a layer second A region average thickness and at least one layer of the second region B 554 has a layer second B region average thickness. The layer second region B average thickness is about 5 to 90% of the thickness of the layer second region A average thickness. Also, at least one layer of the middle region 540 has a layer middle region average thickness. The layer middle region average thickness is about 5 to 90% of the thickness of the layer first region A average thickness.

FIG. 5 illustrates a cross-sectional view (upper) and top view (lower) of an article 600 having the optical element 610 disposed thereon. The top view (lower illustration) shows areas of different structural colors (e.g., first structural color (R) 690R, second structural color (G) 692G, and third structural color (A-B) 694A-B) as denoted by "R", "G", and "A-B" for the article. The sections denoted as "R", "G", and "A-B" correspond to the sections in the cross-section shown in the upper portion of FIG. 5. Sections "R", "G", and "A-B" correspond to the structural color imparted by the first region A 612 and the second region A 652, the first region B 614 and the second region B 654, and the middle region 640, respectively, of the optical element 610, where the top view of the structural colors line-up with the different areas of the article 600 in the cross-sectional view directly above.

The third structural color 694A-B is represented by A-B to illustrate the different areas of the middle region 640. The third structural color 694A-B may be a blend of different structural colors imparted by A-B, the third structural color may be a transitional zone of colors imparted by A-B, or the third structural color may be independently discernible structural colors A-B (e.g., so while this is referred to as the "third structural color", it may be more complex than a single structural color). The middle region 640 can be designed to impart the desired structural color.

The first region A 612, the first region B 614, the second region A 652, and the second region B 654 in FIG. 5 include 4 layers, while the middle region 640 includes one layer. While each layer of the first region B 614 and the second region B 654 may not extend the entire length of the region, the first region B 614 and the second region B 654 have four layers at the first edge 616 and the second edge 656, respectively. Each layer independently can have a thickness that is independent of the other layers. Each layer independently can be made of a material that is independent of the other layers. The combination of the thickness and materials of the layers, at least in part, imparts the first structural color 690R (e.g., the first region A 612 and the second region A 652), the second structural color 692G (e.g., the first region B 614 and the second region B 654), and the third structural color 694A-B (e.g., the middle region 640)

The first region A 612 and the second region A 652 have corresponding layers in that the number of layers is the same, the material of the corresponding layers consist essentially of the same material (e.g., they are the same material, less contaminants which are less that about 1 percent, less that about 2 percent, less that about 3 percent or less that about 5 percent) or are the same material (e.g., about 98 percent or more or about 99 percent or more), and the average thickness of the corresponding layers is the same or substantially the same (e.g., about 85 to 99 percent or about 90 to 99 percent or about 95 to 99 percent identical). The first region A 612 and the second region A 652 have a stacked structure, where each corresponding layer has the same or similar average thickness. Vertically adjacent layers can have the same or different thicknesses. The length of the first region A 612 and the second region A 652 can be in the micrometer to millimeter range to centimeter range or more depending upon the design desired. The overall dimensions of the optical element can be on the micrometer to centimeter range (e.g., about 1 micrometer to 500 centimeters or about 1 micrometer to about 100 centimeters).

The first region B cross section 634 and the second region B cross section 684 illustrated in FIG. 5 is similar to those described in reference to FIG. 3, the main different being that the termination point of at least one of the layers occurs at a point not on the surface of the article 600. In other words, the termination point (e.g., first ending point 622) of one layer is on another layer. In reference to FIG. 5, at least one of the layers of the first region B 614 tapers from the first edge 616 of the first region A 612 to a first ending point 622 of said layer so that the first ending point 622 has the thinnest thickness of each the layers in the first region B 614 at the first ending point 622. The first ending point 622 is at a position where the layer terminates on another layer in the first region B 614. Similarly, at least one of the layers of the second region B 654 tapers from the second edge 656 of the second region A 652 to a second ending point 666 of said layer so that the second ending point 666 has the thinnest thickness of each the layers in the second region B 654 at the second ending point 666. The second ending point 666 is at a position where the layer terminates on another layer in the second region B 654.

In an aspect, at least one of the layers of the first region B 614 tapers from a first edge 612 of the first region A 612 to a third point (not shown) of the first region B 614 so that the thickness of the layer at the first edge 616 of the first region A 612 is greater than the thickness at the third point in the first region B. The first point 618 and the third point are at different locations. Similarly, at least one of the layers of the second region B 654 tapers from a second edge 656 of the second region A 652 to a fourth point (not shown) of the second region B 654 so that the thickness of the layer at the second edge 656 of the second region A 652 is greater than the thickness at the fourth point in the second region B 654, where second point 658 and the fourth point are at different locations.

The angle from the first edge 616 or second edge 656 to the first point 618 (or first ending point 622) or the second point 658 (or second ending point 666), respectively, can vary in different embodiments and can be steep or gradual. The first point 618 and the second point 658 terminate at the edge of the middle region 640. The middle region 640 is from the first point 618 to the second point 658.

The length of the first region B 614 and the second region B 654 can be in the nanometer to micrometer to micrometer to millimeter range or more depending upon the design desired. In general, the length of the first region B 614 and the second region B 654 can be about 100 nanometers to 500 millimeters, about 1 micrometer to 100 millimeters, about 1 micrometer to about 100 millimeters. In general, the length of the middle region 640 can be in the nanometer to micrometer to micrometer to millimeter range or more depending upon the design desired. In general, the length of the middle region 640 can be about 100 nanometers to 5000 millimeters, about 1 micrometer to 1000 millimeters, about 1 micrometer to about 1000 millimeters. In general, the length of the middle region 640 can be about 100 nanometers to 5000 millimeters, about 1 micrometer to 1000 millimeters, about 1 micrometer to about 1000 millimeters.

At least one layer of the first region A 612 has a layer first region A average thickness and at least one layer of the first region B 614 has a layer first region B average thickness. The layer first region B average thickness is about 5 to 90% of the thickness of the layer first region A average thickness.

Similarly, at least one layer of the second region A 652 has a layer second A region average thickness and at least one layer of the second region B 654 has a layer second B region average thickness. The layer second region B average thickness is about 5 to 90% of the thickness of the layer second region A average thickness. Also, the one layer of the middle region 640 has a layer middle region average thickness. The layer middle region average thickness is about 5 to 90% of the thickness of the layer first region A average thickness.

As previously described, the first region A and the second region A of the optical element imparts (for each of FIGS. 3-5) a first structural color to the first area of the article, the first region B and the second region B of the optical element imparts a second structural color to the second area of the article, and the middle region of the optical element imparts a third structural color to a third area of the article. The first structural color (at least one of a hue, a value, a chroma, or any combination thereof), the second structural color (at least one of a hue, a value, a chroma, or any combination thereof), and the third structural color (at least one of a hue, a value, a chroma, or any combination thereof) each differ from one other when viewed from the same angle of observation (e.g., to a viewer having 20/20 visual acuity and normal color vision from a distance of about 1 meter under normal lighting conditions (e.g., about 30 lux of sunlight)). The difference can at least in part be attributed to the different average thicknesses of the different regions. The cross section of each region (A, B, and middle) are different from one another which can at least in part be responsible for the difference in imparted structural color. It should be stated that while a clear demarcation is represented, there may be an area of transition between the first structural color, the second structural color, and the third structural color. For clarity and illustration, a set demarcation line is shown.

For each of FIGS. 3-5, the refractive index of adjacent layers of each section are different. The difference in the index of refraction of adjacent layers can be about 0.0001 to 50 percent, about 0.1 to 40 percent, about 0.1 to 30 percent, about 0.1 to 20 percent, about 0.1 to 10 percent (and other ranges there between (e.g., the ranges can be in increments of 0.0001 to 5 percent)). The index of refraction depends at least in part upon the material of the layer and can range from 1.3 to 2.6.

The structural color imparted by the first region A and the second region A or the first region A and the first region B (or the second region A and the second region B) can be compared to one another or to the middle layer. For example, a color measurement can be performed for each of the first region A and the second region A (or a comparison of other regions as desired) at the same relative angle, where a comparison of the color measurements can determine what, if any, difference is present. For example, at a first observation angle a first color measurement can be made for the first region A and at the first observation angle a second color measurement can be made for the second region A. The first color measurement can be obtained and has coordinates $L_1^*$ and $a_1^*$ and $b_1^*$, while a second color measurement can be obtained and has coordinates $L_2^*$ and $a_2^*$ and $b_2^*$ can be obtained, according to the CIE 1976 color space under a given illumination condition.

When $\Delta E^*_{ab}$ between the first color measurement and the second color measurement is less than or equal to about 2.2 or is less than or equal to about 3, the structural color associated with the first color measurement and the structural color associated with the second color measurement are the same or not perceptibly different to an average observer (e.g., the textured surface does not cause or change the structural color by more than 20 percent, 10 percent, or 5 percent). When $\Delta E^*_{ab}$ between the first color measurement and the second color measurement is greater than 3 or optionally greater than about 4 or 5, the structural color associated with the first color measurement and the second structural color associated with the second color measurement are different or perceptibly different to an average observer. For example, the first color measurement associated with first region A and the second color measurement associated with second region A are the same if $\Delta E^*_{ab}$ is less than or equal to about 2.2 or is less than or equal to about 3. In another example, the first color measurement associated with first region B and the second color measurement associated with second region B are the same if $\Delta E^*_{ab}$ is less than or equal to about 2.2 or is less than or equal to about 3. In another example, the first color measurement associated with first region A and the second color measurement associated with first region B are different when $\Delta E^*_{ab}$ is greater than 3 or optionally greater than about 4 or 5. In yet another example, the first color measurement associated with second region A and the second color measurement associated with second region B are different when $\Delta E^*_{ab}$ is greater than 3 or optionally greater than about 4 or 5. In still another example, the first color measurement associated with first or second region A (or alternatively the first or second region B) and the second color measurement associated with middle region are different when $\Delta E^*_{ab}$ is greater than 3 or optionally greater than about 4 or 5.

In another approach, when the percent difference between one or more of values $L_1^*$ and $L_2^*$ $a_1^*$ and $a_2^*$, and $b_1^*$ and $b_2^*$ is less than 20 percent, the structural color associated with the first color measurement and the structural color associated with the second color measurement are the same or not perceptibly different to an average observer. When the percent difference between one or more of values $L_1^*$ and $L_2^*$ $a_1^*$ and $a_2^*$, and $b_1^*$ and $b_2^*$ is greater than 20 percent, the structural color associated with the first color measurement and the structural color associated with the second color measurement are different or perceptibly different to an average observer.

The optical element can be an inorganic optical element, an organic optical element, or a mixed inorganic/organic optical element. The organic optical element has at least one layer and that layer is made of an organic material. The organic material can include a polymer, such as those described herein. The organic material is made of a non-metal or non-metal oxide material. The organic material that does not include a metal or metal oxide. The organic material is made of a polymeric material that does not include a metal or metal oxide.

The inorganic optical element has at least one layer and that layer is made of a non-organic material. As described in detail herein, the non-organic material can be a metal or metal oxide. The non-organic material does not include any organic material.

The optical element can be a mixed inorganic/organic optical element, meaning that one or more of the layers can be made of an inorganic material, one or more layers can be made of an organic material, and/or one or more layers can be made of a layer of a mixture of inorganic and organic materials (e.g., a polymer include metal or metal oxide particles (e.g., micro- or nano-particles).

The optical element includes at least one layer, which can be at least one constituent layer and/or at least one reflective layer (e.g., intermediate and/or non-intermediate reflective layers). The optical element that can be or include a single layer reflector, a single layer filter, or multilayer reflector or a multilayer filter. The optical element can function to modify the light that impinges thereupon so that structural color is Imparted to the article. The optical element can also optionally include one or more additional layers (e.g., a protective layer, the textured layer, a polymeric layer, and the like). The optical element can have a thickness of about 100 to 1,500 nanometers, about 100 to 1,200 nanometers, about 100 to about 700 nanometers, or of about 200 to about 500 nanometers.

The optical element or layers or portions thereof (e.g., reflective layer, constituent layer) can be formed using known techniques such as physical vapor deposition, electron beam deposition, atomic layer deposition, molecular beam epitaxy, cathodic arc deposition, pulsed laser deposition, sputtering deposition (e.g., radio frequency, direct current, reactive, non-reactive), chemical vapor deposition, plasma-enhanced chemical vapor deposition, low pressure chemical vapor deposition and wet chemistry techniques such as layer-by-layer deposition, sol-gel deposition, Langmuir blodgett, and the like, which can optionally use techniques (e.g., masks) to control the thickness of a layer in one or more areas of the surface of the article. The temperature of the first side can be adjusted using the technique to form the optical element and/or a separate system to adjust the temperature.

As stated herein, the optical element can comprise a single layer or multilayer reflector (e.g., reflective layer(s) and/or constituent layer(s)). The multilayer reflector can be configured to have a certain reflectivity at a given wavelength of light (or range of wavelengths) depending, at least in part, on the material selection, thickness and number of the layers of the multilayer reflector. In other words, one can judiciously select the materials, thicknesses, and numbers of the layers of a multilayer reflector and optionally its interaction with one or more other layers, so that it can reflect a certain wavelength of light (or range of wavelengths), to produce a desired structural color.

The optical element can include 2 to 20 layers, 2 to 15, 2 to 10 layer, 2 to 6 layers, or 2 to 4 layers, where at least two sections have a different number of layers. The number of layers the at least two section can differ by at least 1, at least 2, at least 3, at least 4, at least 5, at least 10, at least 15, at least 20, and so on. Each layer can have a thickness that is about one-fourth of the wavelength of light to be reflected to produce the desired structural color. Each layer can have a thickness of at least 10 nanometers, optionally at least 30 nanometers, at least 40 nanometers, at least 50 nanometers, at least 60 nanometers, at least 100 nanometers, at least 150 nanometers, optionally a thickness of from about 10 nanometers to about 500 nanometers, about 10 nanometers to about 250 nanometers, about 10 nanometers to about 200 nanometers, about 10 nanometers to about 150 nanometers, about 10 nanometers to about 100 nanometers, or of from about 30 nanometers to about 80 nanometers, or from about 40 nanometers to about 60 nanometers. For example, the layer can be about 30 to 200 nanometers or about 30 to 150 nanometers thick.

The optical element can comprise a single layer or multilayer filter. The single layer or multilayer filter destructively interferes with light that impinges upon the article, where the destructive interference of the light and optionally interaction with one or more other layers or structures of the optical element (e.g., a multilayer reflector, a textured structure) impart the structural color. In this regard, the layer of the single layer filter or the layers of the multilayer filter can be designed (e.g., material selection, thickness, number of layer, and the like) so that a single wavelength of light, or a particular range of wavelengths of light, make up the structural color. For example, the range of wavelengths of light can be limited to a range within plus or minus 30 percent or a single wavelength, or within plus or minus 20 percent of a single wavelength, or within plus or minus 10 percent of a single wavelength, or within plus or minus 5 percent or a single wavelength. The range of wavelengths can be broader to produce a more iridescent structural color.

Each layer can independently include a metal layer or an oxide layer. The oxide layer can be a metal oxide, a doped metal oxide, or a combination thereof. The metal layer, the metal oxide or the doped metal oxide can include the following: the transition metals, the metalloids, the lanthanides, and the actinides, as well as nitrides, oxynitrides, sulfides, sulfates, selenides, tellurides and a combination of these. The metal layer can be titanium, aluminum, silver, zirconium, chromium, magnesium, silicon, gold, platinum, and a combination thereof. The metal oxide can include titanium oxide, silver oxide, aluminum oxide, silicon dioxide, tin dioxide, chromia, iron oxide, nickel oxide, silver oxide, cobalt oxide, zinc oxide, platinum oxide, palladium oxide, vanadium oxide, molybdenum oxide, lead oxide, and combinations thereof as well as doped versions of each. In some aspects, the layer can consist essentially of a metal oxide. In some aspects, the layer can consist essentially of titanium dioxide. The metal oxide can be doped with water, inert gasses (e.g., argon), reactive gasses (e.g., oxygen or nitrogen), metals, and a combination thereof. In some aspects, the reflective layer can consist essentially of a doped metal oxide or a doped metal oxynitride or both. In an aspect, the reflective layer can be made of Ti or TiTiO$_x$ (x=1-2). The density of the Ti layer or TiO$_x$ layer can be about 3 to 6 grams per centimeter cubed, about 3 to 5 grams per centimeter cubed, about 4 to 5 grams per centimeter cubed, or 4.5 grams per centimeter cubed.

In addition, each layer can be made of liquid crystals. Each layer can be made of a material such as: silicon dioxide, titanium dioxide, zinc sulfide, magnesium fluoride, tantalum pentoxide, aluminum oxide, or a combination thereof. To improve adhesion between layers, a metal layer is adjacent a metal oxide layer formed of the same metal. For example, Ti and TiO$_x$ can be positioned adjacent one another to improve adhesion.

The material of the layer can be selected based on the desired structural color to be produced. Select materials reflect some wavelengths more than other wavelengths. In this way, the material of the layer can be selected based on the desired structural color. The optical element can be made with a combination of constituent layers and/or reflective layers so that the desired structural color is imparted. The optical element including a reflective layer can have a minimum percent reflectance for one or more of the following wavelength ranges: violet 380 to 450 nanometer, blue 450 to 485 nanometer, cyan 485 to 500 nanometer, green 500 to 565 nanometer, yellow 564 to 590 nanometer, orange 590 to 625 nanometer, or red 625 to 740 nanometer. The reflective layer can have a minimum percent reflectance for one or more wavelength widths (e.g., about 10 nanometers, about 20 nanometers, about 30 nanometers, about 40 nanometers, about 50 nanometers, about 60 nanometers, about 75 nanometers, or about 100 nanometers) in the range from 380 to 740 nanometers. For the ranges not selected in a particular configuration, the minimum reflectivity is lower than that for the selected range, for example, the minimum reflectivity is lower than that for the selected range by about 10 percent or more, about 20 percent or more, about 30 percent or more, about 40 percent or more, or about 50 percent or more. In an aspect, the reflective layer can be Al or AlO$_x$, where the structural color is iridescent. In another example, the reflective layer can Ti or TiO$_x$, where the structural color can be one or more hues of blue or one or more hues of green, or a combination thereof.

The optical element can be a coating on the surface of the article. The coating can be chemically bonded (e.g., covalently bonded, ionically bonded, hydrogen bonded, and the like) to the surface of the article. The coating has been found to bond well to a surface made of a polymeric material. In an example, the surface of the article can be made of a polymeric material such as a polyurethane, including a thermoplastic polyurethane (TPU), as those described herein.

The optical element can be uncolored (e.g., no pigments or dyes added to the structure or its layers), colored (e.g., pigments and/or dyes are added to the structure or its layers (e.g., dark or black color)). The surface of the component upon which the optical element is disposed can be uncolored (e.g., no pigments or dyes added to the material), colored (e.g., pigments and/or dyes are added to the material (e.g., dark or black color)), reflective, and/or transparent (e.g., percent transmittance of 75 percent or more).

The layers can be formed in a layer-by-layer manner, where each layer has a different index of refraction. Each of layers can be formed using known techniques such as those described above and herein.

As mentioned above, the optical element can include one or more layers in addition to the reflective layer(s) and/or the constituent layer(s). The optical element has a first side and a second side, where the first side or the second side is adjacent the surface of the component. The one or more other layers of the optical element can be on the first side and/or the second side of the optical element. For example, the optical element can include a protective layer and/or a polymeric layer such as a thermoplastic polymeric layer, where the protective layer and/or the polymeric layer can be on one or both of the first side and the second side of the optical element. One or more of the optional other layers can include a textured surface. Alternatively or in addition, one or more of the reflective layer(s) and/or one or more constituent layer(s) of the optical element can include a textured surface.

A protective layer can be disposed on the first and/or second side of the optical element, on the outside most layer to protect the optical element. The protective layer is more durable or more abrasion resistant than the other layers. The protective layer is optically transparent to visible light. The protective layer can be on the first side and/or the second side of the optical element to protect the other layers on the respective side. All or a portion of the protective layer can include a dye or pigment in order to alter an appearance of the structural color. The protective layer can include silicon dioxide, glass, combinations of metal oxides, or mixtures of polymers. The protective layer can have a thickness of about 3 nanometers to 1 millimeter.

The protective layer can be formed using physical vapor deposition, chemical vapor deposition, pulsed laser deposition, evaporative deposition, sputtering deposition (e.g., radio frequency, direct current, reactive, non-reactive), plasma enhanced chemical vapor deposition, electron beam deposition, cathodic arc deposition, low pressure chemical vapor deposition and wet chemistry techniques such as layer by layer deposition, sol-gel deposition, Langmuir blodgett, and the like. Alternatively or in addition, the protective layer can be applied by spray coating, dip coating, brushing, spin coating, doctor blade coating, and the like.

A polymeric layer can be disposed on the first and/or the second side of the optical element. The polymeric layer can be used to dispose the optical element onto an article, such as, for example, when the article does not include a thermoplastic material to adhere the optical element. The polymeric layer can comprise a polymeric adhesive material, such as a hot melt adhesive. The polymeric layer can be a thermoplastic material and can include one or more layers. The thermoplastic material can be any one of the thermoplastic material described herein. The polymeric layer can be applied using various methodologies, such as spin coating, dip coating, doctor blade coating, and so on. The polymeric layer can have a thickness of about 3 nanometer to 1 millimeter.

As described above, one or more embodiments of the present disclosure provide articles that incorporate the optical element (e.g., single or multilayer structures) on a side of a component of the article to impart structural color. The optical element can be disposed onto the thermoplastic material of the side of the article, and the side of the article can include a textile, including a textile comprising the thermoplastic material.

Having described aspects, additional details will now be described for the optional textured surface. As described herein, the article includes the optical element and the optical element optionally include a textured surface. The textured surface can be a surface of a textured structure or a textured layer. The textured surface may be provided as part of the optical element. For example, the optical element may comprise a textured layer or a textured structure that comprises the textured surface. The textured surface may be provided as part of the article to which the optical element is disposed. For example, the optical element may be disposed onto the surface of the article where the surface of the article is a textured surface, or the surface of the article includes a textured structure or a textured layer affixed to it.

The textured surface (or a textured structure or textured layer including the textured surface) may be provided as a feature on or part of another medium, such as a transfer medium, and imparted to a side or layer of the optical element or to the surface of the component. For example, a mirror image or relief form of the textured surface may be provided on the side of a transfer medium, and the transfer medium contacts a side of the optical element or the surface of the component in a way that imparts the textured surface to the optical element or article. While the various embodiments herein may be described with respect to a textured surface of the optical element, it will be understood that the features of the textured surface, or a textured structure or textured layer, may be imparted in any of these ways.

The textured surface can contribute to the structural color resulting from the optical element. As described herein, structural coloration is imparted, at least in part, due to optical effects caused by physical phenomena such as scattering, diffraction, reflection, interference or unequal refraction of light rays from an optical element. The textured surface (or its mirror image or relief) can include a plurality of profile features and flat or planar areas. The plurality of profile features included in the textured surface, including their size, shape, orientation, spatial arrangement, etc., can affect the light scattering, diffraction, reflection, interference and/or refraction resulting from the optical element. The flat or planar areas included in the textured surface, including their size, shape, orientation, spatial arrangement, etc., can affect the light scattering, diffraction, reflection, interference and/or refraction resulting from the optical element. The desired structural color can be designed, at least in part, by adjusting one or more of properties of the profile features and/or flat or planar areas of the textured surface.

The profile features can extend from a side of the flat areas, so as to provide the appearance of projections and/or depressions therein. A flat area can be a flat planar area. A profile feature may include various combinations of projections and depressions. For example, a profile feature may include a projection with one or more depressions therein, a depression with one or more projections therein, a projection with one or more further projections thereon, a depression with one or more further depressions therein, and the like. The flat areas do not have to be completely flat and can include texture, roughness, and the like. The texture of the flat areas may not contribute much, if any, to the imparted structural color. The texture of the flat areas typically contributes to the imparted structural color. For clarity, the profile features and flat areas are described in reference to the profile features extending above the flat areas, but the inverse (e.g., dimensions, shapes, and the like) can apply when the profile features are depressions in the textured surface.

The textured surface can comprise a thermoplastic material. The profile features and the flat areas can be formed using a thermoplastic material. For example, when the thermoplastic material is heated above its softening temperature a textured surface can be formed in the thermoplastic material such as by molding, stamping, printing, compressing, cutting, etching, vacuum forming, etc., the thermoplastic material to form profile features and flat areas therein. The textured surface can be imparted on a side of a thermoplastic material. The textured surface can be formed in a layer of thermoplastic material. The profile features and the flat areas can be made of the same thermoplastic material or a different thermoplastic material.

The textured surface generally has a length dimension extending along an x-axis, and a width dimension extending along a z-axis, and a thickness dimension extending along a y-axis. The textured surface has a generally planar portion extending in a first plane that extends along the x-axis and the z-axis. A profile feature can extend outward from the first plane, so as to extend above or below the plane x. A profile feature may extend generally orthogonal to the first plane, or at an angle greater to or less than 90 degrees to the first plane.

The dimensional measurements in reference to the profile features (e.g., length, width, height, diameter, and the like) described herein refer to an average dimensional measurement of profile features in 1 square centimeter in the optical element.

The dimension (e.g., length, width, height, diameter, depending upon the shape of the profile feature) of each profile feature can be within the nanometer to micrometer range. A textured surface can have a profile feature and/or flat area with a dimension of about 10 nanometers to about 500 micrometers. The profile feature can have dimensions in the nanometer range, e.g., from about 10 nanometers to about 1000 nanometers. All of the dimensions of the profile feature (e.g., length, width, height, diameter, depending on the geometry) can be in the nanometer range, e.g., from about 10 nanometers to about 1000 nanometers. The textured surface can have a plurality of profile features having dimensions that are 1 micrometer or less. In this context, the phrase "plurality of the profile features" is meant to mean that about 50 percent or more, about 60 percent or more, about 70 percent or more, about 80 percent or more, about 90 percent or more, or about 99 percent or more of the profile features have a dimension in this range. The profile features can have a ratio of width:height and/or length:height dimensions of about 1:2 and 1:100, or 1:5 and 1:50, or 1:5 and 1:10.

The textured surface can have a profile feature and/or flat area with a dimension within the micrometer range of dimensions. A textured surface can have a profile feature and/or flat area with a dimension of about 1 micrometer to about 500 micrometers. All of the dimensions of the profile feature (e.g., length, width, height, diameter, depending on the geometry) can be in the micrometer range, e.g., from about 1 micrometer to about 500 micrometers. The textured surface can have a plurality of profile features having dimensions that are from about 1 micrometer to about 500 micrometer. In this context, the phrase "plurality of the profile features" is meant to mean that about 50 percent or more, about 60 percent or more, about 70 percent or more, about 80 percent or more, about 90 percent or more, or about 99 percent or more of the profile features have a dimension in this range. The height of the profile features (or depth if depressions) can be about 0.1 and 50 micrometers, about 1 to 5 micrometers, or 2 to 3 micrometers. The profile features can have a ratio of width:height and/or length:height dimensions of about 1:2 and 1:100, or 1:5 and 1:50, or 1:5 and 1:10.

A textured surface can have a plurality of profile features having a mixture of size dimensions within the nanometer to micrometer range (e.g., a portion of the profile features are on the nanometer scale and a portion of the profile features are on the micrometer scale). A textured surface can have a plurality of profile features having a mixture of dimensional ratios. The textured surface can have a profile feature having one or more nanometer-scale projections or depressions on a micrometer-scale projection or depression.

The profile feature can have height and width dimensions that are within a factor of three of each other ($0.33w \leq h \leq 3w$ where w is the width and h is the height of the profile feature) and/or height and length dimensions that are within a factor of three of each other ($0.33l \leq h \leq 3l$ where l is the length and h is the height of the profile feature). The profile feature can have a ratio of length:width that is from about 1:3 to about 3:1, or about 1:2 to about 2:1, or about 1:1.5 to about 1.5:1, or about 1:1.2 to about 1.2:1, or about 1:1. The width and length of the profile features can be substantially the same or different.

In another aspect, the textured surface can have a profile feature and/or flat area with at least one dimension in the mid-micrometer range and higher (e.g., greater than 500 micrometers). The profile feature can have at least one dimension (e.g., the largest dimension such as length, width, height, diameter, and the like depending upon the geometry or shape of the profile feature) of greater than 500 micrometers, greater than 600 micrometers, greater than 700 micrometers, greater than 800 micrometers, greater than 900 micrometers, greater than 1000 micrometers, greater than 2 millimeters, greater than 10 millimeters, or more. For example, the largest dimension of the profile feature can range from about 600 micrometers to about 2000 micrometers, or about 650 micrometers to about 1500 micrometers, or about 700 micrometers to about 1000 micrometers. At least one or more of the dimensions of the profile feature (e.g., length, width, height, diameter, depending on the geometry) can be in the micrometer range, while one or more of the other dimensions can be in the nanometer to micrometer range (e.g., less than 500 micrometers, less than 100 micrometers, less than 10 micrometers, or less than 1 micrometer). The textured surface can have a plurality of profile features having at least one dimension that is in the mid-micrometer or more range (e.g., 500 micrometers or more). In this context, the phrase "plurality of the profile features" is meant to mean that about 50 percent or more, about 60 percent or more, about 70 percent or more, about 80 percent or more, about 90 percent or more, or about 99 percent or more of the profile features have at least one dimension that is greater than 500 micrometers. In particular, at least one of the length and width of the profile feature is greater than 500 micrometers or both the length and the width of the profile feature is greater than 500 micrometers. In another example, the diameter of the profile feature is greater than 500 micrometers. In another example, when the profile feature is an irregular shape, the longest dimension is greater than 500 micrometers.

In aspects, the height of the profile features can be greater than 50 micrometers. In this context, the phrase "plurality of the profile features" is meant to mean that about 50 percent or more, about 60 percent or more, about 70 percent or more, about 80 percent or more, about 90 percent or more, or about 99 percent or more of the profile features have at height that is greater than 50 micrometers. The height of the profile feature can be 50 micrometers, about 60 micrometers, about 70 micrometers, about 80 micrometers, about 90 micrometers, or about 100 micrometers to about 60 micrometers, about 70 micrometers, about 80 micrometers, about 90 micrometers, about 100 micrometers, about 150 micrometers, about 250 micrometers, about 500 micrometers or more. For example, the ranges can include 50 micrometers to 500 micrometers, about 60 micrometers to 250 micrometers, about 60 micrometers to about 150 micrometers, and the like. One or more of the other dimensions (e.g., length, width, diameter, or the like) can be in the nanometer to micrometer range (e.g., less than 500 micrometers, less than 100 micrometers, less than 10 micrometers, or less than 1 micrometer). In particular, at least one of the length and width of the profile feature is less than 500 micrometers or both the length and the width of the profile feature is less than 500 micrometers, while the height is greater than 50 micrometers. One or more of the other dimensions (e.g., length, width, diameter, or the like) can be in the micrometer to millimeter range (e.g., greater than 500 micrometers to 10 millimeters).

The dimension (e.g., length, width, height, diameter, depending upon the shape of the profile feature) of each profile feature can be within the nanometer to micrometer range. The textured surface can have a profile feature and/or flat area with a dimension of about 10 nanometers to about 500 micrometers or higher (e.g., about 1 millimeter, about 2 millimeters, about 5 millimeters, or about 10 millimeters). At least one of the dimensions of the profile feature (e.g., length, width, height, diameter, depending on the geometry) can be in the nanometer range (e.g., from about 10 nanometers to about 1000 nanometers), while at least one other dimension (e.g., length, width, height, diameter, depending on the geometry) can be in the micrometer range (e.g., 5 micrometers to 500 micrometers or more (e.g., about 1 to 10 millimeters)). The textured surface can have a plurality of profile features having at least one dimension in the nanometer range (e.g., about 10 to 1000 nanometers) and the other in the micrometer range (e.g., 5 micrometers to 500 micrometers or more). In this context, the phrase "plurality of the profile features" is meant to mean that about 50 percent or more, about 60 percent or more, about 70 percent or more, about 80 percent or more, about 90 percent or more, or about 99 percent or more of the profile features have at least one dimension in the nanometer range and at least one dimension in the micrometer range. In particular, at least one of the length and width of the profile feature is in the nanometer range, while the other of the length and the width of the profile feature is in the micrometer range.

In aspects, the height of the profile features can be greater than 250 nanometers. In this context, the phrase "plurality of the profile features" is meant to mean that about 50 percent or more, about 60 percent or more, about 70 percent or more, about 80 percent or more, about 90 percent or more, or about 99 percent or more of the profile features have at height that is greater than 250 nanometers. The height of the profile feature can be 250 nanometers, about 300 nanometers, about 400 nanometers, or about 500 nanometers, to about 300 nanometers, about 400 nanometers, about 500 nanometers, or about 1000 nanometers or more. For example, the range can be 250 nanometers to about 1000 nanometers, about 300 nanometers to 500 nanometers, about 400 nanometers to about 1000 nanometers, and the like. One or more of the other dimensions (e.g., length, width, diameter, or the like) can be in the micrometer to millimeter range (e.g., greater than 500 micrometers to 10 millimeters). In particular, at least one of the length and width of the profile feature is in the nanometer range (e.g., about 10 to 1000 nanometers) and the other in the micrometer range (e.g., 5 micrometers to 500 micrometers or more), while the height is greater than 250 nanometers.

The profile features can have a certain spatial arrangement. The spatial arrangement of the profile features may be uniform, such as spaced evenly apart or forming a pattern. The spatial arrangement can be random. Adjacent profile features can be about 10 to 500 nanometers apart, about 100 to 1000 nanometers apart, about 1 to 100 micrometers apart or about 5 to 100 micrometers apart. Adjacent profile features can overlap one another or be adjacent one another so little or no flat regions are positioned there between. The desired spacing can depend, at least in part, on the size and/or shape of the profile structures and the desired structural color effect.

The profile features can have a certain cross-sectional shape (with respect to a plane parallel the first plane). The textured surface can have a plurality of profile features having the same or similar cross-sectional shape. The textured surface has a plurality of profile features having a mixture of different cross-sectional shapes. The cross-sectional shapes of the profile features can include polygonal (e.g., square or triangle or rectangle cross section), circular, semi-circular, tubular, oval, random, high and low aspect ratios, overlapping profile features, and the like.

The profile feature (e.g., about 10 nanometers to 500 micrometers) can include an upper, flat surface. The profile feature (e.g., about 10 nanometers to 500 micrometers) can include an upper, concavely curved surface. The concave curved surface may extend symmetrically either side of an uppermost point. The concave curved surface may extend symmetrically across only 50 percent of the uppermost point. The profile feature (e.g., about 10 nanometers to 500 micrometers) can include an upper, convexly curved surface. The curved surface may extend symmetrically either side of an uppermost point. The curved surface may extend symmetrically across only 50 percent of the uppermost point.

The profile feature can include protrusions from the textured surface. The profile feature can include indents (hollow areas) formed in the textured surface. The profile feature can have a smooth, curved shape (e.g., a polygonal cross-section with curved corners).

The profile features (whether protrusions or depressions) can be approximately conical or frusto-conical (i.e. the projections or indents may have horizontally or diagonally flattened tops) or have an approximately part-spherical surface (e.g., a convex or concave surface respectively having a substantially even radius of curvature).

The profile features may have one or more sides or edges that extend in a direction that forms an angle to the first plane of the textured surface. The angle between the first plane and a side or edge of the profile feature is about 45 degrees or less, about 30 degrees or less, about 25 degrees or less, or about 20 degrees or less. The one or more sides or edges may extend in a linear or planar orientation, or may be curved so that the angle changes as a function of distance from the first plane. The profile features may have one or more sides that include step(s) and/or flat side(s). The profile feature can have one or more sides (or portions thereof) that can be orthogonal or perpendicular to the first plane of the textured surface, or extend at an angle of about 10 degrees to 89 degrees to the first plane (90 degrees being perpendicular or orthogonal to the first plane)). The profile feature can have a side with a stepped configuration, where portions of the side can be parallel to the first plane of the textured surface or have an angle of about 1 degrees to 179 degrees (0 degrees being parallel to the first plane)).

The textured surface can have profile features with varying shapes (e.g., the profile features can vary in shape, height, width and length among the profile features) or profile features with substantially uniform shapes and/or dimensions. The structural color produced by the textured surface can be determined, at least in part, by the shape, dimensions, spacing, and the like, of the profile features.

The profile features can be shaped so as to result in a portion of the surface (e.g., about 25 to 50 percent or more) being about normal to the incoming light when the light is incident at the normal to the first plane of the textured surface. The profile features can be shaped so as to result in a portion of the surface (e.g., about 25 to 50 percent or more) being about normal to the incoming light when the light is incident at an angle of up to 45 degrees to the first plane of the textured surface.

The spatial orientation of the profile features on the textured surface can be used to produce the structural color, or to effect the degree to which the structural color shifts at different viewing angles. The spatial orientation of the profile features on the textured surface can be random, a semi-random pattern, or in a set pattern. A set pattern of profile features is a known set up or configuration of profile features in a certain area (e.g., about 50 nanometers squared to about 10 millimeters squared depending upon the dimensions of the profile features (e.g., any increment between about 50 nanometers and about 10 millimeters is included)). A semi-random pattern of profile features is a known set up of profile features in a certain area (e.g., about 50 nanometers squared to 10 millimeters squared) with some deviation (e.g., 1 to 15% deviation from the set pattern), while random profile features are present in the area but the pattern of profile features is discernable. A random spatial orientation of the profile features in an area produces no discernable pattern in a certain area, (e.g., about 50 nanometers squared to 10 millimeters squared).

The spatial orientation of the profile features can be periodic (e.g., full or partial) or non-periodic. A periodic spatial orientation of the profile features is a recurring pattern at intervals. The periodicity of the periodic spatial orientation of the profile features can depend upon the dimensions of the profile features but generally are periodic from about 50 nanometers to 100 micrometers. For example, when the dimensions of the profile features are submicron, the periodicity of the periodic spatial orientation of the profile features can be in the 50 to 500 nanometer range or 100 to 1000 nanometer range. In another example, when the dimensions of the profile features are at the micron level, the periodicity of the periodic spatial orientation of the profile features can be in the 10 to 500 micrometer range or 10 to 1000 micrometer range. Full periodic pattern of profile features indicates that the entire pattern exhibits periodicity, whereas partial periodicity indicates that less than all of the pattern exhibits periodicity (e.g., about 70-99 percent of the periodicity is retained). A non-periodic spatial orientation of profile features is not periodic and does not show periodicity based on the dimensions of the profile features, in particular, no periodicity in the 50 to 500 nanometer range or 100 to 1000 nanometer range where the dimensions are of the profile features are submicron or no periodicity in the 10 to 500 micrometer range or 10 to 1000 micrometer range where the dimensions are of the profile features are in the micron range.

In an aspect, the spatial orientation of the profile features on the textured surface can be set to reduce distortion effects, e.g., caused by the interference of one profile feature with another in regard to the structural color of the article. Since the shape, dimension, relative orientation of the profile features can vary considerably across the textured surface, the desired spacing and/or relative positioning for a particular area (e.g., in the micrometer range or about 1 to 10 square micrometers) having profile features can be appropriately determined. As discussed herein, the shape, dimension, relative orientation of the profile features affect the contours of the reflective layer(s) and/or constituent layer(s), so the dimensions (e.g., thickness), index of refraction, number of layers in the optical element (e.g., reflective layer(s) and constituent layer(s)) are considered when designing the textured side of the texture layer.

The profile features are located in nearly random positions relative to one another across a specific area of the textured surface (e.g., in the micrometer range or about 1 to 10 square micrometers to centimeter range or about 0.5 to 5 square centimeters, and all range increments therein), where the randomness does not defeat the purpose of producing the structural color. In other words, the randomness is consistent with the spacing, shape, dimension, and relative orientation of the profile features, the dimensions (e.g., thickness), index of refraction, and number of layers (e.g., the reflective layer(s), the constituent layer(s), and the like, with the goal to achieve the structural color.

The profile features are positioned in a set manner relative to one another across a specific area of the textured surface to achieve the purpose of producing the structural color. The relative positions of the profile features do not necessarily follow a pattern, but can follow a pattern consistent with the desired structural color. As mentioned above and herein, various parameters related to the profile features, flat areas, and reflective layer(s) and/or the constituent layer can be used to position the profile features in a set manner relative to one another.

The textured surface can include micro and/or nanoscale profile features that can form gratings (e.g., a diffractive grating), photonic crystal structure, a selective mirror structure, crystal fiber structures, deformed matrix structures, spiraled coiled structures, surface grating structures, and combinations thereof. The textured surface can include micro and/or nanoscale profile features that form a grating having a periodic or non-periodic design structure to impart the structural color. The micro and/or nanoscale profile features can have a peak-valley pattern of profile features and/or flat areas to produce the desired structural color. The grading can be an Echelette grating.

Figure 2A:
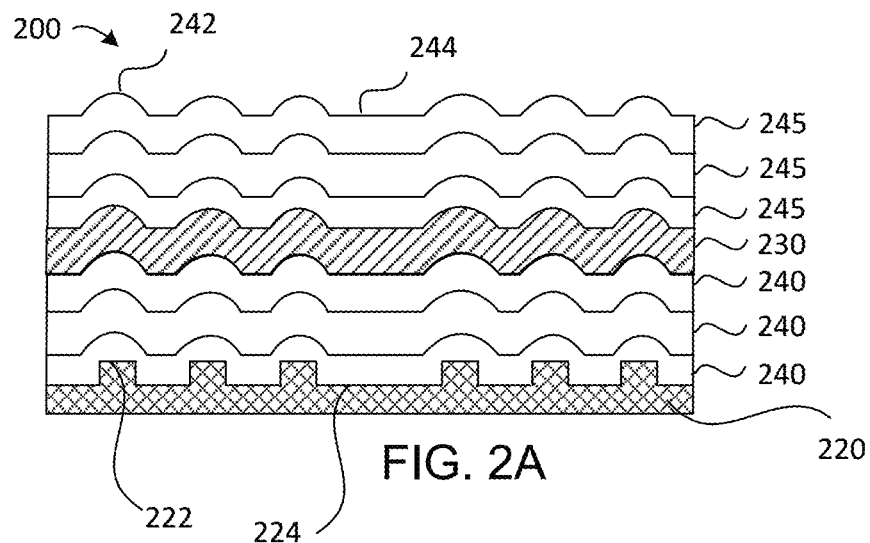
FIGS. 2A and 2B are cross-section illustrations of optical elements having a textured surface and a substantially flat surface, respectively.

The profile features and the flat areas of the textured surface in the optical element can appear as topographical undulations in each layer (e.g., reflective layer(s) and/or the constituent layer(s)). For example, referring to FIG. 2A, an optical element 200 includes a textured structure 220 having a plurality of profile features 222 and flat areas 224. As described herein, one or more of the profile features 222 can be projections from a surface of the textured structure 220, and/or one or more of the profile features can be depressions in a surface of the textured structure 220 (not shown). One or more constituent layers 240 are disposed on the textured structure 220 and then a reflective layer 230 and one or more constituent layers 245 are disposed on the preceding layers. Adjacent layers (constituent layers and reflective layer) are made of different types of materials. In some embodiments, the resulting topography of the textured structure 220 and the one or more constituent layers 240 and 245 and the reflective layer 230 are not identical, but rather, the one or more constituent layers 240 and 245 and the reflective layer 230 can have elevated or depressed regions 242 which are either elevated or depressed relative to the height of the planar regions 244 and which roughly correspond to the location of the profile features 222 of the textured structure 220. The one or more constituent layers 240 and 245 and the reflective layer 230 have planar regions 244 that roughly correspond to the location of the flat areas 224 of the textured structure 220. Due to the presence of the elevated or depressed regions 242 and the planar regions 244, the resultant overall topography of the one or more constituent layers 240 and 245 and the reflective layer 230 can be that of an undulating or wave-like structure. The dimension, shape, and spacing of the profile features along with the number of layers of the constituent layer, the reflective layer, the thickness of each of the layers, refractive index of each layer, and the type of material, can be used to produce an optical element which results in a particular structural color.

While the textured surface can produce the structural color in some embodiments, or can affect the degree to which the structural color shifts at different viewing angles, in other embodiments, a "textured surface" or surface with texture may not produce the structural color, or may not affect the degree to which the structural color shifts at different viewing angles. The structural color can be produced by the design of the optical element with or without the textured surface. As a result, the optical element can include the textured surface having profile elements of dimensions in the nanometer to millimeter range, but the structural color or the shifting of the structural color is not attributable to the presence or absence of the textured surface. In other words, the optical element imparts the same structural color where or not the textured surface is present The design of the textured surface can be configured to not affect the structural color imparted by the optical element, or not affect the shifting of the structural color imparted by the optical element. The shape of the profile features, dimensions of the shapes, the spatial orientation of the profile features relative to one another, and the like can be selected so that the textured surface does not affect the structural color attributable to the optical element.

In another embodiment, the structural color can be imparted by the optical element without the textured surface. The surface of the layers of the optical element are substantially flat (or substantially three-dimensional flat planar surface) or flat (or three-dimensional flat planar surface) at the microscale (e.g., about 1 to 500 micrometers) and/or nanoscale (e.g., about 50 to 500 nanometers). In regard to substantially flat or substantially planar the surface can include some minor topographical features (e.g., nanoscale and/or microscale) such as those that might be caused due to unintentional imperfections, slight undulations that are unintentional, other topographical features (e.g., extensions above the plane of the layer or depressions below or into the plane of the layer) caused by the equipment and/or process used and the like that are unintentionally introduced. The topographical features do not resemble profile features of the textured surface. In addition, the substantially flat (or substantially three dimensional flat planar surface) or flat (or three dimensional flat planar surface) may include curvature as the dimensions of the optical element increase, for example about 500 micrometers or more, about 10 millimeter or more, about 10 centimeters or more, depending upon the dimensions of the optical element, as long as the surface is flat or substantially flat and the surface only includes some minor topographical features.

Figure 2B:
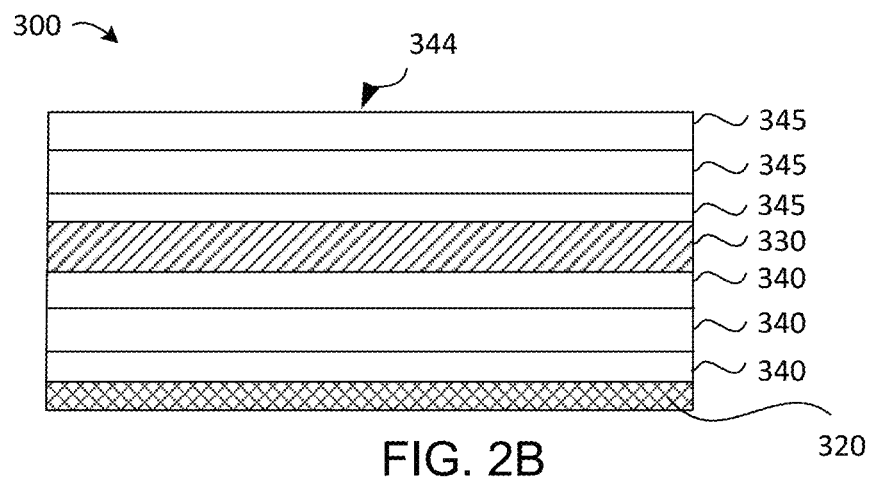

FIG. 2B is a cross-section illustration of a substantially flat (or substantially three-dimensional flat planar surface) or flat (or three-dimensional flat planar surface) optical element 300. The optical element 300 includes one or more constituent layers 340 are disposed on the flat or three-dimensional flat planar surface structure 320 and then a reflective layer 330 and one or more constituent layers 345 are disposed on the preceding layers. Adjacent layers (constituent layers and reflective layer) are made of different types of materials. The material that makes up the constituent layers and the reflective layer, number of layers of the constituent layer, the reflective layer, the thickness of each of the layers, refractive index of each layer, and the like, can produce an optical element which results in a particular structural color.

Additional details are provided regarding the polymeric materials referenced herein for example, the polymers described in reference to the article, components of the article, structures, layers, films, bladders, foams, coating, and like the. The polymer can be a thermoset polymer or a thermoplastic polymer. The polymer can be an elastomeric polymer, including an elastomeric thermoset polymer or an elastomeric thermoplastic polymer. The polymer can be selected from: polyurethanes (including elastomeric polyurethanes, thermoplastic polyurethanes (TPUs), and elastomeric TPUs), polyesters, polyethers, polyamides, vinyl polymers (e.g., copolymers of vinyl alcohol, vinyl esters, ethylene, acrylates, methacrylates, styrene, and so on), polyacrylonitriles, polyphenylene ethers, polycarbonates, polyureas, polystyrenes, co-polymers thereof (including polyester-polyurethanes, polyether-polyurethanes, polycarbonate-polyurethanes, polyether block polyamides (PEBAs), and styrene block copolymers), and any combination thereof, as described herein. The polymer can include one or more polymers selected from the group consisting of polyesters, polyethers, polyamides, polyurethanes, polyolefins copolymers of each, and combinations thereof.

The term "polymer" refers to a chemical compound formed of a plurality of repeating structural units referred to as monomers. Polymers often are formed by a polymerization reaction in which the plurality of structural units become covalently bonded together. When the monomer units forming the polymer all have the same chemical structure, the polymer is a homopolymer. When the polymer includes two or more monomer units having different chemical structures, the polymer is a copolymer. One example of a type of copolymer is a terpolymer, which includes three different types of monomer units. The co-polymer can include two or more different monomers randomly distributed in the polymer (e.g., a random co-polymer). Alternatively, one or more blocks containing a plurality of a first type of monomer can be bonded to one or more blocks containing a plurality of a second type of monomer, forming a block copolymer. A single monomer unit can include one or more different chemical functional groups.

Polymers having repeating units which include two or more types of chemical functional groups can be referred to as having two or more segments. For example, a polymer having repeating units of the same chemical structure can be referred to as having repeating segments. Segments are commonly described as being relatively harder or softer based on their chemical structures, and it is common for polymers to include relatively harder segments and relatively softer segments bonded to each other in a single monomeric unit or in different monomeric units. When the polymer includes repeating segments, physical interactions or chemical bonds can be present within the segments or between the segments or both within and between the segments. Examples of segments often referred to as hard segments include segments including a urethane linkage, which can be formed from reacting an isocyanate with a polyol to form a polyurethane. Examples of segments often referred to as soft segments include segments including an alkoxy functional group, such as segments including ether or ester functional groups, and polyester segments. Segments can be referred to based on the name of the functional group present in the segment (e.g., a polyether segment, a polyester segment), as well as based on the name of the chemical structure which was reacted in order to form the segment (e.g., a polyol-derived segment, an isocyanate-derived segment). When referring to segments of a particular functional group or of a particular chemical structure from which the segment was derived, it is understood that the polymer can contain up to 10 mole percent of segments of other functional groups or derived from other chemical structures. For example, as used herein, a polyether segment is understood to include up to 10 mole percent of non-polyether segments.

As previously described, the polymer can be a thermoplastic polymer. In general, a thermoplastic polymer softens or melts when heated and returns to a solid state when cooled. The thermoplastic polymer transitions from a solid state to a softened state when its temperature is increased to a temperature at or above its softening temperature, and a liquid state when its temperature is increased to a temperature at or above its melting temperature. When sufficiently cooled, the thermoplastic polymer transitions from the softened or liquid state to the solid state. As such, the thermoplastic polymer may be softened or melted, molded, cooled, re-softened or re-melted, re-molded, and cooled again through multiple cycles. For amorphous thermoplastic polymers, the solid state is understood to be the "rubbery" state above the glass transition temperature of the polymer. The thermoplastic polymer can have a melting temperature from about 90 degrees C. to about 190 degrees C. when determined in accordance with ASTM D3418-97 as described herein below, and includes all subranges therein in increments of 1 degree. The thermoplastic polymer can have a melting temperature from about 93 degrees C. to about 99 degrees C. when determined in accordance with ASTM D3418-97 as described herein below. The thermoplastic polymer can have a melting temperature from about 112 degrees C. to about 118 degrees C. when determined in accordance with ASTM D3418-97 as described herein below.

The glass transition temperature is the temperature at which an amorphous polymer transitions from a relatively brittle "glassy" state to a relatively more flexible "rubbery" state. The thermoplastic polymer can have a glass transition temperature from about −20 degrees C. to about 30 degrees C. when determined in accordance with ASTM D3418-97 as described herein below. The thermoplastic polymer can have a glass transition temperature (from about −13 degree C. to about −7 degrees C. when determined in accordance with ASTM D3418-97 as described herein below. The thermoplastic polymer can have a glass transition temperature from about 17 degrees C. to about 23 degrees C. when determined in accordance with ASTM D3418-97 as described herein below.

The thermoplastic polymer can have a melt flow index from about 10 to about 30 cubic centimeters per 10 minutes (cm3/10 min) when tested in accordance with ASTM D1238-13 as described herein below at 160 degrees C. using a weight of 2.16 kilograms (kg). The thermoplastic polymer can have a melt flow index from about 22 cm3/10 min to about 28 cm3/10 min when tested in accordance with ASTM D1238-13 as described herein below at 160 degrees C. using a weight of 2.16 kg.

The thermoplastic polymer can have a cold Ross flex test result of about 120,000 to about 180,000 cycles without cracking or whitening when tested on a thermoformed plaque of the thermoplastic polymer in accordance with the cold Ross flex test as described herein below. The thermoplastic polymer can have a cold Ross flex test result of about 140,000 to about 160,000 cycles without cracking or whitening when tested on a thermoformed plaque of the thermoplastic polymer in accordance with the cold Ross flex test as described herein below.

The thermoplastic polymer can have a modulus from about 5 megaPascals (MPa) to about 100 MPa when determined on a thermoformed plaque in accordance with ASTM D412-98 Standard Test Methods for Vulcanized Rubber and Thermoplastic Rubbers and Thermoplastic Elastomers-Tension with modifications described herein below. The thermoplastic polymer can have a modulus from about 20 MPa to about 80 MPa when determined on a thermoformed plaque in accordance with ASTM D412-98 Standard Test Methods for Vulcanized Rubber and Thermoplastic Rubbers and Thermoplastic Elastomers-Tension with modifications described herein below.

The polymer can be a thermoset polymer. As used herein, a "thermoset polymer" is understood to refer to a polymer which cannot be heated and melted, as its melting temperature is at or above its decomposition temperature. A "thermoset material" refers to a material which comprises at least one thermoset polymer. The thermoset polymer and/or thermoset material can be prepared from a precursor (e.g., an uncured or partially cured polymer or material) using thermal energy and/or actinic radiation (e.g., ultraviolet radiation, visible radiation, high energy radiation, infrared radiation) to form a partially cured or fully cured polymer or material which no longer remains fully thermoplastic. In some cases, the cured or partially cured polymer or material may remain thermoelastic properties, in that it is possible to partially soften and mold the polymer or material at elevated temperatures and/or pressures, but it is not possible to melt the polymer or material. The curing can be promoted, for example, with the use of high pressure and/or a catalyst. In many examples, the curing process is irreversible since it results in cross-linking and/or polymerization reactions of the precursors. The uncured or partially cured polymers or materials can be malleable or liquid prior to curing. In some cases, the uncured or partially cured polymers or materials can be molded into their final shape, or used as adhesives.

Once hardened, a thermoset polymer or material cannot be re-melted in order to be reshaped. The textured surface can be formed by partially or fully curing an uncured precursor material to lock in the textured surface.

Polyurethane

The polymer can be a polyurethane, such as a thermoplastic polyurethane (also referred to as "TPU"). Alternatively, the polymer can be a thermoset polyurethane. Additionally, polyurethane can be an elastomeric polyurethane, including an elastomeric TPU or an elastomeric thermoset polyurethane. The elastomeric polyurethane can include hard and soft segments. The hard segments can comprise or consist of urethane segments (e.g., isocyanate-derived segments). The soft segments can comprise or consist of alkoxy segments (e.g., polyol-derived segments including polyether segments, or polyester segments, or a combination of polyether segments and polyester segments). The polyurethane can comprise or consist essentially of an elastomeric polyurethane having repeating hard segments and repeating soft segments.

One or more of the polyurethanes can be produced by polymerizing one or more isocyanates with one or more polyols to produce polymer chains having carbamate linkages. The portions of the polyurethane polymer chain formed by the segments derived from isocyanates can be referred to as the hard segments, while the portions derived from polyols can be referred to as soft segments. Optionally, the isocyanates can also be chain extended with one or more chain extenders to bridge two or more isocyanates, increasing the length of the hard segments.

Examples of suitable aliphatic diisocyanates for producing the polyurethane polymer chains include hexamethylene diisocyanate (HDI), isophorone diisocyanate (IPDI), butylenediisocyanate (BDI), bisisocyanatocyclohexylmethane (HMDI), 2,2,4-trimethylhexamethylene diisocyanate (TMDI), bisisocyanatomethylcyclohexane, bisisocyanatomethyltricyclodecane, norbomane diisocyanate (NDI), cyclohexane diisocyanate (CHDI), 4,4'-dicyclohexylmethane diisocyanate (H12MDI), diisocyanatododecane, lysine diisocyanate, and combinations thereof.

The isocyanate-derived segments can include segments derived from aliphatic diisocyanate. A majority of the isocyanate-derived segments can comprise segments derived from aliphatic diisocyanates. At least 90% of the isocyanate-derived segments are derived from aliphatic diisocyanates. The isocyanate-derived segments can consist essentially of segments derived from aliphatic diisocyanates. The aliphatic diisocyanate-derived segments can be derived substantially (e.g., about 50 percent or more, about 60 percent or more, about 70 percent or more, about 80 percent or more, about 90 percent or more) from linear aliphatic diisocyanates. At least 80% of the aliphatic diisocyanate-derived segments can be derived from aliphatic diisocyanates that are free of side chains. The segments derived from aliphatic diisocyanates can include linear aliphatic diisocyanates having from 2 to 10 carbon atoms.

Examples of suitable aromatic diisocyanates for producing the polyurethane polymer chains include toluene diisocyanate (TDI), TDI adducts with trimethyloylpropane (TMP), methylene diphenyl diisocyanate (MDI), xylene diisocyanate (XDI), tetramethylxylylene diisocyanate (TMXDI), hydrogenated xylene diisocyanate (HXDI), naphthalene 1,5-diisocyanate (NDI), 1,5-tetrahydronaphthalene diisocyanate, para-phenylene diisocyanate (PPDI), 3,3'-dimethyldiphenyl-4, 4'-diisocyanate (DDDI), 4,4'-dibenzyl diisocyanate (DBDI), 4-chloro-1,3-phenylene diisocyanate, and combinations thereof. The polymer chains can be substantially free of aromatic groups.

The polyurethane polymer chains can be produced from diisocyanates including HMDI, TDI, MDI, H12 aliphatics, and combinations thereof. For example, the polyurethane can comprise one or more polyurethane polymer chains produced from diisocyanates including HMDI, TDI, MDI, H12 aliphatics, and combinations thereof.

Polyurethane chains which are at least partially crosslinked or which can be crosslinked, can be used in accordance with the present disclosure. It is possible to produce crosslinked or crosslinkable polyurethane chains by reacting multi-functional isocyanates to form the polyurethane. Examples of suitable triisocyanates for producing the polyurethane chains include TDI, HDI, and IPDI adducts with trimethyloylpropane (TMP), uretdiones (i.e., dimerized isocyanates), polymeric MDI, and combinations thereof.

Polyamides

The polymer can comprise a polyamide, such as a thermoplastic polyamide, or a thermoset polyamide. The polyamide can be an elastomeric polyamide, including an elastomeric thermoplastic polyamide or an elastomeric thermoset polyamide. The polyamide can be a polyamide homopolymer having repeating polyamide segments of the same chemical structure. Alternatively, the polyamide can comprise a number of polyamide segments having different polyamide chemical structures (e.g., polyamide 6 segments, polyamide 11 segments, polyamide 12 segments, polyamide 66 segments, etc.). The polyamide segments having different chemical structure can be arranged randomly, or can be arranged as repeating blocks.

The polyamide can be a co-polyamide (i.e., a co-polymer including polyamide segments and non-polyamide segments). The polyamide segments of the co-polyamide can comprise or consist of polyamide 6 segments, polyamide 11 segments, polyamide 12 segments, polyamide 66 segments, or any combination thereof. The polyamide segments of the co-polyamide can be arranged randomly, or can be arranged as repeating segments. The polyamide segments can comprise or consist of polyamide 6 segments, or polyamide 12 segments, or both polyamide 6 segment and polyamide 12 segments. In the example where the polyamide segments of the co-polyamide include of polyamide 6 segments and polyamide 12 segments, the segments can be arranged randomly. The non-polyamide segments of the co-polyamide can comprise or consist of polyether segments, polyester segments, or both polyether segments and polyester segments. The co-polyamide can be a block co-polyamide, or can be a random co-polyamide. The copolyamide can be formed from the polycondensation of a polyamide oligomer or prepolymer with a second oligomer prepolymer to form a copolyamide (i.e., a co-polymer including polyamide segments. Optionally, the second prepolymer can be a hydrophilic prepolymer.

The polyamide can be a polyamide-containing block co-polymer. For example, the block co-polymer can have repeating hard segments, and repeating soft segments. The hard segments can comprise polyamide segments, and the soft segments can comprise non-polyamide segments. The polyamide-containing block co-polymer can be an elastomeric co-polyamide comprising or consisting of polyamide-containing block co-polymers having repeating hard segments and repeating soft segments. In block co-polymers, including block co-polymers having repeating hard segments and soft segments, physical crosslinks can be present within the segments or between the segments or both within and between the segments.

The polyamide itself, or the polyamide segment of the polyamide-containing block co-polymer can be derived from the condensation of polyamide prepolymers, such as lactams, amino acids, and/or diamino compounds with dicarboxylic acids, or activated forms thereof. The resulting polyamide segments include amide linkages (—(CO)NH—). The term "amino acid" refers to a molecule having at least one amino group and at least one carboxyl group. Each polyamide segment of the polyamide can be the same or different.

The polyamide or the polyamide segment of the polyamide-containing block co-polymer can be derived from the polycondensation of lactams and/or amino acids.

The polyamide can be a thermoplastic polyamide and the constituents of the polyamide block and their proportion can be chosen in order to obtain a melting temperature of less than 150 degrees C., such as a melting point of from about 90 degrees C. to about 135 degrees C. The various constituents of the thermoplastic polyamide block and their proportion can be chosen in order to obtain a melting point of less than 150 degrees C., such as from about and 90 degrees C. to about 135 degrees C.

Exemplary commercially available copolymers include, but are not limited to, those available under the tradenames of "VESTAMID" (Evonik Industries, Essen, Germany); "PLATAMID" (Arkema, Colombes, France), e.g., product code H2694; "PEBAX" (Arkema), e.g., product code "PEBAX MH1657" and "PEBAX MV1074"; "PEBAX RNEW" (Arkema); "GRILAMID" (EMS-Chemle AG, Domat-Ems, Switzerland), or also to other similar materials produced by various other suppliers.

The polyamide can be physically crosslinked through, e.g., nonpolar or polar interactions between the polyamide groups of the polymers. In examples where the polyamide is a copolyamide, the copolyamide can be physically crosslinked through interactions between the polyamide groups, and optionally by interactions between the copolymer groups. When the co-polyamide is physically crosslinked through interactions between the polyamide groups, the polyamide segments can form the portion of the polymer referred to as the hard segment, and copolymer segments can form the portion of the polymer referred to as the soft segment. For example, when the copolyamide is a poly(ether-block-amide), the polyamide segments form the hard segments of the polymer, and polyether segments form the soft segments of the polymer. Therefore, in some examples, the polymer can include a physically crosslinked polymeric network having one or more polymer chains with amide linkages.

The polyamide segment of the co-polyamide can include polyamide-11 or polyamide-12 and the polyether segment can be a segment selected from the group consisting of polyethylene oxide, polypropylene oxide, and polytetramethylene oxide segments, and combinations thereof.

The polyamide can be partially or fully covalently crosslinked, as previously described herein. In some cases, the degree of crosslinking present in the polyamide is such that, when it is thermally processed, e.g., in the form of a yarn or fiber to form the articles of the present disclosure, the partially covalently crosslinked thermoplastic polyamide retains sufficient thermoplastic character that the partially covalently crosslinked thermoplastic polyamide is melted during the processing and re-solidifies. In other cases, the crosslinked polyamide is a thermoset polymer.

Polyesters

The polymers can comprise a polyester. The polyester can comprise a thermoplastic polyester, or a thermoset polyester. Additionally, the polyester can be an elastomeric polyester, including a thermoplastic polyester or a thermoset elastomeric polyester. The polyester can be formed by reaction of one or more carboxylic acids, or its ester-forming derivatives, with one or more bivalent or multivalent aliphatic, alicyclic, aromatic or aralphatic alcohols or a bisphenol. The polyester can be a polyester homopolymer having repeating polyester segments of the same chemical structure. Alternatively, the polyester can comprise a number of polyester segments having different polyester chemical structures (e.g., polyglycolic acid segments, polylactic acid segments, polycaprolactone segments, polyhydroxyalkanoate segments, polyhydroxybutyrate segments, etc.). The polyester segments having different chemical structure can be arranged randomly, or can be arranged as repeating blocks.

Exemplary carboxylic acids that can be used to prepare a polyester include, but are not limited to, adipic acid, pimelic acid, suberic acid, azelaic acid, sebacic acid, nonane dicarboxylic acid, decane dicarboxylic acid, undecane dicarboxylic acid, terephthalic acid, isophthalic acid, alkyl-substituted or halogenated terephthalic acid, alkyl-substituted or halogenated isophthalic acid, nitro-terephthalic acid, 4,4'-diphenyl ether dicarboxylic acid, 4,4'-diphenyl thioether dicarboxylic acid, 4,4'-diphenyl sulfone-dicarboxylic acid, 4,4'-diphenyl alkylenedicarboxylic acid, naphthalene-2,6-dicarboxylic acid, cyclohexane-1,4-dicarboxylic acid and cyclohexane-1,3-dicarboxylic acid. Exemplary diols or phenols suitable for the preparation of the polyester include, but are not limited to, ethylene glycol, diethylene glycol, 1,3-propanediol, 1,4-butanediol, 1,6-hexanediol, 1,8-octanediol, 1,10-decanediol, 1,2-propanediol, 2,2-dimethyl-1,3-propanediol, 2,2,4-trimethylhexanediol, p-xylenediol, 1,4-cyclohexanediol, 1,4-cyclohexane dimethanol, and bis-phenol A.

The polyester can be a polybutylene terephthalate (PBT), a polytrimethylene terephthalate, a polyhexamethylene terephthalate, a poly-1,4-dimethylcyclohexane terephthalate, a polyethylene terephthalate (PET), a polyethylene isophthalate (PEI), a polyarylate (PAR), a polybutylene naphthalate (PBN), a liquid crystal polyester, or a blend or mixture of two or more of the foregoing.

The polyester can be a co-polyester (i.e., a co-polymer including polyester segments and non-polyester segments). The co-polyester can be an aliphatic co-polyester (i.e., a co-polyester in which both the polyester segments and the non-polyester segments are aliphatic). Alternatively, the co-polyester can include aromatic segments. The polyester segments of the co-polyester can comprise or consist essentially of polyglycolic acid segments, polylactic acid segments, polycaprolactone segments, polyhydroxyalkanoate segments, polyhydroxybutyrate segments, or any combination thereof. The polyester segments of the co-polyester can be arranged randomly, or can be arranged as repeating blocks.

For example, the polyester can be a block co-polyester having repeating blocks of polymeric units of the same chemical structure which are relatively harder (hard segments), and repeating blocks of the same chemical structure which are relatively softer (soft segments). In block co-polyesters, including block co-polyesters having repeating hard segments and soft segments, physical crosslinks can be present within the blocks or between the blocks or both within and between the blocks. The polymer can comprise or consist essentially of an elastomeric co-polyester having repeating blocks of hard segments and repeating blocks of soft segments.

The non-polyester segments of the co-polyester can comprise or consist essentially of polyether segments, polyamide segments, or both polyether segments and polyamide segments. The co-polyester can be a block co-polyester, or can be a random co-polyester.

The co-polyester can be formed from the polycondensation of a polyester oligomer or prepolymer with a second oligomer prepolymer to form a block copolyester. Optionally, the second prepolymer can be a hydrophilic prepolymer. For example, the co-polyester can be formed from the polycondensation of terephthalic acid or naphthalene dicarboxylic acid with ethylene glycol, 1,4-butanediol, or 1,3-propanediol. Examples of co-polyesters include polyethylene adipate, polybutylene succinate, poly(3-hydroxybutyrate-co-3-hydroxyvalerate), polyethylene terephthalate, polybutylene terephthalate, polytrimethylene terephthalate, polyethylene napthalate, and combinations thereof. The co-polyamide can comprise or consist of polyethylene terephthalate.

The polyester can be a block copolymer comprising segments of one or more of polybutylene terephthalate (PBT), a polytrimethylene terephthalate, a polyhexamethylene terephthalate, a poly-1,4-dimethylcyclohexane terephthalate, a polyethylene terephthalate (PET), a polyethylene isophthalate (PEI), a polyarylate (PAR), a polybutylene naphthalate (PBN), and a liquid crystal polyester. For example, a suitable polyester that is a block copolymer can be a PET/PEI copolymer, a polybutylene terephthalate/tetraethylene glycol copolymer, a polyoxyalkylenediimide diacid/polybutylene terephthalate copolymer, or a blend or mixture of any of the foregoing.

Polyolefins

The polymers can comprise or consist essentially of a polyolefin. The polyolefin can be a thermoplastic polyolefin or a thermoset polyolefin. Additionally, the polyolefin can be an elastomeric polyolefin, including a thermoplastic elastomeric polyolefin or a thermoset elastomeric polyolefin. Exemplary polyolefins can include polyethylene, polypropylene, and olefin elastomers (e.g., metallocene-catalyzed block copolymers of ethylene and α-olefins having 4 to about 8 carbon atoms). The polyolefin can be a polymer comprising a polyethylene, an ethylene-α-olefin copolymer, an ethylene-propylene rubber (EPDM), a polybutene, a polyisobutylene, a poly-4-methylpent-1-ene, a polyisoprene, a polybutadiene, a ethylene-methacrylic acid copolymer, and an olefin elastomer such as a dynamically crosslinked polymer obtained from polypropylene (PP) and an ethylene-propylene rubber (EPDM), and blends or mixtures of the foregoing. Further exemplary polyolefins include polymers of cycloolefins such as cyclopentene or norbornene.

It is to be understood that polyethylene, which optionally can be crosslinked, is inclusive a variety of polyethylenes, including low density polyethylene (LDPE), linear low density polyethylene (LLDPE), (VLDPE) and (ULDPE), medium density polyethylene (MDPE), high density polyethylene (HDPE), high density and high molecular weight polyethylene (HDPE-HMW), high density and ultrahigh molecular weight polyethylene (HDPE-UHMW), and blends or mixtures of any the foregoing polyethylenes. A polyethylene can also be a polyethylene copolymer derived from monomers of monolefins and diolefins copolymerized with a vinyl, acrylic acid, methacrylic acid, ethyl acrylate, vinyl alcohol, and/or vinyl acetate. Polyolefin copolymers comprising vinyl acetate-derived units can be a high vinyl acetate content copolymer, e.g., greater than about 50 weight percent vinyl acetate-derived composition.

The polyolefin can be a mixture of polyolefins, such as a mixture of two or more polyolefins disclosed herein above. For example, a suitable mixture of polyolefins can be a mixture of polypropylene with polyisobutylene, polypropylene with polyethylene (for example PP/HDPE, PP/LDPE) or mixtures of different types of polyethylene (for example LDPE/HDPE).

The polyolefin can be a copolymer of suitable monolefin monomers or a copolymer of a suitable monolefin monomer and a vinyl monomer. Exemplary polyolefin copolymers include ethylene/propylene copolymers, linear low density polyethylene (LLDPE) and mixtures thereof with low density polyethylene (LDPE), propylene/but-1-ene copolymers, propylene/isobutylene copolymers, ethylene/but-1-ene copolymers, ethylene/hexene copolymers, ethylene/methylpentene copolymers, ethylene/heptene copolymers, ethylene/octene copolymers, propylene/butadiene copolymers, isobutylenefisoprene copolymers, ethylene/alkyl acrylate copolymers, ethylene/alkyl methacrylate copolymers, ethylene/vinyl acetate copolymers and their copolymers with carbon monoxide or ethylene/acrylic acid copolymers and their salts (ionomers) as well as terpolymers of ethylene with propylene and a diene such as hexadiene, dicyclopentadiene or ethylidene-norbornene; and mixtures of such copolymers with one another and with polymers mentioned in 1) above, for example polypropylene/ethylene-propylene copolymers, LDPE/ethylene-vinyl acetate copolymers (EVA), LDPE/ethylene-acrylic acid copolymers (EAA), LLDPE/EVA, LLDPE/EAA and alternating or random polyalkylene/carbon monoxide copolymers and mixtures thereof with other polymers, for example polyamides.

The polyolefin can be a polypropylene homopolymer, a polypropylene copolymers, a polypropylene random copolymer, a polypropylene block copolymer, a polyethylene homopolymer, a polyethylene random copolymer, a polyethylene block copolymer, a low density polyethylene (LDPE), a linear low density polyethylene (LLDPE), a medium density polyethylene, a high density polyethylene (HDPE), or blends or mixtures of one or more of the preceding polymers.

The polyolefin can be a polypropylene. The term "polypropylene," as used herein, is intended to encompass any polymeric composition comprising propylene monomers, either alone or in mixture or copolymer with other randomly selected and oriented polyolefins, dienes, or other monomers (such as ethylene, butylene, and the like). Such a term also encompasses any different configuration and arrangement of the constituent monomers (such as atactic, syndiotactic, isotactic, and the like). Thus, the term as applied to fibers is intended to encompass actual long strands, tapes, threads, and the like, of drawn polymer. The polypropylene can be of any standard melt flow (by testing); however, standard fiber grade polypropylene resins possess ranges of Melt Flow Indices between about 1 and 1000.

The polyolefin can be a polyethylene. The term "polyethylene," as used herein, is intended to encompass any polymeric composition comprising ethylene monomers, either alone or in mixture or copolymer with other randomly selected and oriented polyolefins, dienes, or other monomers (such as propylene, butylene, and the like). Such a term also encompasses any different configuration and arrangement of the constituent monomers (such as atactic, syndiotactic, isotactic, and the like). Thus, the term as applied to fibers is intended to encompass actual long strands, tapes, threads, and the like, of drawn polymer. The polyethylene can be of any standard melt flow (by testing); however, standard fiber grade polyethylene resins possess ranges of Melt Flow Indices between about 1 and 1000.

The thermoplastic and/or thermosetting material can further comprise one or more processing aids. The processing aid can be a non-polymeric material. These processing aids can be independently selected from the group including, but not limited to, curing agents, initiators, plasticizers, mold release agents, lubricants, antioxidants, flame retardants, dyes, pigments, reinforcing and non-reinforcing fillers, fiber reinforcements, and light stabilizers.

In articles that include a textile, the optical element can be disposed onto the textile (e.g., the optical element is likely in the "on its side" configuration unless the textile is thin or otherwise the first side of the optical element can be illuminated). The textile or at least an outer layer of the textile can includes a thermoplastic material that the optical element can disposed onto. The textile can be a nonwoven textile, a synthetic leather, a knit textile, or a woven textile. The textile can comprise a first fiber or a first yarn, where the first fiber or the first yarn can include at least an outer layer formed of the first thermoplastic material. A region of the first or second side of the structure onto which the optical element is disposed can include the first fiber or the first yarn in a non-filamentous conformation. The optical element can be disposed onto the textile or the textile can be processed so that the optical element can be disposed onto the textile. The textured surface can be made of or formed from the textile surface. The textile surface can be used to form the textured surface, and either before or after this, the optical element can be applied to the textile.

A "textile" may be defined as any material manufactured from fibers, filaments, or yarns characterized by flexibility, fineness, and a high ratio of length to thickness. Textiles generally fall into two categories. The first category includes textiles produced directly from webs of filaments or fibers by randomly interlocking to construct non-woven fabrics and felts. The second category includes textiles formed through a mechanical manipulation of yarn, thereby producing a woven fabric, a knitted fabric, a braided fabric, a crocheted fabric, and the like.

The terms "filament," "fiber," or "fibers" as used herein refer to materials that are in the form of discrete elongated pieces that are significantly longer than they are wide. The fiber can include natural, manmade or synthetic fibers. The fibers may be produced by conventional techniques, such as extrusion, electrospinning, interfacial polymerization, pulling, and the like. The fibers can include carbon fibers, boron fibers, silicon carbide fibers, titania fibers, alumina fibers, quartz fibers, glass fibers, such as E, A, C, ECR, R, S, D, and NE glasses and quartz, or the like. The fibers can be fibers formed from synthetic polymers capable of forming fibers such as poly(ether ketone), polyimide, polybenzoxazole, poly(phenylene sulfide), polyesters, polyolefins (e.g., polyethylene, polypropylene), aromatic polyamides (e.g., an aramid polymer such as para-aramid fibers and meta-aramid fibers), aromatic polyimides, polybenzimidazoles, polyetherimides, polytetrafluoroethylene, acrylic, modacrylic, poly(vinyl alcohol), polyamides, polyurethanes, and copolymers such as polyether-polyurea copolymers, polyester-polyurethanes, polyether block amide copolymers, or the like. The fibers can be natural fibers (e.g., silk, wool, cashmere, vicuna, cotton, flax, hemp, jute, sisal). The fibers can be man-made fibers from regenerated natural polymers, such as rayon, lyocell, acetate, triacetate, rubber, and poly (lactic acid).

The fibers can have an indefinite length. For example, man-made and synthetic fibers are generally extruded in substantially continuous strands. Alternatively, the fibers can be staple fibers, such as, for example, cotton fibers or extruded synthetic polymer fibers can be cut to form staple fibers of relatively uniform length. The staple fiber can have a have a length of about 1 millimeter to 100 centimeters or more as well as any increment therein (e.g., 1 millimeter increments).

The fiber can have any of a variety of cross-sectional shapes. Natural fibers can have a natural cross-section, or can have a modified cross-sectional shape (e.g., with processes such as mercerization). Man-made or synthetic fibers can be extruded to provide a strand having a predetermined cross-sectional shape. The cross-sectional shape of a fiber can affect its properties, such as its softness, luster, and wicking ability. The fibers can have round or essentially round cross sections. Alternatively, the fibers can have non-round cross sections, such as flat, oval, octagonal, rectangular, wedge-shaped, triangular, dog-bone, multi-lobal, multi-channel, hollow, core-shell, or other shapes.

The fiber can be processed. For example, the properties of fibers can be affected, at least in part, by processes such as drawing (stretching) the fibers, annealing (hardening) the fibers, and/or crimping or texturizing the fibers.

In some cases a fiber can be a multi-component fiber, such as one comprising two or more co-extruded polymeric materials. The two or more co-extruded polymeric materials can be extruded in a core-sheath, islands-in-the-sea, segmented-pie, striped, or side-by-side configuration. A multi-component fiber can be processed in order to form a plurality of smaller fibers (e.g., microfibers) from a single fiber, for example, by remove a sacrificial material.

The fiber can be a carbon fiber such as TARIFYL produced by Formosa Plastics Corp. of Kaohsiung City, Taiwan, (e.g., 12,000, 24,000, and 48,000 fiber tows, specifically fiber types TC-35 and TC-35R), carbon fiber produced by SGL Group of Wiesbaden, Germany (e.g., 50,000 fiber tow), carbon fiber produced by Hyosung of Seoul, South Korea, carbon fiber produced by Toho Tenax of Tokyo, Japan, fiberglass produced by Jushi Group Co., LTD of Zhejiang, China (e.g., E6, 318, silane-based sizing, filament diameters 14, 15, 17, 21, and 24 micrometers), and polyester fibers produced by Amann Group of Bonningheim, Germany (e.g., SERAFILE 200/2 non-lubricated polyester filament and SERAFILE COMPHIL 200/2 lubricated polyester filament).

A plurality of fibers includes 2 to hundreds or thousands or more fibers. The plurality of fibers can be in the form of bundles of strands of fibers, referred to as tows, or in the form of relatively aligned staple fibers referred to as sliver and roving. A single type fiber can be used either alone or in combination with one or more different types of fibers by co-mingling two or more types of fibers. Examples of co-mingled fibers include polyester fibers with cotton fibers, glass fibers with carbon fibers, carbon fibers with aromatic polyimide (aramid) fibers, and aromatic polyimide fibers with glass fibers.

As used herein, the term "yarn" refers to an assembly formed of one or more fibers, wherein the strand has a substantial length and a relatively small cross-section, and is suitable for use in the production of textiles by hand or by machine, including textiles made using weaving, knitting, crocheting, braiding, sewing, embroidery, or ropemaking techniques. Thread is a type of yarn commonly used for sewing.

Yarns can be made using fibers formed of natural, man-made and synthetic materials. Synthetic fibers are most commonly used to make spun yarns from staple fibers, and filament yarns. Spun yarn is made by arranging and twisting staple fibers together to make a cohesive strand. The process of forming a yarn from staple fibers typically includes carding and drawing the fibers to form sliver, drawing out and twisting the sliver to form roving, and spinning the roving to form a strand. Multiple strands can be plied (twisted together) to make a thicker yarn. The twist direction of the staple fibers and of the plies can affect the final properties of the yarn. A filament yarn can be formed of a single long, substantially continuous filament, which is conventionally referred to as a "monofilament yarn," or a plurality of individual filaments grouped together. A filament yarn can also be formed of two or more long, substantially continuous filaments which are grouped together by grouping the filaments together by twisting them or entangling them or both. As with staple yarns, multiple strands can be plied together to form a thicker yarn.

Once formed, the yarn can undergo further treatment such as texturizing, thermal or mechanical treating, or coating with a material such as a synthetic polymer. The fibers, yarns, or textiles, or any combination thereof, used in the disclosed articles can be sized. Sized fibers, yarns, and/or textiles are coated on at least part of their surface with a sizing composition selected to change the absorption or wear characteristics, or for compatibility with other materials. The sizing composition facilitates wet-out and wet-through of the coating or resin upon the surface and assists in attaining desired physical properties in the final article. An exemplary sizing composition can comprise, for example, epoxy polymers, urethane-modified epoxy polymers, polyester polymers, phenol polymers, polyamide polymers, polyurethane polymers, polycarbonate polymers, polyetherimide polymers, polyamideimide polymers, polystylylpyridine polymers, polyimide polymers bismaleimide polymers, polysulfone polymers, polyethersulfone polymers, epoxy-modified urethane polymers, polyvinyl alcohol polymers, polyvinyl pyrrolidone polymers, and mixtures thereof.

Two or more yarns can be combined, for example, to form composite yarns such as single- or double-covered yarns, and corespun yarns. Accordingly, yarns may have a variety of configurations that generally conform to the descriptions provided herein.

The yarn can comprise at least one thermoplastic material (e.g., one or more of the fibers can be made of thermoplastic material). The yarn can be made of a thermoplastic material. The yarn can be coated with a layer of a material such as a thermoplastic material.

The linear mass density or weight per unit length of a yarn can be expressed using various units, including denier (D) and tex. Denier is the mass in grams of 9000 meters of yarn. The linear mass density of a single filament of a fiber can also be expressed using denier per filament (DPF). Tex is the mass in grams of a 1000 meters of yarn. Decitex is another measure of linear mass, and is the mass in grams for a 10,000 meters of yarn.

As used herein, tenacity is understood to refer to the amount of force (expressed in units of weight, for example: pounds, grams, centinewtons or other units) needed to break a yarn (i.e., the breaking force or breaking point of the yarn), divided by the linear mass density of the yarn expressed, for example, in (unstrained) denier, decitex, or some other measure of weight per unit length. The breaking force of the yarn is determined by subjecting a sample of the yarn to a known amount of force, for example, using a strain gauge load cell such as an INSTRON brand testing system (Norwood, MA, USA). Yarn tenacity and yarn breaking force are distinct from burst strength or bursting strength of a textile, which is a measure of how much pressure can be applied to the surface of a textile before the surface bursts.

Generally, in order for a yarn to withstand the forces applied in an industrial knitting machine, the minimum tenacity required is approximately 1.5 grams per Denier. Most yarns formed from commodity polymeric materials generally have tenacities in the range of about 1.5 grams per Denier to about 4 grams per Denier. For example, polyester yarns commonly used in the manufacture of knit uppers for footwear have tenacties in the range of about 2.5 to about 4 grams per Denier. Yarns formed from commodity polymeric materials which are considered to have high tenacities generally have tenacities in the range of about 5 grams per Denier to about 10 grams per Denier. For example, commercially available package dyed polyethylene terephthalate yarn from National Spinning (Washington, NC, USA) has a tenacity of about 6 grams per Denier, and commercially available solution dyed polyethylene terephthalate yarn from Far Eastern New Century (Taipei, Taiwan) has a tenacity of about 7 grams per Denier. Yarns formed from high performance polymeric materials generally have tenacities of about 11 grams per Denier or greater. For example, yarns formed of aramid fiber typically have tenacities of about 20 grams per Denier, and yarns formed of ultra-high molecular weight polyethylene (UHMWPE) having tenacities greater than 30 grams per Denier are available from Dyneema (Stanley, NC, USA) and Spectra (Honeywell-Spectra, Colonial Heights, VA, USA).

Various techniques exist for mechanically manipulating yarns to form a textile. Such techniques include, for example, interweaving, intertwining and twisting, and interlooping. Interweaving is the intersection of two yarns that cross and interweave at right angles to each other. The yarns utilized in interweaving are conventionally referred to as "warp" and "wet." A woven textile includes include a warp yarn and a weft yarn. The warp yarn extends in a first direction, and the weft strand extends in a second direction that is substantially perpendicular to the first direction. Intertwining and twisting encompasses various procedures, such as braiding and knotting, where yarns intertwine with each other to form a textile. Interlooping involves the formation of a plurality of columns of intermeshed loops, with knitting being the most common method of interlooping. The textile may be primarily formed from one or more yarns that are mechanically-manipulated, for example, through interweaving, intertwining and twisting, and/or interlooping processes, as mentioned above.

The textile can be a nonwoven textile. Generally, a nonwoven textile or fabric is a sheet or web structure made from fibers and/or yarns that are bonded together. The bond can be a chemical and/or mechanical bond, and can be formed using heat, solvent, adhesive or a combination thereof. Exemplary nonwoven fabrics are flat or tufted porous sheets that are made directly from separate fibers, molten plastic and/or plastic film. They are not made by weaving or knitting and do not necessarily require converting the fibers to yarn, although yarns can be used as a source of the fibers. Nonwoven textiles are typically manufactured by putting small fibers together in the form of a sheet or web (similar to paper on a paper machine), and then binding them either mechanically (as in the case of felt, by interlocking them with serrated or barbed needles, or hydro-entanglement such that the inter-fiber friction results in a stronger fabric), with an adhesive, or thermally (by applying binder (in the form of powder, paste, or polymer melt) and melting the binder onto the web by increasing temperature). A nonwoven textile can be made from staple fibers (e.g., from wetlaid, airlaid, carding/crosslapping processes), or extruded fibers (e.g., from meltblown or spunbond processes, or a combination thereof), or a combination thereof. Bonding of the fibers in the nonwoven textile can be achieved with thermal bonding (with or without calendering), hydro-entanglement, ultrasonic bonding, needlepunching (needlefelting), chemical bonding (e.g., using binders such as latex emulsions or solution polymers or binder fibers or powders), meltblown bonding (e.g., fiber is bonded as air attenuated fibers intertangle during simultaneous fiber and web formation).

Now having described various aspects of the present disclosure, additional discussion is provided regarding when the optical element is used in conjunction with a bladder. The bladder can be unfilled, partially inflated, or fully inflated when the optical element is disposed onto the bladder. The bladder is a bladder capable of including a volume of a fluid. An unfilled bladder is a fluid-fillable bladder and a filled bladder that has been at least partially inflated with a fluid at a pressure equal to or greater than atmospheric pressure. When disposed onto or incorporated into an article of footwear, apparel, or sports equipment, the bladder is generally, at that point, a fluid-filled bladder. The fluid be a gas or a liquid. The gas can include air, nitrogen gas ($N_2$), or other appropriate gas.

The bladder can have a gas transmission rate for nitrogen gas, for example, where a bladder wall of a given thickness has a gas transmission rate for nitrogen that is at least about ten times lower than the gas transmission rate for nitrogen of a butyl rubber layer of substantially the same thickness as the thickness of the bladder described herein. The bladder can have a first bladder wall having a first bladder wall thickness (e.g., about 0.1 to 40 mils). The bladder can have a first bladder wall that can have a gas transmission rate (GTR) for nitrogen gas of less than about 15 $cm^3/m^2 \cdot atm \cdot day$, less than about 10 $m^3/m^2 \cdot atm \cdot day$, less than about 5 $cm^3/m^2 \cdot atm \cdot day$, less than about 1 $cm^3/m^2 \cdot atm \cdot day$ (e.g., from about 0.001 $cm^3/m^2 \cdot atm \cdot day$ to about 1 $cm^3/m^2 \cdot atm \cdot day$, about 0.01 $cm^3/m^2 \cdot atm \cdot day$ to about 1 $cm^3/m^2 \cdot atm \cdot day$ or about 0.1 $cm^3/m^2 \cdot atm \cdot day$ to about 1 $cm^3/m^2 \cdot atm \cdot day$) for an average wall thickness of 20 mils. The bladder can have a first bladder wall having a first bladder wall thickness, where the first bladder wall has a gas transmission rate of 15 $cm^3/m^2 \cdot atm \cdot day$ or less for nitrogen for an average wall thickness of 20 mils.

In an aspect, the bladder has a bladder wall having an interior-facing side and an exterior (or externally)-facing side, where the interior (or internally)-facing side defines at least a portion of an interior region of the bladder. The optical element having a first side and a second opposing side can be disposed on the exterior-facing side of the bladder, the interior-facing side of the bladder, or both. The optical element can be disposed in-line or on its side. Where the optical element is disposed on its side, the optical element is disposed on the interior-facing side or the exterior-facing side on its side configuration as opposed to in line configuration.

The exterior-facing side of the bladder, the interior-facing side of the bladder, or both can optionally include a plurality of topographical structures (or profile features) extending from the exterior-facing side of the bladder wall, the interior-facing side of the bladder, or both, where the first side or the second side of the optical element is disposed on the exterior-facing side of the bladder wall and covering the plurality of topographical structures, the interior-facing side of the bladder wall and covering the plurality of topographical structures, or both, and wherein the optical element imparts a structural color to the bladder wall.

In a particular aspect, the bladder can include a top wall operably secured to the footwear upper, a bottom wall opposite the top wall, and one or more sidewalls extending between the top wall and the bottom wall of the inflated bladder. The top wall, the bottom wall, and the one or more sidewalls collectively define an interior region of the inflated bladder, and wherein the one or more sidewalls each comprise an exterior-facing side. The optical element having a first side and a second opposing side can be disposed on the exterior-facing side of the bladder, the interior-facing side of the bladder, or both. Optionally, the exterior-facing side of the bladder, the interior-facing side of the bladder, or both can include a plurality of topographical structures extending from the exterior-facing side of the bladder wall, the interior-facing side of the bladder, or both, where the first side or the second side of the optical element is disposed on the exterior-facing side of the bladder wall and covering the plurality of topographical structures, the interior-facing side of the bladder wall and covering the plurality of topographical structures, or both, and wherein the optical element imparts a structural color to the bladder wall.

An accepted method for measuring the relative permeance, permeability, and diffusion of inflated bladders is ASTM D-1434-82-V. See, e.g., U.S. Pat. No. 6,127,026, which is incorporated by reference as if fully set forth herein. According to ASTM D-1434-82-V, permeance, permeability and diffusion are measured by the following formulae:

Permeance (quantity of gas)/[(area)×(time)×(pressure difference)]=permeance (GTR)/(pressure difference)= $cm^3/m^2 \cdot atm \cdot day$ (i.e., 24 hours)

Permeability

[(quantity of gas)×(film thickness)][(area)×(time)× (pressure difference)]=permeability

[(GTR)×(film thickness)]/(pressure difference)= [($cm^3$)(mil)]/$m^2 \cdot atm \cdot day$ (i.e., 24 hours)

Diffusion at One Atmosphere (quantity of gas)/[(area)×(time)]=GTR=$cm^3/m^2 \cdot day$ (i.e., 24 hours)

The bladder can include a bladder wall that includes a film including at least one polymeric layer or at least two or more polymeric layers. Each of the polymeric layers can be about 0.1 to 40 mils in thickness.

The polymeric layer can be formed of polymer material such as a thermoplastic material as described above and herein and can be the thermoplastic layer upon which the optical element can be disposed and optionally upon which the textured layer can be disposed or the thermoplastic layer can be used to form the textured layer, and the like. The thermoplastic material can include an elastomeric material, such as a thermoplastic elastomeric material. The thermoplastic materials can include thermoplastic polyurethane (TPU), such as those described above and herein. The thermoplastic materials can include polyester-based TPU, polyether-based TPU, polycaprolactone-based TPU, polycarbonate-based TPU, polysiloxane-based TPU, or combinations thereof. Non-limiting examples of thermoplastic material that can be used include: "PELLETHANE" 2355-85ATP and 2355-95AE (Dow Chemical Company of Midland, MI., USA), "ELASTOLLAN" (BASF Corporation, Wyandotte, MI, USA) and "ESTANE" (Lubrizol, Brecksville, OH, USA), all of which are either ester or ether based. Additional thermoplastic material can include those described in U.S. Pat. Nos. 5,713,141; 5,952,065; 6,082,025; 6,127,026; 6,013,340; 6,203,868; and 6,321,465, which are incorporated herein by reference.

The polymeric layer can be formed of one or more of the following: ethylene-vinyl alcohol copolymers (EVOH), poly(vinyl chloride), polyvinylidene polymers and copolymers (e.g., polyvinylidene chloride), polyamides (e.g., amorphous polyamides), acrylonitrile polymers (e.g., acrylonitrile-methyl acrylate copolymers), polyurethane engineering plastics, polymethylpentene resins, ethylene-carbon monoxide copolymers, liquid crystal polymers, polyethylene terephthalate, polyether imides, polyacrylic imides, and other polymeric materials known to have relatively low gas transmission rates. Blends and alloys of these materials as well as with the TPUs described herein and optionally including combinations of polyimides and crystalline polymers, are also suitable. For instance, blends of polyimides and liquid crystal polymers, blends of polyamides and polyethylene terephthalate, and blends of polyamides with styrenics are suitable.

Specific examples of polymeric materials of the polymeric layer can include acrylonitrile copolymers such as "BAREX" resins, available from Ineos (Rolle, Switzerland); polyurethane engineering plastics such as "ISPLAST" ETPU available from Lubrizol (Brecksville, OH, USA); ethylene-vinyl alcohol copolymers marketed under the tradenames "EVAL" by Kuraray (Houston, TX, USA), "SOARNOL" by Nippon Gohsei (Hull, England), and "SELAR OH" by DuPont (Wilmington, DE, USA); polyvinylidiene chloride available from S. C. Johnson (Racine, WI, USA) under the tradename "SARAN", and from Solvay (Brussels, Belgium) under the tradename "IXAN"; liquid crystal polymers such as "VECTRA" from Celanese (Irving, TX, USA) and "XYDAR" from Solvay; "MDX6" nylon, and amorphous nylons such as "NOVAMID" X21 from Koninklijke DSM N.V (Heerlen, Netherlands), "SELAR PA" from DuPont; polyetherimides sold under the tradename "ULTEM" by SABIC (Riyadh, Saudi Arabia); poly (vinyl alcohol)s; and polymethylpentene resins available from Mitsui Chemicals (Tokyo, Japan) under the tradename "TPX".

Each polymeric layer of the film can be formed of a thermoplastic material which can include a combination of thermoplastic polymers. In addition to one or more thermoplastic polymers, the thermoplastic material can optionally include a colorant, a filler, a processing aid, a free radical scavenger, an ultraviolet light absorber, and the like. Each polymeric layer of the film can be made of a different of thermoplastic material including a different type of thermoplastic polymer.

The bladder can be made by applying heat, pressure and/or vacuum to a film. In this regard, the optical element and optionally the textured layer, and the like can be disposed, formed from, or the like prior to, during, and/or after these steps. The bladder (e.g., one or more polymeric layers) can be formed using one or more polymeric materials, and forming the bladder using one or more processing techniques including, for example, extrusion, blow molding, injection molding, vacuum molding, rotary molding, transfer molding, pressure forming, heat sealing, casting, low-pressure casting, spin casting, reaction injection molding, radio frequency (RF) welding, and the like. The bladder can be made by co-extrusion followed by heat sealing or welding to give an inflatable bladder, which can optionally include one or more valves (e.g., one way valves) that allows the bladder to be filled with the fluid (e.g., gas).

Now having described the optical element, the optional textured surface, and methods of making the article are now described. In an aspect, the method includes forming layers using one or more techniques described herein. In an aspect, the method includes forming the optical element in a layer-by-layer manner on a surface of an article such as a textile, film, fiber, or monofilament yarn, where the surface can optionally be the textured surface. Another embodiment of the present disclosure includes disposing the optical element on the substrate.

Now having described the optical element, the optional textured surface, and methods of making the article are now described. In an aspect, the method includes forming layers using one or more techniques described herein. In an aspect, the method includes forming the optical element in a layer-by-layer manner on a surface of an article such as a textile, film, fiber, or monofilament yarn, where the surface can optionally be the textured surface. Another embodiment of the present disclosure includes disposing the optical element on the substrate.

The method provides for the layers of the optical element being formed on the textured surface. Alternatively, the textured surface can be formed in/on the layer adjacent the surface of the article, and then the remaining layers are disposed thereon. As described herein, the optical element can be formed in a layer-by-layer manner, where each layer has a different index of refraction. As each layer is formed the undulations and flat regions are altered. The combination of the optional textured surface (e.g., dimensions, shape, and/or spacing of the profile elements) and the layers of the optical element (e.g., number of layers, thickness of layers, material of the layers) and the resultant undulations and planar areas impart the structural color when exposed to visible light. The method includes optionally forming a protective layer over the optical element to protect the optical element. Each layer of the optical element can be formed in turn, where each layer can be formed then after an appropriate amount of time, additional processing, cooling, or the like, the next layer of the optical element can be formed.

In an aspect, the method for making the optical element can include applying a masking element (e.g., a film, a fiber, a filament, or a yarn) above a surface of an article that creates a portion of the surface including adjacent masked and unmasked regions. Masking can include disposing, positioning, or applying a masking element onto a surface of an article or offset from the article surface, for example, at a certain distance (e.g., nanometers, micrometers, millimeters, or centimeters away based on the desired design and goal) from the article surface. The layers of the optical element can be disposed onto the surface of the article, where the mask element can alter (e.g., prevent, change the thickness of, etc) the formation of the layer(s) on the surface of the article. The masking element can then be removed to show the portion of the surface of the article that include the optical element as described herein. For example, the masking element can be used to form the optical element having the middle region (with one or more layers of the material) and the first region B and second region B with tapered layer (e.g., tapered to the middle region). The portion of the surface includes a structurally colored surface (e.g., the optical element), where the structurally colored surface includes at least a first structural color and a second structural color, where a hue, a value, a chroma, or any combination thereof of the first structural color and the second structural color are different when viewed from the same angle of observation.

In an aspect, the masking comprises placing the masking element above the surface, for example about 1 millimeter to 10 millimeters to 1 centimeter or more. The one or more layers of the optical element can be disposed to form the optical element and then the masking element is removed. In particular, applying the masking element above the surface comprises disposing the optical element at a distance from the surface of the article and between the surface of the article and a source disposing the optical element (e.g., formation of the layers), such that, during the disposing, the masking element partially blocks a portion of the surface of the article or casts a shadow onto a portion of the surface of the article.

Measurements for visible light transmittance and visible light reflectance were performed using a Shimadzu UV-2600 Spectrometer (Shimadzu Corporation, Japan). The spectrometer was calibrated using a standard prior to the measurements. The incident angle for all measurements was zero.

The visible light transmittance was the measurement of visible light (or light energy) that was transmitted through a sample material when visible light within the spectral range of 300 nanometers to 800 nanometers was directed through the material. The results of all transmittance over the range of 300 nanometers to 800 nanometers was collected and recorded. For each sample, a minimum value for the visible light transmittance was determined for this range.

The visible light reflectance was a measurement of the visible light (or light energy) that was reflected by a sample material when visible light within the spectral range of 300 nanometers to 800 nanometers was directed through the material. The results of all reflectance over the range of 300 nanometers to 800 nanometers was collected and recorded. For each sample, a minimum value for the visible light reflectance was determined for this range.

It should be emphasized that the above-described aspects of the present disclosure are merely possible examples of implementations, and are set forth only for a clear understanding of the principles of the disclosure. Many variations and modifications may be made to the above-described aspects of the disclosure without departing substantially from the spirit and principles of the disclosure. All such modifications and variations are intended to be included herein within the scope of this disclosure.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1 percent to about 5 percent" should be interpreted to include not only the explicitly recited concentration of about 0.1 weight percent to about 5 weight percent but also include individual concentrations (e.g., 1 percent, 2 percent, 3 percent, and 4 percent) and the sub-ranges (e.g., 0.5 percent, 1.1 percent, 2.2 percent, 3.3 percent, and 4.4 percent) within the indicated range. The term "about" can include traditional rounding according to significant figures of the numerical value. In addition, the phrase "about 'x' to 'y'" includes "about 'x' to about 'y'".

The term "providing", such as for "providing an article" and the like, when recited in the claims, is not intended to require any particular delivery or receipt of the provided item. Rather, the term "providing" is merely used to recite items that will be referred to in subsequent elements of the claim(s), for purposes of clarity and ease of readability.

Many variations and modifications may be made to the above-described aspects. All such modifications and variations are intended to be included herein within the scope of this disclosure and protected by the following claims.

We claim:

1. A structure comprising:
an optical element disposed on a surface of an article, wherein the optical element includes at least a first region A and a first region B disposed on a first area of the article and a second region A and a second region B disposed on a second area of the article, wherein the first region A and second region A of the optical element imparts a first structural color to the article, wherein the first region B and second region B of the optical element imparts a second structural color to the article, wherein an area between the first region B and the second region B is a middle region having a third color, wherein the first structural color, the second structural color, and the third color are each different from each other when viewed from the same angle of observation;
wherein the optical element comprises at least one layer, wherein a total number of the at least one layer in the first region A and the first region B of the optical element correspond and wherein a total number of the at least one layer in the second region A and the second region B of the optical element correspond, wherein each corresponding layer in the first region A, the first region B, the second region A and the second region B of the optical element consists essentially of the same material, wherein at least one of the layers of the first region B tapers from a first edge of the first region A to a first point of the first region B so that the thickness of the layer at the first edge of the first region A is greater than the thickness at the first point in the first region B, wherein at least one of the layers of the second region B tapers from a second edge of the second region A to a second point of the second region B so that the thickness of the layer at the second edge of the second region A is greater than the thickness at the second point in the second region B, wherein the middle region includes at least a first layer that consists essentially of the same material as one of the layers of the first region B or second region B.

2. The structure of claim 1, wherein the middle region includes at least the first layer, wherein the total number of layers in the middle region, the first region B, and the second region B of the optical element correspond, wherein each corresponding layer in the middle region, the first region B, and the second region B of the optical element consists essentially of the same material, wherein at least one of the layers of the middle region has a thickness less than the thickness of the corresponding layer in the first region A or second region A.

3. The structure of claim 1, wherein the total number of the layers in the middle region, the first region B, and the second region B of the optical element correspond, wherein each corresponding layer in the middle region, the first region B, and the second region B of the optical element consists essentially of the same material, wherein each layer of the middle region has a thickness less than the thickness of the corresponding layer in the first region A or second region A.

4. The structure of claim 1, wherein the total number of the at least first layer in the middle region is different that the total number of the at least one layer in the first region B and the second region B of the optical element.

5. The structure of claim 1, wherein at least one of the layers of the middle region has a thickness less than the thickness of the corresponding layer in the first region A or second region A.

6. The structure of claim 1, wherein each layer of the first region B tapers from a first edge of the first region A to a first point of the first region B so that the thickness of each layer at the first edge of the first region A is greater than the thickness at the first point in the first region B; and wherein each layer of the second region B tapers from a second edge of the second region A to a second point of the second region B so that the thickness of each layer at the second edge of the second region A is greater than the thickness at the second point in the second region B; wherein the middle region is between the first point and the second point.

7. The structure of claim 1, wherein at least one of the layers of the first region B tapers from the first edge of the first region A to a first ending point of said layer so that the first ending point has the thinnest thickness of each the layers in the first region B at the first ending point, wherein the first ending point is at a position where the layer terminates on another layer in the first region B; wherein at least one of the layers of the second region B tapers from the second edge of the second region A to a second ending point of said layer so that the second ending point has the thinnest thickness of each the layers in the second region B at the second ending point, wherein the second ending point is at a position where the layer terminate on another layer in the second region B.

8. The structure of claim 1, wherein at least one of the layers of the first region B tapers in a stair-step manner from the first edge of the first region A to the first point of the first region B; wherein at least one of the layers of the second region B tapers in a stair-step manner from the second edge of the second region A to the second point of the second region B; wherein the middle region is between the first point and the second point.

9. The structure of claim 1, wherein the first region B has a first region B cross section that is a stair-step cross section between a first edge and a first point; wherein the second region B has a second region B cross section that is a stair-step cross section between a second edge and a second point; wherein the middle region is between the first point and the second point.

10. The structure of claim 1, wherein at least one of the layers of the first region B does not taper from a third point to a fifth point so that the thickness from the third point to the fifth point of the first region B is substantially the same, wherein from the fifth point of the first region B to a seventh point of the first region B the layer tapers in thickness; wherein at least one of the layers of the second region B does not taper from a fourth point to a sixth point so that the thickness from the fourth point to the sixth point of the first region B is substantially the same, wherein from the sixth point of the second region B to an eight point of the second region B the layer tapers in thickness.

11. The structure claim 1, wherein each the layers of the first region B does not taper from a third point to a fifth point so that the thickness of each individual layer from the third point to the fifth point of the first region B is substantially the same, wherein each individual layer independently has a thickness that are the same or different thickness of other layers, wherein from the fifth point of the first region B to a seventh point of the first region B each layer tapers in thickness; wherein each of the layers of the second region B does not taper from a fourth point to a sixth point so that the thickness of each individual layer from the fourth point to the sixth point of the first region B is substantially the same, wherein each individual layer independently has a thickness that are the same or different thickness of other layers, wherein from the sixth point of each layer of the second region B to an eight point of each layer of the second region B each layer tapers in thickness.

12. The structure of claim 1, wherein at least one layer of the first region A has a layer first region A average thickness and at least one layer of the middle region has a layer middle region average thickness, wherein the layer middle region average thickness is about 5 to 90% of the thickness of the layer first region A average thickness.

13. The structure of claim 1, wherein the surface of the article is flat.

14. A method of making a structure, comprising: disposing the optical element of claim 1 onto the surface of the article.

* * * * *

UNITED STATES PATENT AND TRADEMARK OFFICE
CERTIFICATE OF CORRECTION

| | |
|---|---|
| PATENT NO. | : 11,987,073 B2 |
| APPLICATION NO. | : 17/333554 |
| DATED | : May 21, 2024 |
| INVENTOR(S) | : Jeremy Gantz, Kim Kovel and Yuanmin Wang |

Page 1 of 5

It is certified that error appears in the above-identified patent and that said Letters Patent is hereby corrected as shown below:

On the Title Page

At item (56) References Cited please make the following changes;
Page 5, Column 2:
The line reading "053467 dated Dec. 17, 2019)." should read --053467 dated Dec. 17, 2019.--

Page 5, Column 2:
The line reading "Iohara Ket Al: "Structurally Colored Fibers", Chemical Fibers" should read
--Iohara K et al: "Structurally Colored Fibers", Chemical Fibers--

Page 6, Column 1:
The line reading "www.modem-notoriety.com, Available online at: https:/ /www.modern-" should
read --www.modern-notoriety.com, Available online at: https:/ /www.modern- --

Page 6, Column 2:
The line reading "Written Opinion of the Inlemational Preliminary Examining Author-" should read
--Written Opinion of the International Preliminary Examining Author- --

Page 6, Column 2:
The line reading "ity for PCT/U820211034865 dated Dec. 23, 2021." should read --ity for
PCT/U82021/034865 dated Dec. 23, 2021.--

Page 6, Column 2:
The line reading "Patent Application No. PCT/U320211044893, dated Nov. 16, 2021" should read
--Patent Application No. PCT/U32021/044893, dated Nov. 16, 2021--

Signed and Sealed this
First Day of April, 2025

Coke Morgan Stewart
*Acting Director of the United States Patent and Trademark Office*

CERTIFICATE OF CORRECTION (continued)
U.S. Pat. No. 11,987,073 B2

In the Specification

Column 9, Line 39:
The line reading "thickness of the layer second region A average thickness)" should read --thickness of the layer second region A average thickness).--

Column 24, Line 50:
The line reading "structures can eliminate or after the imparted color. The" should read --structures can eliminate or alter the imparted color. The--

Column 26, Line 30:
The line reading "or transparent elements may further after the perceived" should read --or transparent elements may further alter the perceived--

Column 30, Lines 14 and 15:
The lines reading "-15 degrees. In yet another aspect, a first section can be can be considered to be multi-hued when the $\Delta E^*_{ab}$ between at" should read -- -15 degrees. In yet another aspect, a first section can be considered to be multi-hued when the $\Delta E^*_{ab}$ between at--

Column 30, Line 53:
The line reading "$[(L_1^*-L_2^*)^2+(a_1^*-a_2^*)^2+(b_1^*-b_2^*)^2]^{1/2}$, can be used to com-" should read --$[(L_1^*-L_2^*)^2+(a_1^*-a_2^*)^2+(b_1^*-b_2^*)^2]^{1/2}$, can be used to com- --

Column 31, Line 24:
The line reading "$[(L_1^*-L_2^*)^2+(a_1^*-a_2^*)^2+(b_1^*-b_2^*)^2]^{1/2}$, can be used to cor-" should read --$[(L_1^*-L_2^*)^2+(a_1^*-a_2^*)^2+(b_1^*-b_2^*)^2]^{1/2}$, can be used to cor- --

Column 33, Line 64:
The line reading "second region A) has coordinates $L_2^*$, $a_2^*$ and $b_2$. The total" should read --second region A) has coordinates $L_2^*$, $a_2^*$ and $b_2^*$. The total--

Column 34, Lines 28 and 29:
The lines reading "calculated as follows: $\Delta E^*_{ab} =[(L_1^*-L_2)^2+(a_1^*-a_2)^2+(b_1^*-b_2)^2]^{1/2}$. Generally speaking, if two structural colors" should read --calculated as follows: $\Delta E^*_{ab} =[(L_1^*-L_2)^2+(a_1^*-a_2^*)^2+(b_1^*-b_2^*)^2]^{1/2}$. Generally speaking, if two structural colors--

Column 35, Line 49:
The line reading "structural color Imparted by the first region A 412 and the" should read --structural color imparted by the first region A 412 and the--

Column 39, Line 50:
The line reading "color 694A-B (e.g., the middle region 640)" should read --color 694A-B (e.g., the middle region 640).--

CERTIFICATE OF CORRECTION (continued)
U.S. Pat. No. 11,987,073 B2

Column 43, Line 3:
The line reading "color is Imparted to the article. The optical element can also" should read --color is imparted to the article. The optical element can also--

Column 48, Line 19:
The line reading "in this range. The height of the profile features ( or depth if" should read --in this range. The height of the profile features ( or depth of--

Column 50, Line 39:
The line reading "shape (with respect to a plane parallel the first plane). The" should read --shape (with respect to a plane parallel to the first plane). The--

Column 51, Line 19:
The line reading "orthogonal to the first plane)). The profile feature can have" should read --orthogonal to the first plane). The profile feature can have--

Column 51, Line 23:
The line reading "degrees being parallel to the first plane))." should read --degrees being parallel to the first plane).--

Column 53, Line 53:
The line reading "structural color where or not the textured surface is present" should read --structural color where or not the textured surface is present.--

Column 54, Line 38:
The line reading "and like the. The polymer can be a thermoset polymer or a" should read --and the like. The polymer can be a thermoset polymer or a--

Column 57, Lines 34 and 35:
The lines reading "diisocyanate (HDI), isophorone diisocyanate (IPDI), butylenediisocyanate (BDI), bisisocyanatocyclohexylmethane" should read --diisocyanate (HDI), isophorone diisocyanate (IPDI), butylene diisocyanate (BDI), bisisocyanatocyclohexylmethane--

Column 57, Line 38:
The line reading "ethyltricyclodecane, norbomane diisocyanate (NDI), cyclo-" should read --ethyltricyclodecane, norbornane diisocyanate (NDI), cyclo- --

Column 57, Line 60:
The line reading "cyanate (TDI), TDI adducts with trimethyloylpropane" should read --cyanate (TDI), TDI adducts with trimethylolpropane--

Column 58, Line 16:
The line reading "trimethyloylpropane (TMP), uretdiones (i.e., dimerized iso-" should read --trimethylolpropane (TMP), uretdiones (i.e., dimerized iso- --

CERTIFICATE OF CORRECTION (continued)
U.S. Pat. No. 11,987,073 B2

Column 59, Line 29:
The line reading "RNEW" (Arkema); "GRILAMID" (EMS-Chemle AG," should read --RNEW" (Arkema); "GRILAMID" (EMS-Chemie AG,--

Column 61, Line 14:
The line reading "ene adipate, polybutylene succinate, poly(3-hydroxbutyrate" should read --ene adipate, polybutylene succinate, poly(3-hydroxybutyrate- --

Column 61, Line 18:
The line reading "polyethylene napthalate, and combinations thereof. The co-" should read --polyethylene naphthalate, and combinations thereof. The co- --

Column 61, Line 51:
The line reading "of cycloolefins such as cyclopentene or norbomene." should read --of cycloolefins such as cyclopentene or norbornene.--

Column 62, Line 19:
The line reading "isobutylenefisoprene copolymers, ethylene/alkyl acrylate" should read --isobutylene/isoprene copolymers, ethylene/alkyl acrylate--

Column 62, Line 25:
The line reading "or ethylidene-norbomene; and mixtures of such copolymers" should read --or ethylidene-norbornene; and mixtures of such copolymers--

Column 64, Line 31:
The line reading "example, by remove a sacrificial material." should read --example, by removing a sacrificial material.--

Column 64, Line 32:
The line reading "The fiber can be a carbon fiber such as TARIFYL pro-" should read --The fiber can be a carbon fiber such as TAIRYFIL pro- --

Column 64, Line 42:
The line reading "fibers produced by Amann Group of Bonningheim, Ger-" should read --fibers produced by Amann Group of Bonnigheim, Ger- --

Column 64, Lines 43 and 44:
The lines reading "many (e.g., SERAFILE 200/2 non-lubricated polyester filament and SERAFILE COMPHIL 200/2 lubricated polyester" should read --many (e.g., SERAFIL 200/2 non-lubricated polyester filament and SERAFIL COMPHIL 200/2 lubricated polyester--

Column 66, Line 10:
The line reading "footwear have tenacties in the range of about 2.5 to about 4" should read --footwear have tenacities in the range of about 2.5 to about 4--

CERTIFICATE OF CORRECTION (continued)
U.S. Pat. No. 11,987,073 B2

Column 66, Line 35:
The line reading ""warp" and "wet." A woven textile includes include a warp" should read --"warp" and "weft." A woven textile includes include a warp--

Column 67, Lines 6 and 7:
The lines reading "ing), hydro-entanglement, ultrasonic bonding, needlepunch-ing (needlefelting), chemical bonding (e.g., using binders" should read --ing), hydro-entanglement, ultrasonic bonding, needle punch-ing (needle felting), chemical bonding (e.g., using binders--

Column 69, Line 27:
The line reading "polyurethane engineering plastics such as "ISPLAST"" should read --polyurethane engineering plastics such as "ISOPLAST"--

Column 69, Lines 32 and 33:
The lines reading ""SELAR OH" by DuPont (Wilmington, DE, USA); polyvinylidiene chloride available from S. C. Johnson (Racine," should read --"SELAR OH" by DuPont (Wilmington, DE, USA); polyvinylidene chloride available from S. C. Johnson (Racine,--

In the Claims

Column 74, Claim 11, Line 18:
The line reading "11. The structure claim 1, wherein each the layers of the" should read --11. The structure of claim 1, wherein each the layers of the--